United States Patent
Hirose et al.

(10) Patent No.: US 9,334,567 B2
(45) Date of Patent: *May 10, 2016

(54) METHOD FOR MANUFACTURING SEMICONDUCTOR DEVICE, METHOD FOR PROCESSING SUBSTRATE AND SUBSTRATE PROCESSING APPARATUS

(71) Applicant: HITACHI KOKUSAI ELECTRIC INC., Tokyo (JP)

(72) Inventors: Yoshiro Hirose, Toyama (JP); Kenji Kanayama, Toyama (JP); Norikazu Mizuno, Toyama (JP); Yushin Takasawa, Toyama (JP); Yosuke Ota, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/668,702

(22) Filed: Mar. 25, 2015

(65) Prior Publication Data

US 2015/0200092 A1 Jul. 16, 2015

Related U.S. Application Data

(63) Continuation of application No. 13/637,200, filed as application No. PCT/JP2011/054761 on Mar. 2, 2011, now Pat. No. 9,018,104.

(30) Foreign Application Priority Data

Apr. 9, 2010 (JP) .................................. 2010-090549

(51) Int. Cl.
*H01L 21/31* (2006.01)
*C23C 16/455* (2006.01)
(Continued)

(52) U.S. Cl.
CPC ........... *C23C 16/45527* (2013.01); *C23C 16/30* (2013.01); *C23C 16/345* (2013.01);
(Continued)

(58) Field of Classification Search
CPC .............. H01L 21/02126; H01L 21/02167; H01L 21/0217; H01L 21/02211; H01L 21/02274; H01L 21/0228; H01L 21/02337; C23C 16/30; C23C 16/345; C23C 16/36; C23C 16/45527; C23C 16/45542; C23C 16/45544; C23C 16/52
USPC .................................. 438/762, 786, 791, 792
See application file for complete search history.

(56) References Cited

U.S. PATENT DOCUMENTS 6,486,083 B1 * 11/2002 Mizuno ................. C23C 16/345
257/E21.269
8,159,290 B2 4/2012 Yamamoto et al.
(Continued)

FOREIGN PATENT DOCUMENTS

JP 2001-230248 A 8/2001
JP 2006-013503 A 1/2006
(Continued)

OTHER PUBLICATIONS

May 31, 2011 International Search Report issued in International Patent Application No. PCT/JP2011/054761.
(Continued)

*Primary Examiner* — Michael Trinh
(74) *Attorney, Agent, or Firm* — Oliff PLC

(57) ABSTRACT

There is provided a method for manufacturing a semiconductor device, including forming a film on a substrate by performing a cycle one or more times. The cycle includes forming a first layer containing silicon, nitrogen, and carbon by supplying a first silane-based source having a halogen-based ligand to the substrate and supplying a second silane-based source having amino groups to the substrate. The cycle also includes forming a second layer by modifying the first layer by performing supplying a reactive gas different from each of the sources, to the substrate.

14 Claims, 17 Drawing Sheets

(51) Int. Cl.
  *C23C 16/30* (2006.01)
  *C23C 16/34* (2006.01)
  *C23C 16/36* (2006.01)
  *C23C 16/52* (2006.01)
  *H01L 21/02* (2006.01)
  *C23C 16/50* (2006.01)

(52) U.S. Cl.
  CPC .......... *C23C 16/36* (2013.01); *C23C 16/45542* (2013.01); *C23C 16/45544* (2013.01); *C23C 16/50* (2013.01); *C23C 16/52* (2013.01); *H01L 21/0217* (2013.01); *H01L 21/0228* (2013.01); *H01L 21/02123* (2013.01); *H01L 21/02126* (2013.01); *H01L 21/02164* (2013.01); *H01L 21/02167* (2013.01); *H01L 21/02211* (2013.01); *H01L 21/02274* (2013.01); *H01L 21/02337* (2013.01)

(56) References Cited

U.S. PATENT DOCUMENTS

| | | | |
|---|---|---|---|
| 8,173,554 B2 * | 5/2012 | Lee | C23C 16/345 257/E21.293 |
| 2005/0287747 A1 | 12/2005 | Chakravarti et al. | |
| 2008/0026251 A1 | 1/2008 | Suzuki et al. | |
| 2008/0081470 A1 * | 4/2008 | Clark | C23C 16/345 438/680 |
| 2008/0213479 A1 * | 9/2008 | Chou | C23C 16/36 427/255.393 |
| 2008/0242116 A1 | 10/2008 | Clark | |
| 2011/0151142 A1 | 6/2011 | Seamons et al. | |

FOREIGN PATENT DOCUMENTS

| | | |
|---|---|---|
| JP | 2007-035740 A | 2/2007 |
| JP | 2008-053683 A | 3/2008 |
| JP | 2008-227460 A | 9/2008 |
| KR | 10-2009-0126318 A | 12/2009 |
| WO | 20081121463 A1 | 10/2008 |

OTHER PUBLICATIONS

Jul. 4, 2013 Office Action issued in Korean Patent Application No. 10-2012-7015471.

* cited by examiner

METHOD FOR MANUFACTURING SEMICONDUCTOR DEVICE, METHOD FOR PROCESSING SUBSTRATE AND SUBSTRATE PROCESSING APPARATUS

This is a Continuation of application Ser. No. 13/637,200 filed on Oct. 26, 2012, now U.S. Pat. No. 9,018,104, which is a U.S. national stage of PCT/JP2011/054761 filed on Mar. 2, 2011, and which claims the benefit of Japanese Patent Application No. 2010-090549 filed on Apr. 9, 2010. The contents of the disclosures of the prior applications are hereby incorporated by reference herein in their entirety.

BACKGROUND

1. Technical Field

The present invention relates to a method for manufacturing a semiconductor device including forming a thin film on a substrate, a method for processing a substrate and a substrate processing apparatus.

2. Description of Related Art

The step of manufacturing a semiconductor device includes the step of forming a silicon insulating film such as a silicon oxide film ($SiO_2$) and a silicon nitride film ($Si_3N_4$) on a wafer such as a silicon wafer. The silicon oxide film has excellent insulation property and low dielectric property, and is widely used as an insulating film and an inter-layer film. Further, the silicon nitride film has excellent insulation property, corrosion-resistant property, and film stress controllability, etc., and is widely used as the insulating film and a mask film, a charge storage film, and a stress control film. A formation method includes a chemical vapor deposition (CVD) method and an atomic layer deposition (ALD) method, etc. When a silicon insulating film is formed by the CVD method and the ALD method, either a chlorosilane-based source or an aminosilane-based source is generally used for example, as a silicon source (for example see patent document 1).

PRIOR ART DOCUMENT

Patent Documents

Patent document 1:
Japanese Patent Laid Open Publication No. 2001-230248

SUMMARY OF THE INVENTION

Problem to be Solved by the Invention

However, when the insulating film is formed particularly in a low temperature region, using either the chlorosilane-based source or the aminosilane-based source, reduction of a film quality is observed, like a case that the insulating film with low silicon density is formed. Further, when $SiH_4$ and $Si_2H_6$ are used for depositing silicon in a process of forming the insulating film, thin film control is carried out by adjusting a wafer temperature and an inner pressure of a processing chamber. However, layered deposition is difficult in this case, and therefore a deposition method by surface reaction is expected. Note that according to an experiment by inventors of the present invention, it is difficult to deposit silicon at a film formation rate satisfying a production efficiency, when the chlorosilane-based source alone is used and when temperature is set to 550° C. or less. Further, when the aminosilane-based source alone is used, deposition of silicon is not confirmed at 550° C. or less.

Accordingly, an object of the present invention is to provide a method for manufacturing a semiconductor device, a method for processing a substrate and a substrate processing apparatus, capable of forming a high quality insulating film in a low temperature region, when the insulating film is formed using a chlorosilane-based source and an aminosilane-based source.

Means for Solving the Problem

According to an aspect of the present invention, there is provided a method for manufacturing a semiconductor device including:
 forming an insulating film having a prescribed composition and a prescribed film thickness on a substrate by alternately performing following steps prescribed number of times:
 supplying one of the sources of a chlorosilane-based source and an aminosilane-based source to a substrate in a processing chamber, and thereafter supplying the other source, to form a first layer containing silicon, nitrogen, and carbon on the substrate; and
 supplying a reactive gas different from each of the sources, to the substrate in the processing chamber, to modify the first layer and form a second layer.

According to further other aspect of the present invention, there is provided a method for processing a substrate, including:
 forming an insulating film having a prescribed composition and a prescribed film thickness on a substrate by alternately performing the following steps prescribed number of times:
 supplying a chlorosilane-based source and an aminosilane-based source to a substrate in a processing chamber, to form a first layer containing silicon, nitrogen, and carbon on the substrate; and
 supplying a reactive gas different from each of the sources, to the substrate in the processing chamber, to modify the first layer and form a second layer.

According to further other aspect of the present invention, there is provided a method for processing a substrate, including:
 forming an insulating film having a prescribed composition and a prescribed film thickness on a substrate by alternately performing the following steps prescribed number of times:
 supplying one of the sources of a chlorosilane-based source and an aminosilane-based source to a substrate in a processing chamber, and thereafter supplying the other source, to form a first layer containing silicon, nitrogen, and carbon on the substrate; and
 supplying a reactive gas different from each of the sources, to the substrate in the processing chamber, to modify the first layer and form a second layer.

According to further other aspect of the present invention, there is provided a substrate processing apparatus, including:
 a processing chamber in which a substrate is housed;
 a first source supply system configured to supply a chlorosilane-based source to a substrate in the processing chamber;
 a second source supply system configured to supply an aminosilane-based source to the substrate in the processing chamber;
 a reactive gas supply system configured to supply reactive gas different from each of the sources, to the substrate in the processing chamber; and a controller configured to control the first source supply system, the second source supply system, and the reactive gas supply system, so that an insulating film having a prescribed composition and a prescribed film thickness is formed on the substrate by alternately performing the following processes prescribed number of times:

the process of supplying one of the sources of the chlorosilane-based source and the aminosilane-based source to the substrate in the processing chamber and thereafter supplying the other source, to form a first layer containing silicon, nitrogen, and carbon on the substrate, and a process of supplying the reactive gas to the substrate in the processing chamber, to modify the first layer and form a second layer.

Advantage of the Invention

According to the present invention, there is provided a method for manufacturing a semiconductor device, a method for processing a substrate and a substrate processing apparatus, capable of forming an excellent insulating film in a low temperature region when the insulating film is formed by using a chlorosilane-based source and an aminosilane-based source.

DESCRIPTION OF DETAILED EMBODIMENT OF THE INVENTION

Preferred embodiments of the present invention will be described hereafter based on the drawings.

Figure 1:
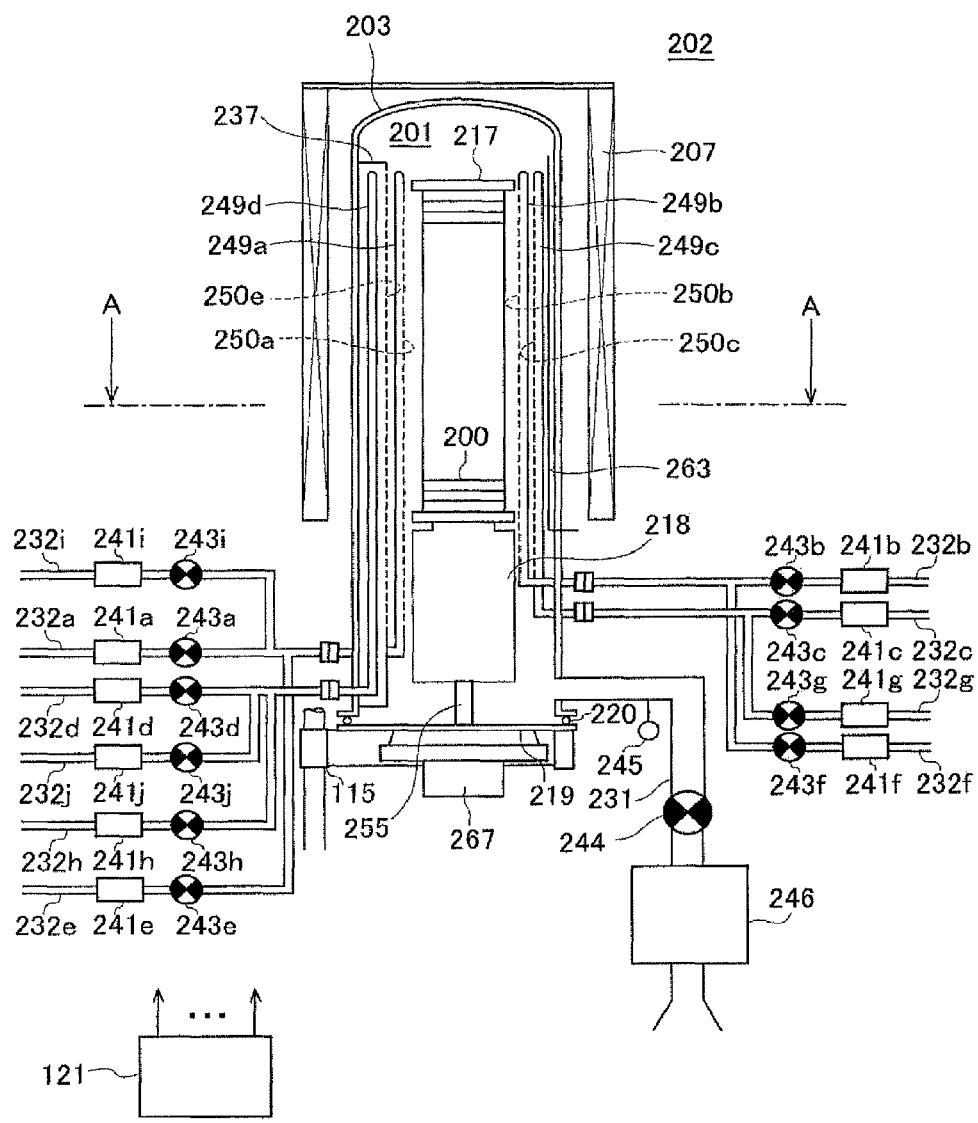
FIG. 1 is a schematic block diagram of a vertical processing furnace of a substrate processing apparatus suitably used in this embodiment, showing a vertical sectional view of a processing furnace portion.
Figure 2:
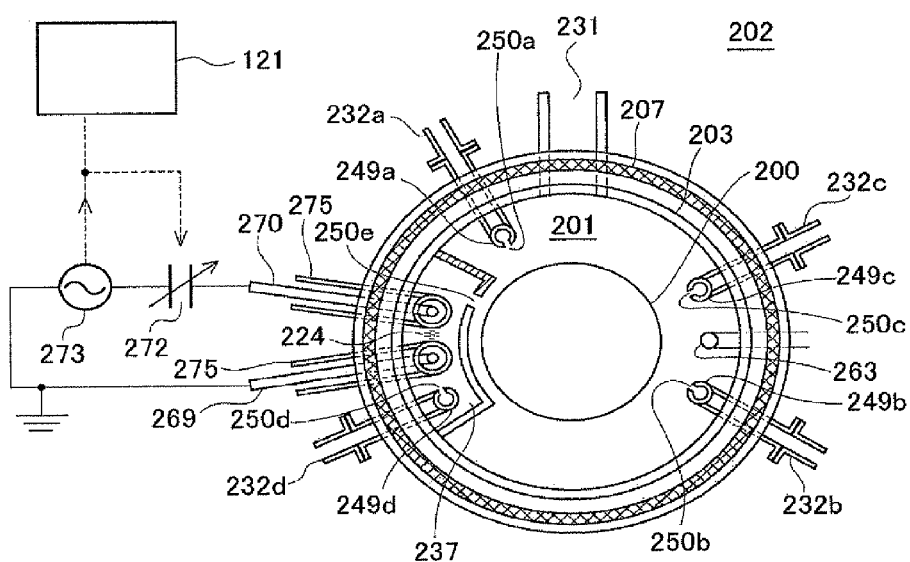
FIG. 2 is a schematic block diagram of the vertical processing furnace of the substrate processing apparatus suitably used in this embodiment, showing a sectional view of the processing furnace portion taken along the line A-A of FIG. 1.

FIG. 1 is a schematic block diagram of a vertical processing furnace of a substrate processing apparatus suitably used in this embodiment, showing a processing furnace 202 portion by a vertical sectional view, and FIG. 2 is a schematic block diagram of the vertical processing furnace suitably used in this embodiment, showing the processing furnace 202 portion by a sectional view taken along the line A-A of FIG. 1.

As shown in FIG. 1, the processing furnace 202 has a heater 207 being a heating unit (heating mechanism). The heater 207 has a cylindrical shape, and is installed on a heater base (not shown) being a holding plate by being supported thereby. Note that the heater 207 also functions as an activation mechanism for thermally activating gas as will be describe later.

A reaction tube 203 is disposed inside of the heater 207, so as to constitute a reaction vessel (processing vessel) concentrically with the heater 207. The reaction tube 203 is made of a heat-resistant material such as quartz ($SiO_2$) or silicon carbide (SiC), and is formed into a cylindrical shape with an upper end closed and a lower end opened. A processing chamber 201 is formed in a cylindrical hollow part of the reaction tube 203, so that wafers 200 being substrates can be housed in a state of being arranged in multiple stages in a horizontal posture vertically by a boat 217 as will be described later.

A first nozzle 249a, a second nozzle 249b, a third nozzle 249c, and a fourth nozzle 249d are provided in the processing chamber 201 so as to pass through a lower part of the reaction tube 203. A first gas supply tube 232a, a second gas supply tube 232b, a third gas supply tube 232c, and a fourth gas supply tube 232d are respectively connected to the first nozzle 249a, the second nozzle 249b, the third nozzle 249c, and the fourth nozzle 249d. Further, a fifth gas supply tube 232i is connected to the first gas supply tube 232a, and a sixth gas supply tube 232j is connected to a fourth gas supply tube 232d. Thus, the reaction tube 203 is provided with four nozzles 249a, 249b, 249c, 249d, and six gas supply tubes 232a, 232b, 232c, 232d, 232i, 232j, so that a plurality of kinds of gases, six kinds here, can be supplied into the processing chamber 201.

The first gas supply tube 232a is provided with a mass flow controller (MFC) 241a being a flow rate control unit (flow rate controller) and a valve 243a being an open/close valve, sequentially from an upstream direction. Further, a fifth gas supply tube 232i is connected to a downstream side of the valve 243a of the first gas supply tube 232a. The fifth gas supply tube 232i is provided with a mass flow controller 241i being a flow rate control unit (flow rate controller), and a valve 243i being an open/close valve, sequentially from an upstream direction. Further, a first inert gas supply tube 232e is connected to the downstream side of a connection part connected to the fifth gas supply tube 232*i* in the first gas supply tube 232*a*. The first inert gas supply tube 232*e* is provided with a mass flow controller 241*e* being a flow rate control unit (flow rate controller), and a valve 243*e* being an open/close valve sequentially from the upstream direction. Further, the aforementioned first nozzle 249*a* is connected to a tip end part of the first gas supply tube 232*a*. The first nozzle 249*a* is provided in an arc-shaped space between an inner wall of the reaction tube 203 and the wafers 200 so as to rise toward an upper part of a lamination direction of the wafers 200 extending from a lower part to the upper part of the inner wall of the reaction tube 203. The first nozzle 249*a* is formed as an L-shaped long nozzle. Gas supply holes 250*a* for supplying gas are provided on a side face of the first nozzle 249*a*. The gas supply holes 250*a* are opened to face a center of the reaction tube 203. A plurality of gas supply holes 250*a* are provided extending from the lower part to the upper part of the reaction tube 203, each of them having the same opening area and provided at the same opening pitch. The first gas supply system is mainly constituted of the first gas supply tube 232*a*, the mass flow controller 241*a*, the valve 243*a*, and the first nozzle 249*a*. Further, the fifth gas supply system is mainly constituted of the fifth gas supply tube 232*i*, the mass flow controller 241*i*, the valve 243*i*, and the first nozzle 249*a*. Further, the first inert gas supply system is mainly constituted of the first inert gas supply tube 232*e*, the mass flow controller 241*e*, and the valve 243*e*.

The second gas supply tube 232*b* is provide with the mass flow controller (MFC) 241*b* being the flow rate control unit (flow rate controller), and a valve 243*b* being the open/close valve, sequentially from the upstream direction. Further, a second inert gas supply tube 232*f* is connected to the downstream side of the valve 243*b* of the second gas supply tube 232*b*. The second inert gas supply tube 232*f* is provided with a mass flow controller 241*f* being the flow rate control unit (flow rate controller), and a valve 243*f* being the open/close valve, sequentially from the upstream direction. Further, the aforementioned second nozzle 249*b* is connected to the tip end part of the second gas supply tube 232*b*. The second nozzle 249*b* is provided in the arc-shaped space between the inner wall of the reaction tube 203 and the wafers 200 so as to rise toward the upper part of the lamination direction of the wafers 200, extending from the lower part to the upper part of the inner wall of the reaction tube 203. The second nozzle 249*b* is formed as an L-shaped long nozzle. Gas supply holes 250*b* for supplying gas are provided on the side face of the second nozzle 249*b*. The gas supply holes 250*b* are opened to face the center of the reaction tube 203. A plurality of gas supply holes 250*b* are provided extending from the lower part to the upper part of the reaction tube 203, each of them having the same opening area, and provided at the same opening pitch. The second gas supply system is mainly constituted of the second gas supply tube 232*b*, the mass flow controller 241*b*, the valve 243*b*, and the second nozzle 249*b*. Further, the second inert gas supply system is mainly constituted of the second inert gas supply tube 232*f*, the mass flow controller 241*f*, and the valve 243*f*.

The third gas supply tube 232*c* is provided with a mass flow controller (MFC) 241C being the flow rate control unit (flow rate controller), and a valve 243*c* being the open/close valve, sequentially from the upstream direction. Further, a third inert gas supply tube 232*g* is connected to the downstream side of the valve 243*c* of the third gas supply tube 232*c*. The third inert gas supply tube 232*g* is provided with a mass flow controller 241*g* being the flow rate control unit (flow rate controller), and a valve 243*g* being the open/close valve, sequentially from the upstream direction. Further, the third nozzle 249*c* is connected to the tip end part of the third gas supply tube 232*c*. The third nozzle 249*c* is provided in an arc-shaped space between the inner wall of the reaction tube 203 and the wafers 200 so as to rise toward the upper part from the lower part of the inner wall of the reaction tube 203. The first nozzle 249*a* is formed as the L-shaped long nozzle. Gas supply holes 250*c* for supplying gas are provided on the side face of the third nozzle 249*a*. The gas supply holes 250*a* are opened to face the center of the reaction tube 203. A plurality of gas supply holes 250*c* are provided extending from the lower part to the upper part of the reaction tube 203, each of them having the same opening area and provided at the same opening pitch. The third gas supply system is mainly constituted of the first gas supply tube 232*c*, the mass flow controller 241*c*, the valve 243*c*, and the third nozzle 249*c*. Further, the third inert gas supply system is mainly constituted of the third inert gas supply tube 232*g*, the mass flow controller 241*g*, and the valve 243*g*.

The fourth gas supply tube 232*d* is provide with the mass flow controller (MFC) 241*d* being the flow rate control unit (flow rate controller), and a valve 243*d* being the open/close valve, sequentially from the upstream direction. Further, a sixth gas supply tube 232*j* is connected to the downstream side of the valve 243*d* of the fourth gas supply tube 232*d*. The sixth gas supply tube 232*j* is provided with a mass flow controller 241*j* being the flow rate control unit (flow rate controller), and a valve 243*j* being the open/close valve sequentially from the upstream direction. Further, a fourth inert gas supply tube 232*h* is connected to the downstream side of the connection part to the sixth gas supply tube 232*j* in the fourth gas supply tube 232*d*. The fourth inert gas supply tube 232*h* is provided with a mass flow controller 241*h* being the flow rate control unit (flow rate controller), and a valve 243*h* being the open/close valve sequentially from the upstream direction. Further, the fourth nozzle 249*d* is connected to the tip end part of the fourth gas supply tube 232*d*. The fourth nozzle 249*d* is provided in a buffer chamber 237 being a gas dispersion space.

The buffer chamber 237 is provided along a lamination direction of the wafers 200 extending from the lower part to the upper part of the inner wall of the reaction tube 203 in the arc-shaped space between the inner wall of the reaction tube 203 and the wafers 200. Gas supply holes 250*e* for supplying gas, are formed on the end portion of the wall adjacent to the wafer 200 of the buffer chamber 237. The gas supply holes 250*e* are opened to face the center of the reaction tube 203. A plurality of gas supply holes 240*e* are provided extending from the lower part to the upper part of the reaction tube 203, each of them having the same opening area and provided at the same opening pitch.

The first nozzle 249*d* is provided on the end portion of an opposite side to the end portion where the gas supply holes 250*e* of the buffer chamber 237 are provided, along the lower part to the upper part of the inner wall of the reaction tube 203, so as to rise toward the upper part in the lamination direction of the wafers 200. The fourth nozzle 249*d* is formed as the L-shaped long nozzle. Gas supply holes 250*d* for supplying gas are provided on the side face of the fourth nozzles 249*d*. The gas supply holes 250*d* are opened to face the center of the buffer chamber 237. Similarly to the gas supply holes 250*e* of the buffer chamber 237, a plurality of gas supply holes 250*d* are provided extending from the lower part to the upper part of the reaction tube 203. Each opening area of the plurality of gas supply holes 250*d* may be set to the same opening area and the same opening pitch from the upstream side (lower part) to the downstream side (upper part), when a differential pressure between the buffer chamber 237 and the processing chamber 201 is small. However, when the differential pressure is large, the opening area may be set to be large and the opening pitch may set to be small from the upstream side to the downstream side.

In this embodiment, each opening area and opening pitch of each gas supply hole 250d of the fourth nozzle 249d is adjusted as described above from the downstream side to the upstream side, to thereby eject approximately the same flow rate of gas from each gas supply hole 250d, although there is a difference in flow velocity. Then, the gas ejected from each gas supply hole 250d is introduced to the inside of the buffer chamber 237 once, so that a difference in the flow velocity of the gas is equalized in the buffer chamber 237.

Namely, the gas ejected into the buffer chamber 237 from each of the gas supply holes 250d of the fourth nozzle 249d, is ejected into the processing chamber 201 from the gas supply holes 250e of the buffer chamber 237, after a particle velocity of each gas is relaxed in the buffer chamber 237. Thus, the gas ejected into the buffer chamber 237 from each of the gas supply holes 250d of the fourth nozzle 249d, becomes the gas having uniform flow rate and flow velocity, when it is jet into the processing chamber 201 from each of the gas supply holes 250e of the buffer chamber 237.

A fourth gas supply system is mainly constituted of a mass flow controller 241d, a valve 243d, a fourth nozzle 249d, and a buffer chamber 237. Further, a sixth gas supply system is mainly constituted of a sixth gas supply tube 232j, a mass flow controller 241j, a valve 243j, a fourth nozzle 249d, and a buffer chamber 237. Further, a fourth inert gas supply system is mainly constituted of a fourth inert gas supply tube 232h, a mass flow controller 241h, and a valve 243h.

For example, chlorosilane-based source gas being a first silicon source gas (first silicon-containing gas) is supplied into the processing chamber 201 from the first gas supply tube 232a, through the mass flow controller 241a, the valve 243a, and the first nozzle 249a. Here, the chlorosilane-based source means a silane source having chloro-groups, which is a source containing at least silicon (Si) and chlorine (Cl). Hexachlorodisilane ($Si_2Cl_6$, abbreviated as HCD) can be used for example as the chlorosilane-based source gas. Note that when a liquid source is used, which is in a liquid state at a normal temperature under a normal pressure like HCD, the liquid source is vaporized by a vaporization system such as a vaporizer and a bubbler, which is then supplied as the source gas.

The aminosilane-based source gas is supplied into the processing chamber 201 for example, through the mass flow controller 241b, the valve 243b, and the second nozzle 249b. Here, the aminosilane-based source is a silane source having amine groups (amino groups), which is a source containing at least silicon (Si), nitrogen (N), and carbon (C). Tris(dimethylamino)silane ($Si[N(CH_3)]_3H$, abbreviated as 3DMAS) gas can be used as the aminosilane-based source gas. Note that when the liquid source in the liquid state at a normal temperature under a normal pressure like 3DMAS is used, the liquid source is vaporized by the vaporization system such as a vaporizer and bubbler, which is then supplied as the source gas.

Boron (B), namely gas containing boron (boron-containing gas) is supplied into the processing chamber 201 through the mass flow controller 241c, the valve 243c, and the third nozzle 249c. Boron trichloride ($BCl_3$) gas can be used for example, as the boron-containing gas.

Gas containing nitrogen (N) (nitrogen-containing gas) for example, is supplied into the processing chamber 201 through the mass flow controller 241d, the valve 243d, the fourth nozzle 249d, and the buffer chamber 237 from the fourth gas supply tube 232d. Ammonia ($NH_3$) gas for example, can be used as the nitrogen-containing gas.

For example, gas containing carbon (C) (carbon-containing gas) is supplied into the processing chamber 201 from the fifth gas supply tube 232i through the mass flow controller 241i, the valve 243i, the first gas supply tube 232a, and the first nozzle 249a. For example, propylene ($C_3H_6$) gas can be used as the carbon-containing gas.

For example, gas containing oxygen (O) (oxygen-containing gas) is supplied from the sixth gas supply tube 232j into the processing chamber 201 through the buffer chamber 237. For example, oxygen ($O_2$) gas can be used as the oxygen-containing gas.

For example, nitrogen ($N_2$) gas is supplied into the processing chamber 201 from inert gas supply tubes 232e, 232f, 232g, 232h, through mass flow controllers 241e, 241f, 241g, 241h, valves 243e, 243f, 243g, 243h, gas supply tubes 232a, 232b, 232c, 232d, gas nozzles 249a, 249b, 249c, 249d, and buffer chamber 237.

Note that when the aforementioned gases are flowed from each gas supply tube for example, a first silicon source gas supply system, namely a chlorosilane-based source gas supply system is formed by the first gas supply system. Further, a second silicon source gas supply system, namely an aminosilane-based source gas supply system is formed by the second gas supply system. Further, a boron-containing gas supply system is formed by the third gas supply system. In addition, a nitrogen-containing gas supply system is formed by the fourth gas supply system. Moreover, a carbon-containing gas supply system is formed by the fifth gas supply system. Further, an oxygen-containing gas supply system is formed by the sixth gas supply system.

When the chlorosilane-based source gas and the aminosilane-based source gas are collectively called a source gas, a source gas supply system is formed by the chlorosilane-based source gas supply system and the aminosilane-based source gas supply system. Note that the chlorosilane-based source gas supply system, the aminosilane-based source gas supply system, and the source gas supply system, are respectively simply called the chlorosilne source supply system, the aminosilane-based source supply system, and the source supply system. Further, when the boron-containing gas, the nitrogen-containing gas, the carbon-containing gas, and the oxygen-containing gas are collectively called a reactive gas, a reactive gas supply system is formed by the boron-containing gas supply system, the nitrogen-containing gas supply system, the carbon-containing gas supply system, and the oxygen-containing gas supply system.

As shown in FIG. 2, a first rod electrode 269 being a first electrode, and a second rod electrode 270 being a second electrode having a long and thin structure respectively, are disposed along the lamination direction of the wafers 200 extending from the lower part to the upper part. Each of the first rod electrode 269 and the second rod electrode 270 is provided in parallel to the fourth nozzle 249d. Each of the first rod electrode 269 and the second rod electrode 270 is protected by being covered with an electrode protective tube 275 being a protective tube for protecting each electrode, extending from the upper part to the lower part. Either the first rod electrode 269 or the second rod electrode 270 is connected to a high frequency power source 273 through a matching box 272, and the other one is connected to earth being a reference electric potential. As a result, plasma is generated in a plasma generation area between the first rod electrode 269 and the second rod electrode 270. A plasma source is formed as a plasma generation unit (plasma generator), mainly constituted of the first rod electrode 269, the second rod electrode 270, the electrode protective tube 275, the matching box 272, and the high frequency power source 273. Note that as will be described later, the plasma source functions as an activation mechanism for activating the gas by plasma.

The electrode protective tube 275 is configured to insert each of the first rod electrode 269 and the second rod electrode 270 into the buffer chamber 237 in a state of being isolated from atmosphere of the buffer chamber 237. Here, when inside of the electrode protective tube 275 is the same atmosphere as outer air (atmosphere), the first rod electrode 269 and the second rod electrode 270 inserted into the electrode protective tube 275 respectively, are oxidized by heat of the heater 207. Therefore, an inert gas purge mechanism is provided inside of the electrode protective tube 275, for filling the inside with the inert gas or purging the inside with the inert gas, and suppressing an oxygen concentration sufficiently low, to thereby prevent oxidation of the first rod electrode 269 or the second rod electrode 270.

An exhaust tube 231 for exhausting the atmosphere in the processing chamber 201, is provided in the reaction tube 203. A vacuum pump 246 being a vacuum exhaust device is connected to the exhaust tube 231 through a pressure sensor 245 being a pressure detection unit (pressure detector) for detecting a pressure in the processing chamber 201 and an APC (Auto Pressure Controller) valve 244 being a pressure adjustment unit (pressure adjuster), so as to vacuum-exhaust the inside of the processing chamber 201 to a prescribed pressure (vacuum degree). Note that the APC valve 244 is an open/close valve capable of performing vacuum-exhaust/stop of vacuum-exhaust of the inside of the processing chamber 201 by opening/closing a valve, and capable of adjusting the pressure by adjusting a degree of the valve. The exhaust system is mainly constituted of the exhaust tube 231, the APC valve 244, the vacuum pump 246, and the pressure sensor 245.

A seal cap 219 being a furnace throat lid member capable of air-tightly closing a lower end opening of the reaction tube 203, is provided in a lower part of the reaction tube 203. The seal cap 219 is abutted on a lower end of the reaction tube 203 from a vertically lower side. The seal cap 219 is made of metal such as stainless, and is formed into a disc shape. An O-ring 220 being a seal member abutted on the lower end of the reaction tube 203, is provided on an upper surface of the seal cap 219. A rotation mechanism 267 for rotating a boat is installed on an opposite side to the processing chamber 201 of the seal cap 219. A rotary shaft 255 of the rotation mechanism 267 is configured to pass through the seal cap 219 so as to be connected to a boat 217 as will be described later, to rotate the wafer 200 by rotating the boat 217. The seal cap 219 is configured to be vertically elevated by a boat elevator 115 being an elevation mechanism vertically installed outside of the reaction tube 203, so that the boat 217 can be loaded and unloaded into/from the processing chamber 201.

The boat 217 being a substrate supporting tool is made of a heat resistant material such as quartz or silicon carbide, and is configured to support a plurality of wafers 200 in a horizontal posture, arranged with centers thereof aligned with each other in multiple stages. Note that a heat resistant member 218 made of a heat resistant material such as quartz and silicon carbide is provided in a lower part of the boat 217, so that heat from the heater 207 is hardly transmitted to the seal cap 219 side. Note that the heat resistant member 218 may be constituted of a plurality of heat insulating plates made of the heat resistant material such as quartz and silicon carbide, and a heat insulation plate holder for supporting them in a horizontal posture in multiple stages.

A temperature sensor 263 being a temperature detection unit is installed in the reaction tube 203, so that a temperature inside of the processing chamber 201 has a desired temperature distribution by adjusting a power supply condition to the heater 207 based on temperature information detected by the temperature sensor 263. The temperature sensor 263 is formed into the L-shape similarly to the nozzles 249a, 249b, 249c, and 249d, and is provided along an inner wall of the reaction tube 203.

A controller 121 being a control part (control unit) is connected to mass flow controllers 241a, 241b, 241c, 241d, 241e, 241f, 241g, 241h, 241i, 241j, valves 243a, 243b, 243c, 243d, 243e, 243f, 243g, 243h, 243i, 243j, the pressure sensor 245, the APC valve 244, the vacuum pump 246, the heater 207, the temperature sensor 263, the rotation mechanism 267, the boat elevator 115, the high frequency power source 273, and the matching box 272, etc. The controller 121 performs flow rate adjustment operation of each kind of gas by mass flow controllers 241a, 241b, 241c, 241d, 241e, 241f, 241g, 241h, 241i, and 241j, open/close operation by valves 243a, 243b, 243c, 243d, 243e, 243f, 243g, 243h, 243i, and 243j, pressure adjustment operation by open/close of the APC valve 244 based on the pressure sensor 245, temperature adjustment operation by the heater 207 based on the temperature sensor 263, start and stop of the vacuum pump 246, rotation speed adjustment operation of the rotation mechanism 267, control of an elevation movement of the boat elevator 115, power supply control of the high frequency power source 273, and impedance control by the matching box 272.

Next, explanation will be given for a sequence example in which an insulating film is formed on a substrate, as one step of the manufacturing steps of a semiconductor device, using a processing furnace of the aforementioned substrate processing apparatus. Note that in the explanation given hereafter, the operation of each part constituting the substrate processing apparatus, is controlled by the controller 121.

In a conventional CVD (Chemical Vapor Deposition) method and ALD (Atomic Layer Deposition) method, for example, in a case of the CVD method, a plurality of kinds of gases containing a plurality of elements constituting a film to be formed, are simultaneously supplied, and in a case of the ALD method, a plurality of kinds of gases containing a plurality of elements constituting the film to be formed are alternately supplied. Then, the $SiO_2$ film and the $Si_3N_4$ film are formed by controlling supply conditions such as supply flow rate of the gas, supply time of the gas, and plasma power during supply of the gas. In these techniques, for example, when the $SiO_2$ film is formed, the supply condition is controlled so that a composition ratio of the film is $O/Si \approx 2$ which is a stoichiometric composition, and for example when the $Si_3N_4$ film is formed, the supply condition is controlled so that the composition ratio of the film is $N/Si \approx 1.33$ which is the stoichiometric composition.

Meanwhile, in the embodiment of the present invention, the supply condition is controlled so that the composition ratio of the film to be formed is the stoichiometric composition, or is a prescribed composition ratio different from the stoichiometric composition. For example, the supply condition is controlled so that at least one element of the plurality of elements constituting the film to be formed, is excessive to the stoichiometric composition more than other element. Explanation will be given hereafter for the sequence example in which the film formation is performed while controlling the ratio of the plurality of elements constituting the film to be formed, namely the composition ratio of the film.

(First Sequence)

First, a first sequence of this embodiment will be described.

Figure 3:
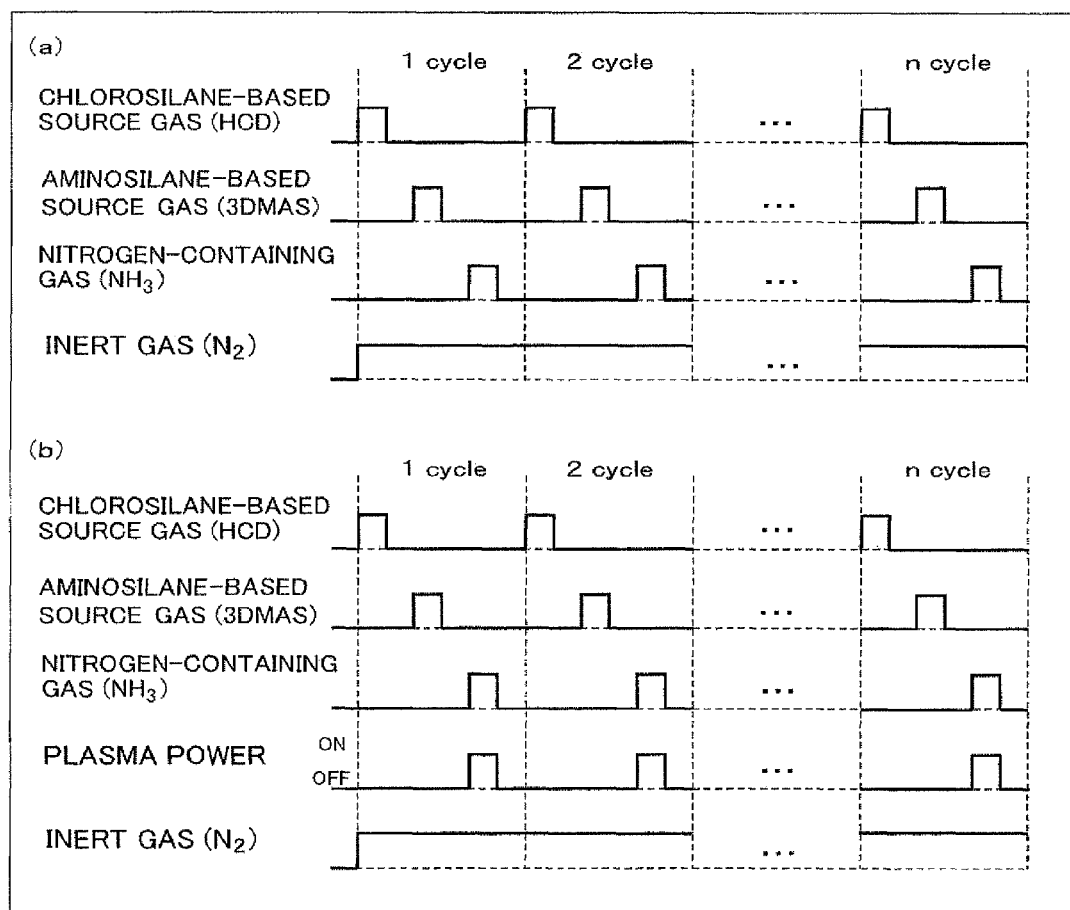
FIG. 3 is a view showing a timing of gas supply and plasma power source in a first sequence of this embodiment, wherein (a) shows an example of a sequence in which film formation is performed by non-plasma, and (b) shows an example of a sequence in which film formation is performed using plasma.

FIG. 3 is a view showing a timing of gas supply and plasma power supply in the first sequence of this embodiment, wherein FIG. 3(a) shows the sequence example in which film formation is performed by non-plasma (without using plasma), and FIG. 3 (b) shows the sequence example in which film formation is performed using plasma.

In the first sequence of this embodiment, a silicon carbonitride film or a silicon nitride film having a prescribed composition and a prescribed film thickness, is formed on the wafer 200 by alternately performing the following steps prescribed number of times:

supplying the chlorosilane-based source to the wafer 200 in the processing chamber 201 and thereafter supplying the aminosilane-based source thereto, to form a first layer containing silicon, nitrogen, and carbon on the wafer 200; and supplying thermally activated or plasma activated nitrogen-containing gas thereto as the reactive gas, to modify the first layer and form a silicon carbonitride layer or form a silicon nitride layer as the second layer.

The first sequence of this embodiment will be specifically described hereafter. Here, explanation will be given for an example of forming the silicon carbonitride film (SiCN film) or the silicon nitride film (SiN film) on the substrate as the insulation film based on the sequence of FIG. 3, using HCD gas as the chlorosilane-based source gas, and 3DMAS gas as the aminosilane-based source gas, and $NH_3$ gas as the nitrogen-containing gas.

When a plurality of wafers 200 are charged into the boat 217 (wafer charge), as shown in FIG. 1, the boat 217 supporting the plurality of wafers 200, is lifted by the boat elevator 115, and is loaded into the processing chamber 201 (boat load). In this state, the seal cap 219 is set in a state of sealing the lower end of the reaction tube 203 through the O-ring 220.

The inside of the processing chamber 201 is vacuum-exhausted by the vacuum pump 246 so that the inside of the processing chamber 201 is set in a desired pressure (vacuum degree). At this time, the pressure in the processing chamber 201 is measured by the pressure sensor 245, and based on the measured pressure information, the APC valve 244 is feedback-controlled (pressure adjustment). Further, the inside of the processing chamber 201 is heated by the heater 207 so as to be a desired temperature. At this time, the power supply condition to the heater 207 is feedback-controlled based on the temperature information detected by the temperature sensor 263 (temperature adjustment). Subsequently, the wafer 200 is rotated by rotating the boat 217 by the rotation mechanism 267 (wafer rotation). Thereafter, three steps as will be described later are sequentially executed.

[Step 1]

The valve 243a of the first gas supply tube 232a is opened, to flow the HCD gas through the first gas supply tube 232a. The flow rate of the HCD gas flowed through the first gas supply tube 232a is adjusted by the mass flow controller 241a. The HCD gas with the flow rate adjusted, is supplied into the processing chamber 201 from the gas supply holes 250a of the first nozzle 249a, and is exhausted from the exhaust tube 231. At this time, the HCD gas is supplied to the wafer 200. The valve 243e is simultaneously opened at this time, to flow the inert gas such as $N_2$ gas through the inert gas supply tube 232e. The flow rate of the $N_2$ gas flowed through the inert gas supply tube 232e is adjusted by the mass flow controller 241e. The $N_2$ gas with the flow rate adjusted, is supplied into the processing chamber 201 together with the HCD gas, and is exhausted from the exhaust tube 231.

At this time, the pressure in the processing chamber 201 is set in a range of 1 to 13300 Pa for example, and preferably in a rage of 20 to 1330 Pa, by properly adjusting the APC valve 244. The supply flow rate of the HCD gas controlled by the mass flow controller 241a is set in a range of 1 to 1000 sccm for example. The supply flow rate of the $N_2$ gas controlled by the mass flow controller 241e is set in a range of 200 to 10000 sccm for example. The supply flow rate of the $N_2$ gas controlled by the mass flow controller 241e is set in a range of 200 to 10000 sccm. The time required for exposing the HCD gas to the wafer 200, namely the gas supply time (irradiation time) is set in a range of 1 to 120 seconds for example, and preferably set in a range of 1 to 60 seconds. The temperature of the heater 207 at this time, is set so that the temperature of the wafer 200 is in a range of 250 to 700° C. and preferably in a range of 350 to 600° C. for example. Note that when the temperature of the wafer 200 is set to less than 250° C., HCD is hardly chemically adsorbed on the wafer 200, and a practical film formation speed cannot be obtained in some cases. This can be solved by setting the temperature of the wafer 200 to 250° C. or more. Note that HCD can be sufficiently adsorbed on the wafer 200 by setting the temperature of the wafer 200 to 350° C. or more, and further sufficient film formation speed can be obtained. Further, when the temperature of the wafer 200 exceeds 700° C., CVD reaction is strongly exhibited (vapor phase reaction is dominant), to thereby easily deteriorate the uniformity of the film thickness, thus making it difficult to control the film thickness. The deterioration of the uniformity in the film thickness can be suppressed by setting the temperature of the wafer in a range of 200 to 700° C. or less, thus making it easy to control the film thickness. Particularly, surface reaction is dominant by setting the temperature of the wafer 200 to 600° C. or less, thus making it easy to secure the uniformity in the film thickness, thus making it easy to control the film thickness. Therefore, the temperature of the wafer 200 is preferably set in a range of 250 to 700° C. and preferably in a range of 350 to 600° C. The silicon-containing layer of less than 1 atomic layer to several atomic layers, is formed on a ground film on the surface of the wafer 200 by supplying the HCD gas. The silicon-containing layer may be a chemical adsorption layer of HCD, or may be a silicon layer (Si layer), or may include both of them. Here, the silicon layer includes not only a continuous layer made of silicon, but also a discontinuous layer or a thin film formed by overlap of them. Note that the discontinuous layer made of silicon is sometimes called the thin film. Further, the chemical adsorption layer of HCD includes not only a continuous chemical adsorption layer of HCD molecules, but also a discontinuous chemical adsorption layer. Note that the layer of less than 1 atomic layer means the atomic layer formed discontinuously. When the thickness of the silicon-containing layer formed on the wafer 200 exceeds several atomic layers, nitriding action in step 3 as will be described later does not reach an entire body of the silicon-containing layer. Further, a minimum value of the silicon-containing layer that can be formed on the wafer 200 is less than 1 atomic layer. Therefore, the thickness of the silicon-containing layer is preferably set to less than 1 atomic layer to several atomic layers. Note that the silicon layer is formed by deposition of silicon on the wafer 200, and the chemical adsorption layer of HCD is formed by chemical adsorption of HCD on the wafer 200. The film formation rate can be increased by forming the silicon layer on the wafer 200, rather than forming the chemical adsorption layer of HCD on the wafer 200.

After the silicon-containing layer is formed, the valve 243a is closed, to stop the supply of the HCD gas. At this time, the inside of the processing chamber 201 is vacuum-exhausted by the vacuum pump 246, with the APC valve 244 of the exhaust tube 231 opened, to thereby remove the HCD gas from the processing chamber 201, which is the HCD gas unreacted or after contributing to the reaction remained in the processing chamber 201. Note that at this time, supply of the $N_2$ gas into the processing chamber 201 is maintained, with the valve 243e opened. Thus, an effect of purging the inside of the processing chamber 201, and removing the HCD gas from the processing chamber 201 is increased, which is the HCD gas unreacted or after contributing to the reaction remained in the processing chamber 201.

Not only the HCD gas, but also an inorganic source such as tetrachlorosilane ($SiCl_4$, abbreviated as STC) gas trichlorosilane ($SiHCl_2$, abbreviated as TCS) gas, dichlorosilane ($SiH_2Cl$, abbreviated as DCS) gas, monochlorosilane ($SiH_3Cl$, abbreviated as MCS) gas, etc., may be used as the chlorosilne source gas. Not only $N_2$ gas, but also rare gas such as Ar gas, He gas, Ne gas, and Xe gas, may be used as the inert gas.

[Step 2]

After residual gas in the processing chamber 201 in the end of step 1, the valve 243b of the second gas supply tube 232b is opened, to flow 3DMAS gas into the second gas supply tube 232b. The flow rate of the 3DMAS gas flowed into the second gas supply tube 232b is adjusted by the mass flow controller 241b. The 3DMAS gas with the flow rate adjusted, is supplied into the processing chamber 201 from the gas supply holes 250b of the second nozzle 249b, and is exhausted from the exhaust tube 231. At this time, the 3DMAS gas is supplied to the wafer 200. The valve 243f is opened simultaneously at this time, to flow the $N_2$ gas into the inert gas supply tube 232f. The $N_2$ gas is supplied into the processing chamber 201 together with the 3DMAS gas, and is exhausted from the exhaust tube 231.

At this time, the APC valve 244 is properly adjusted, and similarly to step 1, the pressure in the processing chamber 201 is set in a range of 1 to 13300 Pa for example, and preferably in a range of 20 to 1330 Pa. The supply flow rate of the 3DMAS gas controlled by the mass flow controller 241b is set in a range of 1 to 1000 sccm for example. The supply flow rate of the $N_2$ gas controlled by the mass flow controller 241f is set in a range of 200 to 10000 sccm for example. The time required for exposing the 3DMAS gas to the wafer 200, namely the gas supply time (irradiation time) is set in a range of 1 to 120 seconds, and preferably in a range of 1 to 60 seconds. Similarly to step 1, the temperature of the heater 207 at this time, is set so that the temperature of the wafer 200 is set in a range of 250 to 700° C., and preferably set in a range of 350 to 600° C.

The silicon-containing layer formed on the wafer 200 in step 1 and the 3DMAS gas, are reacted by supply of the 3DMAS gas. Thus, the silicon-containing layer is modified to the first layer containing silicon (Si), nitrogen (N), and carbon (C). The first layer becomes the layer containing Si, N, and C of less than 1 atomic layer to several atomic layers. Note that the first layer is the layer with relatively large ratio of Si component and C component, which is namely the Si-rich and C-rich layer.

Thereafter, the valve 243b of the second gas supply tube 232b is closed, to stop the supply of the 3DMAS gas. At this time, the inside of the processing chamber 201 is vacuum-exhausted by the vacuum pump 246, with the APC valve 244 of the exhaust tube 231 closed, so that the 3DMAS gas unreacted or after contributing to the reaction remained in the processing chamber 201 is removed from the processing chamber 201. Note that the supply of the $N_2$ gas into the processing chamber 201 is maintained, with the valve 243f opened. Thus, the effect of purging the inside of the processing chamber 201, and removing the 3DMAS gas from the processing chamber 201 is increased, which is the 3DMAS gas unreacted or after contributing to the reaction remained in the processing chamber 201.

Not only the 3DMAS gas, but also an organic source such as tetrakis(dimethylamino)silane ($Si[N(CH_3)_2]_4$, abbreviated as 4DMAS) gas, bis(diethylamino)silane ($Si[N(C_2H_5)]_2H_2$, abbreviated as 2DEAS) gas, bis(tertiary butyl aminosilane) ($SiH_2[NH(C_4H_9)]_2$, abbreviated as BTBAS) gas, may be used as the aminosilane-based source gas. Not only the $N_2$ gas, but also the rare gas such as Ar gas, He gas, Ne gas, and Xe gas may be used as the inert gas.

[Step 3]

After removing the residual gas in the processing chamber 201 in the end of step 2, the valve 243d of the fourth gas supply tube 232d is opened, to flow the $NH_3$ gas into the fourth gas supply tube 232d. The flow rate of the $NH_3$ gas flowed into the fourth gas supply tube 232d is adjusted by the mass flow controller 241d. The $NH_3$ gas with the flow rate adjusted, is supplied into the buffer chamber 237 from the gas supply holes 250d of the fourth nozzle 249d. At this time, the $NH_3$ gas supplied into the buffer chamber 237 is thermally activated by not applying high frequency power between the first rod electrode 269 and the second rod electrode 270, and is supplied into the processing chamber 201 from the gas supply holes 250e, and is exhausted from the exhaust tube 231 (see FIG. 3(a)). Further, at this time, the $NH_3$ gas supplied into the buffer chamber 237 is plasma-excited by applying the high frequency power between the first rod electrodes 269 and the second rod electrodes 270 via the matching box 272 from the high frequency power source 273, and is supplied into the processing chamber 201 from the gas supply holes 250e as active species, and is exhausted from the exhaust tube 231 (see FIG. 3(b)). At this time, the thermally or plasma activated $NH_3$ gas is supplied to the wafer 200. The valve 243h is opened simultaneously at this time, to flow the $N_2$ gas into the inert gas supply tube 232h. The $N_2$ gas is supplied into the processing chamber 201 together with the $NH_3$ gas, and is exhausted from the exhaust tube 231.

When the $NH_3$ gas is activated by heat and flowed under no plasma-excitation, the APC valve 244 is properly adjusted, to set the pressure in the processing chamber 201 in a range of 50 to 3000 Pa for example. By setting the pressure in the processing chamber 201 in a relatively high pressure band, the $NH_3$ gas can be thermally activated by non-plasma. Note that a soft reaction can be caused by thermally activating the $NH_3$ gas and supplying the thermally activated $NH_3$ gas, thus making it possible to softly perform nitriding as will be described later. Further, when the $NH_3$ gas is flowed under plasma-excitation as the active species, the APC valve 244 is properly adjusted, to set the pressure in the processing chamber 201 in a range of 10 to 100 Pa for example. The supply flow rate of the $NH_3$ gas controlled by the mass flow controller 241d is set in a range of 100 to 10000 sccm for example. The supply flow rate of the $N_2$ gas controlled by the mass flow controller 241h is set in a range of 200 to 10000 sccm for example. At this time, when the $NH_3$ gas is thermally activated and flowed, a partial pressure of the $NH_3$ gas in the processing chamber 201 is set in a range of 6 to 2940 Pa for example. Further, when the $NH_3$ gas is activated by plasma and flowed, the partial pressure of the $NH_3$ gas in the processing chamber 201 is set in a range of 6 to 100 Pa for example. The time required for exposing the wafer 200 to the thermally activated $NH_3$ gas, or to the active species obtained by plasma-exciting the $NH_3$ gas, namely the gas supply time (irradiation time), is set to 1 to 120 seconds, and preferably set to 1 to 60 seconds for example. Similarly to steps 1 to 2, the temperature of the heater 207 at this time is set so that the temperature of the wafer is set in a range of 250 to 700° C., and is preferably in a range of 350 to 600° C. When the $NH_3$ gas is plasma-excited, the high frequency power applied between the first rod electrode 269 and the second rod electrode 270 from the high frequency power source 273, is the power in a range of 50 to 1000 W for example.

The gas flowed through the processing chamber 201 at this time, is the $NH_3$ gas thermally activated by increasing the pressure in the processing chamber 201, or the active species obtained by plasma-exciting the $NH_3$ gas, and neither the HCD gas nor the 3DMAS gas is flowed through the processing chamber 201. Accordingly, the activated $NH_3$ gas or the $NH_3$ gas turned into the active species, is reacted with at least a part of the first layer containing Si, N, and C formed on the wafer 200 in step 2, without causing the vapor phase reaction. Thus, the first layer is nitrided, and is modified to the second layer including the silicon carbonitride layer (SiCN layer), or the silicon nitride layer (SiN layer).

As shown in FIG. 3(a), the first layer can be modified (changed) to the SiCN layer by thermally activating the $NH_3$ gas and flowing it into the processing chamber 201. At this time, the first layer is modified to the SiCN layer while increasing the ratio of the N-component in the first layer. Note that at this time, by a thermally nitriding action of the $NH_3$ gas, Si—N bond in the first layer is increased and meanwhile Si—C bond and Si—Si bond are reduced, thus reducing the ratio of C-component and the ratio of Si-component in the first layer. Namely, the first layer can be modified to the SiCN layer while varying the composition ratio in a direction of increasing the nitrogen concentration, and in a direction of reducing the carbon concentration and the silicon concentration. Further, the ratio of N-component in the SiCN layer, namely the nitrogen concentration can be finely adjusted by controlling processing conditions such as the pressure in the processing chamber 201 and the gas supply time.

Further, as shown in FIG. 3(b), the first layer can be modified (changed) to the SiCN layer by plasma-nitriding the first layer by flowing the active species obtained by plasma-exciting the $NH_3$ gas. At this time, the first layer can be modified to the SiN layer by making the C-component in the first layer desorbed by energy of the active species, while increasing the ratio of the N-component in the first layer. Note that at this time, by plasma-nitriding action of the $NH_3$ gas, Si—C bond and Si—Si bond are reduced while Si—N bond in the first layer is increased, and the ratio of the C-component and the ratio of the Si-component in the first layer are reduced. Particularly, the C-component is reduced to an impurity level or substantially disappears by desorption of its major part. Namely, the first layer can be modified to the SiN layer while varying a composition ratio in a direction of increasing the nitrogen concentration or in a direction of reducing the carbon concentration and the silicon concentration. Further, at this time, the ratio of the N-component in the SiN layer, namely the nitrogen concentration can be finely adjusted by controlling the processing conditions such as the pressure in the processing chamber 201 and the gas supply time. Thus, the composition ratio of the SiN layer can be further strictly controlled.

Note that at this time, the nitriding reaction of the first layer is preferably not to be saturated. For example, when the first layer of 1 atomic layer or less than 1 atomic layer is formed in steps 1, 2, a part of the first layer is preferably not to be nitrided. In this case, nitriding is performed under a condition that the nitriding reaction of the first layer is unsaturated so that an entire body of the first layer of 1 atomic layer or less than 1 atomic layer is not nitrided.

Note that in order to set the nitriding reaction of the first layer in an unsaturated state, the aforementioned processing condition is used as the processing condition in step 3, and the nitriding reaction of the first layer is easily set in the unsaturated state by using the following processing condition as the processing condition in step 3.

[When the $NH_3$ Gas is Thermally Activated and Flowed . . . ]

Wafer temperature: 500 to 600° C.
Pressure in the processing chamber: 133 to 2666 Pa
Partial pressure of the $NH_3$ gas: 67 to 2394 Pa
$NH_3$ gas supply flow rate: 1000 to 5000 sccm
$N_2$ gas supply flow rate: 300 to 1000 sccm $NH_3$ gas supply time: 6 to 60 seconds Thereafter, the valve 243d of the fourth gas supply tube 232d is closed, to stop the supply of the $NH_3$ gas. At this time, the inside of the processing chamber 201 is vacuum-exhausted by the vacuum pump 246, with the APC valve 244 of the exhaust tube 231 opened, so that the $NH_3$ gas unreacted or after contributing to the reaction remained in the processing chamber 201 is removed from the processing chamber 201. Note that at this time, the supply of the $N_2$ gas into the processing chamber 201 is maintained, with the valve 243h opened. Thus, the effect of purging the inside of the processing chamber 201, and removing the $NH_3$ gas from the processing chamber 201 is increased, which is the $NH_3$ gas unreacted or after contributing to the reaction remained in the processing chamber 201.

Gas obtained by burning and plasma-exciting diazin ($N_2H_2$) gas, hydrazine ($N_2H_4$) gas, and $N_3H_8$ gas, etc., may be used, or the gas obtained by diluting these gases with rare gas such as Ar gas, He gas, Ne gas, and Xe gas, which is then thermally or plasma excited, may be used other than the gas obtained by thermally exciting or plasma-exciting the $NH_3$ gas.

The aforementioned steps 1 to 3 are set as 1 cycle, and by performing this cycle one or more number of times (prescribe number of times), the silicon carbonitride film (SiCN film) or the silicon nitride film (SiN film) having a prescribed composition and a prescribed film thickness can be formed on the wafer 200. Note that the aforementioned cycle is preferably repeated multiple number of times.

When film formation processing of forming the SiCN film or the SiN film having a prescribed composition and a prescribed film thickness, is performed, the inert gas such as $N_2$ is supplied into the processing chamber 201, and is exhausted from the exhaust tube 231, to thereby purge the inside of the processing chamber 201 with the inert gas (gas purge). Thereafter, the atmosphere in the processing chamber 201 is substituted with the inert gas (inert gas substitution), and the pressure in the processing chamber 201 is returned to a normal pressure (returned to the atmosphere).

Thereafter, the seal cap 219 is descended by the boat elevator 115, and the lower end of the reaction tube 203 is opened, so that the processed wafer 200 is unloaded to the outside of the reaction tube 203 from the lower end of the reaction tube 203 in a state of being supported by the boat 217. Thereafter, the processed wafer 200 is discharged by the boat 217 (wafer discharge).

(Second Sequence)

A second sequence of this embodiment will be described next.

Figure 4:
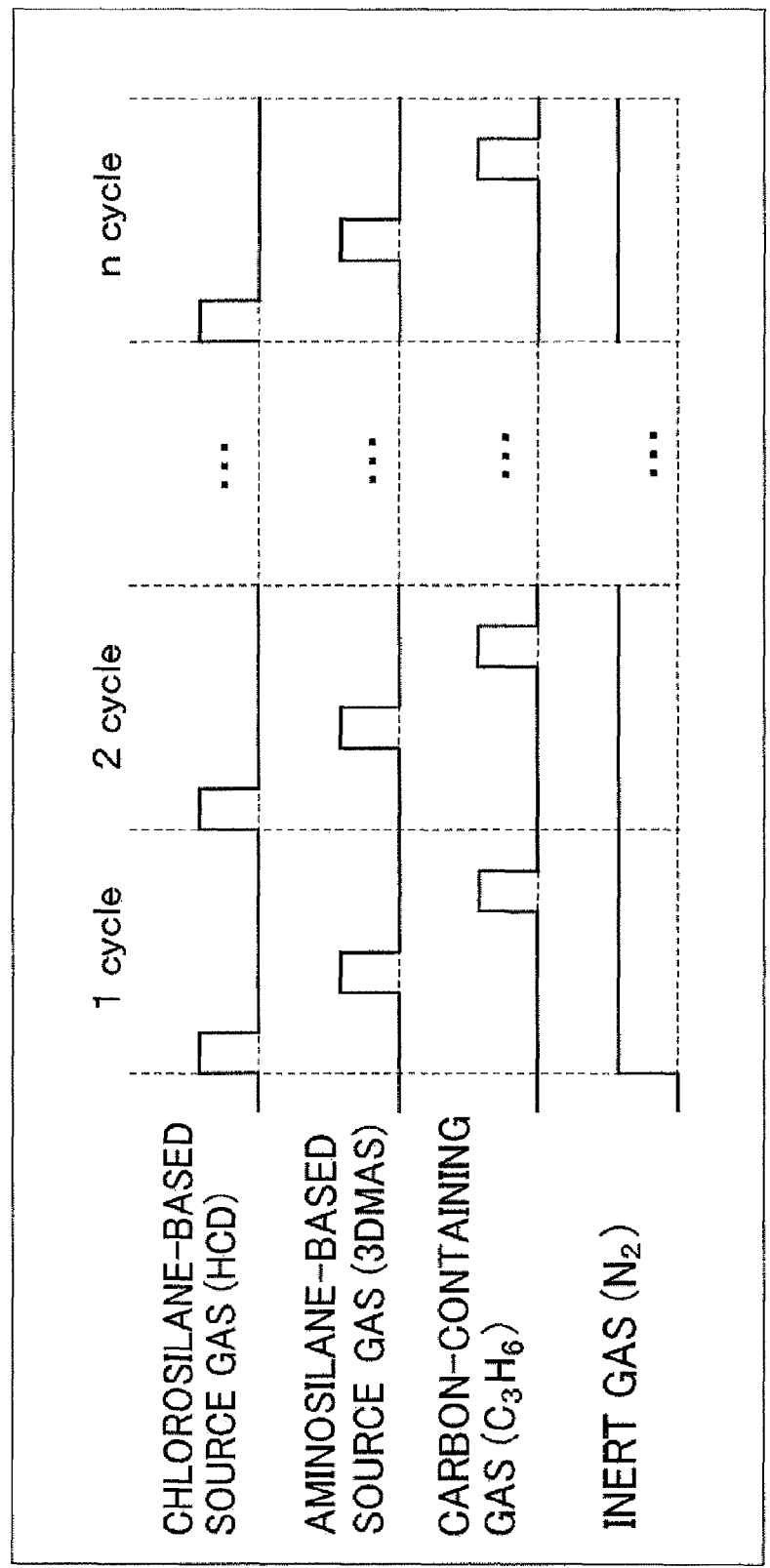
FIG. 4 is a view showing a timing of the gas supply in a second sequence of this embodiment.

FIG. 4 is a view showing a timing of the gas supply in the second sequence of this embodiment.

In the second sequence of this embodiment, the silicon carbonitride film having a prescribed composition and a prescribed film thickness is formed on the wafer 200 by performing the following steps alternately prescribed number of times:

supplying the chlorosilane-based source to the wafer 200 in the processing chamber 201, and thereafter supplying the aminosilane-based source thereto, to thereby form the first layer on the wafer 200 containing silicon, nitrogen, and carbon; and supplying thermally activated carbon-containing gas to the wafer 200 in the processing chamber 201 as the reactive gas, to modify the first layer, and form the silicon carbonitride layer as the second layer.

The second sequence of this embodiment will be specifically described hereafter. Here, explanation will be given for a case that the HCD gas is used as the chlorosilane-based source gas, and the 3DMAS gas is used as the aminosilane-based source gas, and $C_3H_6$ gas is used as the carbon-containing gas, to thereby form the silicon carbonitride film (SiCN film) on the substrate as the insulating film, based on the sequence of FIG. 4.

The wafer charge, boat loading, pressure adjustment, temperature adjustment, and wafer rotation are similarly performed as the first sequence.

Thereafter, three steps as will be described later are sequentially executed.

[Step 1]

Step 1 is performed similarly to the step 1 of the first sequence. Namely, the processing conditions, the reaction to be caused, and the layer to be formed, etc., in step 1 are the same as those of the step 1 of the first sequence. Namely, in this step, the silicon-containing layer is formed on the wafer 200 by supplying the HCD gas into the processing chamber 201.

[Step 2]

Step 2 is performed similarly to the step 2 of the first sequence. Namely, the processing conditions, the reaction to be caused, and the layer to be formed, etc., in step 2 are the same as those of the step 2 in the first sequence. Namely, in this step, the silicon-containing layer and the 3DMAS gas are reacted by supplying the 3DMAS gas into the processing chamber 201, to thereby form the first layer containing Si, N, and C.

[Step 3]

After removing the residual gas in the processing chamber 201 in the end of step 2, the valve 243$i$ of the fifth gas supply tube 232$i$ is opened, to flow the $C_3H_6$ gas into the fifth gas supply tube 232$i$. The flow rate of the $C_3H_6$ gas flowed into the fifth gas supply tube 232$i$ is adjusted by the mass flow controller 241$i$. The $C_3H_6$ gas with the flow rate adjusted, is supplied into the processing chamber 201 from the gas supply holes 250$a$ of the first nozzle 249$a$, and is exhausted from the exhaust tube 231. At this time, the thermally activated $C_3H_6$ gas is supplied to the wafer 200. The valve 243$e$ is simultaneously opened at this time, to flow the $N_2$ gas into the inert gas supply tube 232$e$. The $N_2$ gas is supplied into the processing chamber 201 together with the $C_3H_6$ gas, and is exhausted from the exhaust tube 231.

At this time, the APC valve 244 is properly adjusted, to set the pressure in the processing chamber 201 in a range of 50 to 3000 Pa for example. The supply flow rate of the $C_3H_6$ gas controlled by the mass flow controller 241$i$ is set in a range of 100 to 10000 sccm for example. The supply flow rate of the $N_2$ gas controlled by the mass flow controller 241$e$ is set in a range of 200 to 10000 sccm for example. The partial pressure of the $C_3H_6$ gas in the processing chamber 201 at this time, is set in a range of 6 to 2940 Pa. The time required for exposing the thermally activated $C_3H_6$ gas to the wafer 200, namely the gas supply time (irradiation time) is set in a range of 1 to 120 seconds, and preferably set in a range of 1 to 60 seconds. Similarly to the steps 1 to 2, the temperature of the heater 207 at this time is set so that the temperature of the wafer 200 is in a range of 250 to 700° C., and is preferably in a range of 350 to 600° C. Note that a soft reaction can be caused by thermally activating the $C_3H_6$ gas, so that a carbon-containing layer as will be described later can be easily formed.

The gas flowed into the processing chamber 201 is the thermally activated $C_3H_6$ gas, and neither the HCD gas nor the 3DMAS gas is flowed into the processing chamber 201. Accordingly, the $C_3H_6$ gas is supplied to the wafer 200 in an activated state without causing the vapor phase reaction, and at this time, the carbon-containing layer of less than 1 atomic layer, namely a discontinuous carbon-containing layer is formed on the first layer containing Si, N, and C formed on the wafer 200 in step 2. The carbon-containing layer may be a carbon layer (C-layer), and may be a chemical adsorption layer of $C_3H_6$, namely the chemical adsorption layer made of a substance ($C_xH_y$) which is a decomposition of $C_3H_6$. Note that a part of the first layer and the $C_3H_6$ gas are reacted depending on the condition, so that the first layer is carbonized. Thus, the first layer is modified, to form the second layer including the silicon carbonitride layer (SiCN layer).

Note that the $C_3H_6$ gas is thermally activated and flowed into the processing chamber 201, to thereby modify the first layer, and at this time, the first layer is modified to the SiCN layer while increasing the ratio of the C-component in the first layer. Namely, the first layer can be modified to the SiCN layer while varying the composition ratio in a direction of increasing the carbon concentration. Further, by controlling the processing condition such as the pressure in the processing chamber 201 and the gas supply time, the ratio of the C-component in the SiCN layer, namely the carbon concentration can be finely adjusted. Thus, the composition ratio of the SiCN layer can be more strictly controlled.

Thereafter, the valve 243$i$ of the fifth gas supply tube 232$i$ is closed, to stop the supply of the $C_3H_6$ gas. At this time, the inside of the processing chamber 201 is vacuum-exhausted by the vacuum pump 246, with the APC valve 244 of the exhaust tube 231 opened, and the $C_3H_6$ gas unreacted or after contributing to the reaction remained in the processing chamber 201, is removed from the processing chamber 201. Note that the supply of the $N_2$ gas into the processing chamber 201 is maintained, with the valve 243$e$ opened. Thus, the effect of purging the inside of the processing chamber 201, and removing the $C_3H_6$ gas from the processing chamber 201 is increased, which is the $C_3H_6$ gas unreacted or after contributing to the reaction remained in the processing chamber 201.

Ethylene ($C_2H_4$) gas and acetylene ($C_2H_2$) gas, etc., may be used as the carbon-containing gas, other than the $C_3H_6$ gas.

The aforementioned steps 1 to 3 are set as 1 cycle, and by performing this cycle one or more number of times (prescribe number of times), the silicon carbonitride film (SiCN film) having a prescribed composition and a prescribed film thickness can be formed on the wafer 200. Note that the aforementioned cycle is preferably repeated multiple number of times.

When the film formation processing of forming the SiCN film having a prescribed composition and a prescribed film thickness is performed, gas purge, inert gas substitution, return to the atmosphere, boat unloading, and wafer discharge, are performed similarly to the first sequence.

(Third Sequence)

A third sequence of this embodiment will be described next.

Figure 5:
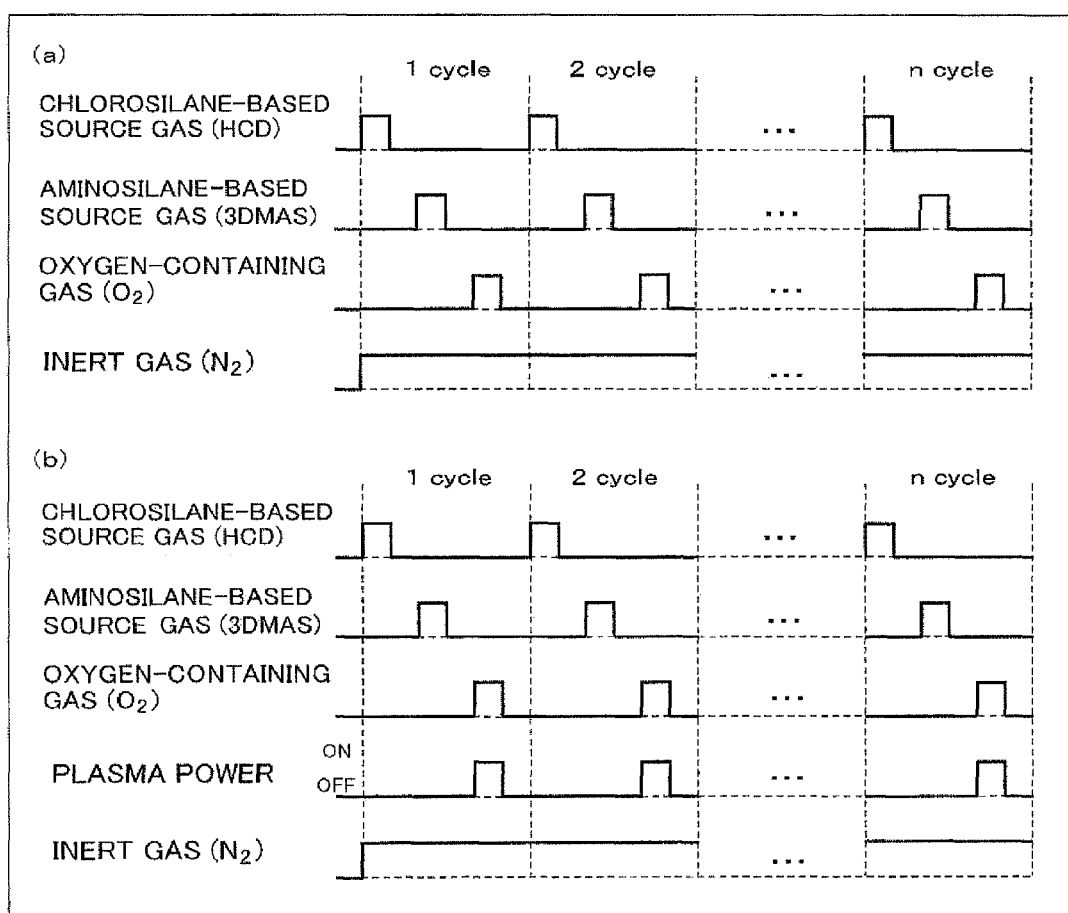
FIG. 5 is a view showing a timing of gas supply and plasma power source in a third sequence of this embodiment, wherein (a) shows an example of a sequence in which film formation is performed by non-plasma, and (b) shows an example of a sequence in which film formation is performed using plasma.

FIG. 5 is a view showing the timing of gas supply and plasma power supply in the third sequence of this embodiment, wherein FIG. 5(a) shows a sequence example of performing film formation without using plasma (by non-plasma), and FIG. 5(b) shows a sequence example of performing film formation using plasma.

In the third sequence of this embodiment, a silicon oxycarbonitride film, a silicon oxide film, or a silicon oxycarbide film having a prescribed composition and a prescribed film thickness is formed on the wafer 200 by performing the following steps alternately prescribed number of times:

supplying the chlorosilane-based source to the wafer 200 in the processing chamber 201, and thereafter supplying the aminosilane-based source thereto, to form the first layer on the wafer 200 containing silicon, nitrogen, and carbon; and supplying the thermally or plasma activated oxygen-containing gas to the wafer 200 in the processing chamber 201 as the reactive gas, to modify the first layer and form a silicon oxycarbonitride layer, a silicon oxide layer, or a silicon oxycarbide layer as the second layer.

The third sequence of this embodiment will be more specifically described hereafter. Here, explanation is given for a case that the HCD gas is used as the chlorosilane-based source gas, the 3DMAS gas is used as the aminosilane-based source gas, and $O_2$ gas is used as oxygen-containing gas, to thereby form the silicon oxycarbonitride film (SiOCN film), the silicon oxide film (SiO film), or the silicon oxycarbide film (SiOC film) on the substrate as the insulating film.

Processing is performed similarly to the first sequence, regarding the wafer charge, boat loading, pressure adjustment, temperature adjustment, and wafer rotation. Thereafter, three steps as will be described later are sequentially executed.

[Step 1]

Step 1 is performed similarly to the step 1 of the first sequence. Namely, the processing conditions, the reaction to be caused, and the layer to be formed, etc., in step 1 are the same as those of the step 1 of the first sequence. Namely, in this step, the silicon-containing layer is formed on the wafer 200 by supplying the HCD gas into the processing chamber 201.

[Step 2]

Step 2 is performed similarly to the step 2 of the first sequence. Namely, the processing conditions, the reaction to be caused, and the layer to be formed, etc., in step 2 are the same as those of the step 2 of the first sequence. Namely, in this step, the silicon-containing layer and the 3DMAS gas are reacted by supplying the 3DMAS gas into the processing chamber 201, to form the first layer containing Si, N, and C.

[Step 3]

After the residual gas in the processing chamber 201 is removed in the end of the step 2, the valve 243j of the sixth gas supply tube 232j is opened, to flow the $O_2$ gas into the sixth gas supply tube 232j. The flow rate of the $O_2$ gas flowed into the sixth gas supply tube 232j is adjusted by the mass flow controller 241j. The $O_2$ gas with the flow rate adjusted is supplied into the buffer chamber 237 from the gas supply holes 250d of the fourth nozzle 249d. At this time, the $O_2$ gas supplied into the buffer chamber 237 is thermally activated by not applying high frequency power between the first rod electrode 269 and the second rod electrode 270, and is supplied into the processing chamber 201 from the gas supply holes 250e, and is exhausted from the exhaust tube 231 (see FIG. 5(a)). Further, at this time, by applying the high frequency power between the first rod electrode 269 and the second rod electrode 270 from the high frequency power source 273 through the matching box 272, the $O_2$ gas supplied into the buffer chamber 237 is plasma-excited, and is supplied into the processing chamber 201 from the gas supply holes 250e as the active species, and is exhausted from the exhaust tube 231 (see FIG. 5(b)). At this time, the thermally or plasma activated $O_2$ gas is supplied to the wafer 200. The valve 243h is simultaneously opened at this time, to flow the $N_2$ gas into the inert gas supply tube 232h. The $N_2$ gas is supplied into the processing chamber 201 together with the $O_2$ gas, and is exhausted from the exhaust tube 231.

When the $O_2$ gas is thermally activated and flowed without being plasma-excited, the APC valve 244 is properly adjusted, to set the pressure in the processing chamber 201 in a range of 1 to 3000 Pa for example. By setting the pressure in the processing chamber 201 in such a relatively high pressure band, the $O_2$ gas can be thermally activated by non-plasma. Note that a soft reaction can be caused by thermally activating the $O_2$ gas and supplying the thermally activated $O_2$ gas, thus causing a soft oxidation to occur as will be described later. Further, when the $O_2$ gas is flowed under plasma-excitation as the active species, the APC valve 244 is properly adjusted, to set the pressure in the processing chamber 201 in a range of 1 to 100 Pa for example. The supply flow rate of the $O_2$ gas controlled by the mass flow controller 241d is set in a range of 100 to 5000 sccm for example. The supply flow rate of the $N_2$ gas controlled by the mass flow controller 241h is set in a range of 200 to 10000 sccm for example. At this time, a partial pressure of the $O_2$ gas in the processing chamber 201 is set in a range of 6 to 2940 Pa for example. Further, the time required for exposing the wafer 200 to the thermally activated $O_2$ gas or the active species obtained by plasma-exciting the $O_2$ gas, namely the gas supply time (irradiation time) is set in a range of 1 to 120 seconds, and preferably set in a range of 1 to 60 seconds for example. Similarly to the steps 1 to 2, the temperature of the heater 207 at this time is set so that the temperature of the wafer 200 is in a range of 250 to 700° C. for example and is preferably in a range of 350 to 600° C. When the $O_2$ gas is plasma-excited, the high frequency power applied between the first rod electrode 269 and the second rod electrode 270 from the high frequency power source 273 is set to be the power in a range of 50 to 1000 W for example.

The gas flowed into the processing chamber 201 at this time, is the $O_2$ gas thermally activated by increasing the pressure in the processing chamber 201, or the active species obtained by plasma-exciting the $O_2$ gas, and neither the HCD gas nor the 3DMAS gas is flowed into the processing chamber 201. Accordingly, the $O_2$ gas activated or turned into the active species, without causing the vapor phase reaction, is reacted with at least a part of the first layer containing Si, N, and C formed on the wafer 200 in step 2. Thus, the first layer is oxidized and is modified to the second layer including the silicon oxycarbonitride layer (SiOCN layer), the silicon oxide layer (SiO layer), or the silicon oxycabide layer (SiOC layer).

As shown in FIG. 5(a), the first layer can be modified (changed) to the SiOCN layer of the SiOC layer by thermally oxidizing the first layer by flowing the thermally activated $O_2$ gas through the processing chamber 201. At this time, the first layer is modified to the SiOCN layer or the SiOC layer while adding the O-component to the first layer. At this time, by thermally oxidizing action of the $O_2$ gas, Si—N bond, Si—C bond, and Si—Si bond are reduced, while Si—O bond is increased in the first layer, and the ratio of N-component, the ratio of C-component, and the ratio of Si-component in the first layer are reduced. At this time, by prolonging the thermally oxidation time or by increasing an oxidizing power of the thermal oxidation by the $O_2$ gas, a major part of the N-component is desorbed to reduce the N-component to an impurity level, to achieve a substantial disappearance of the N-component. Namely, the first layer can be modified to the SiOCN layer or the SiOC layer while varying the composition ratio in a direction of increasing the oxygen concentration and in a direction of reducing the nitrogen concentration, the carbon concentration, and the silicon concentration. Further, at this time, the processing conditions such as the pressure in the processing chamber 201 and the gas supply time are controlled, so that the ratio of the O-component in the SiOCN layer, namely the oxygen concentration can be finely adjusted. Thus, the composition ratio of the SiOCN layer can be more strictly controlled.

Further, as shown in FIG. 5(b), the active species obtained by plasma-exciting the $O_2$ gas is flowed into the processing chamber 201, to plasma-oxidize the first layer and modify (change) the first layer to the SiO layer or the SiOC layer. At this time, the first layer can be modified to the SiO layer by making both components of the C-component and the N-component in the first layer desorbed by the energy of the active species while adding the O-component to the first layer. At this time, owing to the action of the plasma oxidation by the $O_2$ gas, Si—O bond in the first layer is increased and meanwhile Si—N bond, Si—C bond, and Si—Si bond are reduced, and the ratio of the N-component in the first layer, and the ratio of the C-component and the ratio of the Si-component are reduced. Particularly, a major part of the N-component and the C-component is desorbed to be reduced to the impurity level, or substantially disappears. Namely, the first layer can be modified to the SiO layer while varying the composition ratio in a direction of increasing the oxygen concentration or in a direction of reducing the nitrogen concentration, the carbon concentration, and the silicon concentration. Further, at this time, the N-component in the first layer is desorbed by the energy of the active species and a part of the C-component is remained without being desorbed, to thereby modify the first layer to the SiOC layer. At this time, by the action of the plasma oxidation by the $O_2$ gas, Si—O bond is increased, and meanwhile Si—N bond, Si—C bond, and Si—Si bond are reduced in the first layer, and the ratio of the N-component, the ratio of the C-component, and the ratio of the Si-component in the first layer are reduced. Particularly, a major part of the N-component is desorbed to be reduced to the impurity level, or substantially disappears. Namely, the first layer can be modified to the SiOC layer while varying the composition ratio in a direction of increasing the oxygen concentration, or in a direction of reducing the nitrogen concentration, the carbon concentration, and the silicon concentration.

Note that it is found that the C-component in the first layer formed in steps 1 and 2, is in a rich state compared with the N-component. For example, according to a certain experiment, the carbon concentration is sometimes about twice or more of the nitrogen concentration. Namely, when the C-component and the N-component in the first layer are desorbed by the energy of the active species, the C-component remains even in a stage in which the major part of the N-component is desorbed. Then, oxidation is stopped in this state, to modify the first layer to the SiOC layer. Further, the oxidation is continued even after the end of the desorption of the major part of the N-component, and the oxidation is stopped in a stage in which the major part of the C-component is desorbed, to thereby modify the first layer to the SiO layer. Specifically, the ratio of the C-component, namely the carbon concentration can be controlled by controlling the gas supply time (oxidation treatment time), and either SiO layer or SiOC layer can be formed while controlling the composition ratio. Further, at this time, the ratio of the O-component in the SiO layer or the SiOC layer, namely the oxygen concentration can be finely adjusted by controlling the processing conditions such as the pressure and the gas supply time in the processing chamber 201. Thus, the composition ratio of the SiO layer or the SiOC layer can be more strictly controlled.

At this time, an oxidation reaction of the first layer is preferably not to be saturated. For example, when the first layer of 1 atomic layer or less than 1 atomic layer is formed in steps 1 and 2, a part of the first layer is preferably oxidized. In this case, oxidation is performed under a condition that the oxidation reaction of the first layer is unsaturated, so that an entire body of the first layer of 1 atomic layer or less than 1 atomic layer is not oxidized.

In order to set the oxidation reaction of the first layer in an unsaturated state, the aforementioned processing condition is used as the processing condition in step 3. In a case of using the following processing condition as the processing condition in step 3, the oxidation reaction of the first layer can be easily unsaturated.

[When the $O_2$ Gas is Activated and Flowed . . . ]
Wafer temperature: 500 to 600° C.
Pressure in the processing chamber: 133 to 2666 Pa
Partial pressure of O2 gas: 67 to 2394 Pa
$O_2$ gas supply flow rate: 1000 to 5000 sccm
$N_2$ gas supply flow rate: 300 to 1000 sccm
$O_2$ gas supply time: 6 to 60 seconds
[When the $O_2$ Gas is Plasma Activated and Flowed . . . ]
Wafer temperature: 500 to 600° C.
Pressure in the processing chamber: 33 to 80 Pa
Partial pressure of the $O_2$ gas: 17 to 67 Pa
$O_2$ gas supply flow rate: 1000 to 5000 sccm
$N_2$ gas supply flow rate: 300 to 1000 sccm
$O_2$ gas supply time: 6 to 60 seconds Thereafter, the valve 243j of the sixth gas supply tube 232j is closed, to stop the supply of the $O_2$ gas. At this time, the inside of the processing chamber 201 is vacuum-exhausted by the vacuum pump 246, with the APC valve 244 of the exhaust tube 231 opened, and the $O_2$ gas after contributing to the reaction remained in the processing chamber 201 is removed from the processing chamber 201. Note that the supply of the $N_2$ gas into the processing chamber 201 is maintained, with the valve 243h opened. Thus, the effect of purging the inside of the processing chamber 201, and removing the $O_2$ gas from the processing chamber 201 is increased, which is the $O_2$ gas unreacted or after contributing to the reaction remained in the processing chamber 201.

As the oxygen-containing gas, other than the gas obtained by thermally or plasma-exciting the $O_2$ gas, the gas obtained by thermally or plasma-exciting nitrous oxide ($N_2O$) gas, nitric monoxide (NO) gas, nitrogen dioxide ($NO_2$) gas, ozone ($O_3$) gas, hydrogen ($H_2$) gas+oxygen ($O_2$) gas, $H_2$ gas+$O_3$ gas, steam ($H_2O$) gas, carbon monoxide (CO) gas, carbon dioxide ($CO_2$) gas, etc., may be used, or the gas obtained by diluting these gases with rare gas such as Ar gas, He gas, Ne gas, and Xe gas, may be thermally or plasma-excited and used.

The above-described steps 1 to 3 are set as 1 cycle, and this cycle is performed one or more times (prescribed number of times), to thereby form the silicon oxycarbonitride film (SiOCN film), the silicon oxide film (SiO film), or the silicon oxycarbide film (SiOC film) having a prescribed composition and a prescribed film thickness on the wafer 200. Note that the aforementioned cycle is preferably repeated multiple number of times.

When the film formation processing is performed, which is the processing of forming the SiOCN film, the SiO film, or the SiOC film having a prescribed composition and a prescribed film thickness, the gas purge, inert gas substitution, return to the atmosphere, boat unloading, and wafer discharge are performed similarly to the first sequence.

(Fourth Sequence)

A fourth sequence of this embodiment will be described next.

Figure 6:
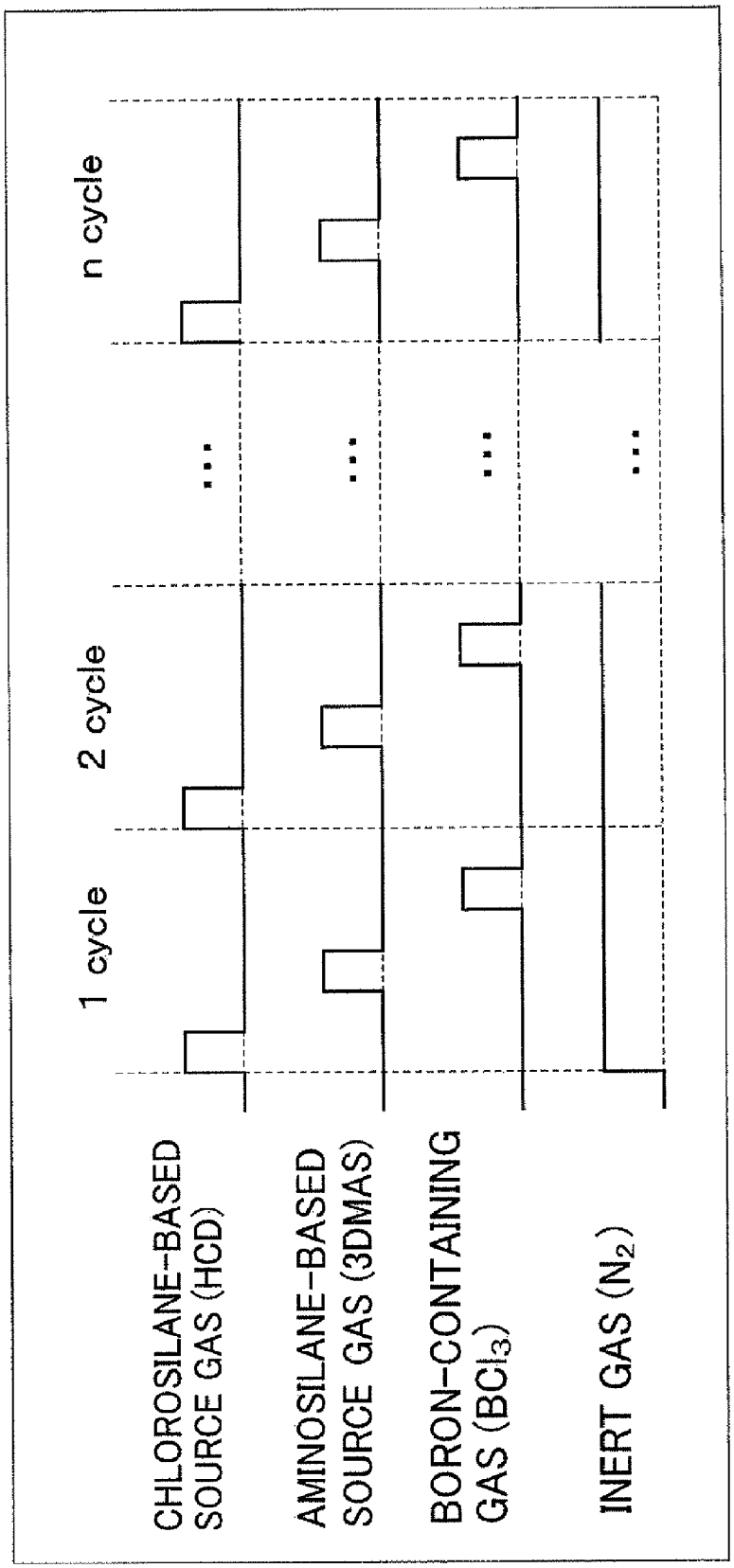
FIG. 6 is a view showing a timing of gas supply in a fourth sequence of this embodiment.

FIG. 6 is a view of the timing of the gas supply in the fourth sequence according to this embodiment.

In the fourth sequence of this embodiment, a silicon boron carbonitride film is formed by performing the following steps alternately prescribed number of times:

supplying chlorosilane-based source to the wafer f200 in the processing chamber 201 and thereafter supplying the aminosilane-based source thereto as reactive gases, to form a first layer containing silicon, nitrogen, and carbon on the wafer 200; and supplying thermally activated boron-containing gas to the wafer 200 in the processing chamber as the reactive gas, to modify the first layer and form a silicon boron carbonitride layer being a second layer.

The fourth sequence of this embodiment will be more specifically described hereafter. Here, explanation will be given for an example of forming a silicon boron carbonitride film (SiBCN film) being the insulating film on the substrate based on the sequence of FIG. 6, using the HCD gas as the chlorosilane-based source gas, and the 3DMAS gas as the aminosilane-based source gas, and $BCl_3$ gas as the boron-containing gas.

The wafer charge, boat loading, pressure adjustment, temperature adjustment, and wafer rotation are similarly performed as the first sequence. Thereafter, three steps as will be described later are sequentially executed.

[Step 1]

Step 1 is performed similarly to the step 1 of the first sequence. Namely, the processing conditions, the reaction to be caused, and the layer to be formed, etc., in step 1 are the same as those of the step 1 of the first sequence. Namely, in this step, the silicon-containing layer is formed on the wafer 200 by supplying the HCD gas into the processing chamber 201.

[Step 2]

Step 2 is similarly performed as the step 2 of the first sequence. Namely, the processing conditions, the reaction to be caused, and the layer to be formed, etc., in step 2 are the same as those of the step 2 of the first sequence. Namely, in this step, the 3DMAS gas is supplied into the processing chamber 2 to cause a reaction between the silicon-containing layer and the 3DMAS gas, to thereby form the first layer containing Si, N, and C.

[Step 3]

After the residual gas in the processing chamber 201 is removed in the end of the step 2, the valve 243c of the third gas supply tube 232c is opened, to flow the $BCl_3$ gas into the third gas supply tube 232c. The flow rate of the $BCl_3$ gas flowed into the third gas supply tube 232c is adjusted by the mass flow controller 241c. The $BCl_3$ gas with the flow rate adjusted, is supplied into the processing chamber 201 from the gas supply holes 250c of the third nozzle 249c, and is exhausted from the exhaust tube 231. At this time, the thermally activated $BCl_3$ gas is supplied to the wafer 200. The valve 243g is simultaneously opened at this time, to flow the $N_2$ gas into the inert gas supply tube 232g. The $N_2$ gas is supplied into the processing chamber 201 together with the $BCl_3$ gas, and is exhausted from the exhaust tube 231.

At this time, the APC valve 244 is properly adjusted, to set the pressure in the processing chamber 201 in a range of 50 to 3000 Pa for example. The supply flow rate of the $BCl_3$ gas controlled by the mass flow controller 241c is set in a range of 100 to 10000 sccm for example. The supply flow rate of the $N_2$ gas controlled by the mass flow controller 241g is set in a range of 200 to 10000 sccm for example. The time required for exposing the $BCl_3$ gas to the wafer 200, namely the gas supply time (irradiation time) is set in a range of 1 to 120 seconds for example, and is preferably set in a range of 1 to 60 seconds. Similarly to the steps 1 to 2, the temperature of the heater 207 at this time is set so that the temperature of the wafer 200 is in a range of 250 to 700° C., and is preferably in a range of 350 to 600° C. Note that a soft reaction can be caused by supplying the thermally activated $BCl_3$ gas. Thus, the boron-containing layer as will be described later can be easily formed.

At this time, the gas flowed into the processing chamber 201 is the thermally activated $BCl_3$ gas, and neither the HCD gas nor the 3DMAS gas is flowed into the processing chamber 201. Accordingly, the $BCl_3$ gas is supplied to the wafer 200 in an activated state without causing the vapor phase reaction, and at this time, the boron-containing layer of less than 1 atomic layer, namely a discontinuous boron-containing layer is formed on the first layer containing Si, N, and C formed on the wafer 200 in step 2. The boron-containing layer may be a boron layer (B-layer) or a chemical adsorption layer of $BCl_3$, which is the chemical adsorption layer made of a substance ($B_xCl_y$) which is a decomposition of $BCl_3$. Note that a part of the first layer and the $BCl_3$ gas are reacted depending on a condition, to boronize the first layer. Thus, the first layer is modified to form a second layer including the silicon boron carbonitride layer (SiBCN layer).

Note that when the $BCl_3$ gas is thermally activated and is flowed into the processing chamber 201 to modify the first layer, the first layer is modified to the SiBCN layer while adding B-component to the first layer. Namely, the first layer can be modified to the SiBCN layer while varying the composition ratio in a direction of increasing the boron concentration. Further, the processing conditions such as the pressure in the processing chamber 201 and the gas supply time are controlled to thereby finely adjust the ratio of the B-component, namely boron concentration in the SiBCN layer, and the composition ratio of the SiBCN layer can be further strictly controlled.

Thereafter, the valve 243c of the third gas supply tube 232c is closed, to stop the supply of the $BCl_3$ gas. At this time, the inside of the processing chamber 201 is vacuum-exhausted by the vacuum pump 246, with the APC valve 244 of the exhaust tube 231 opened, to thereby remove the $BCl_3$ gas unreacted or after contributing to the reaction remained in the processing chamber 201, from the processing chamber 201. Note that the supply of the $N_2$ gas into the processing chamber 201 is maintained, with the valve 243g opened. Thus, the effect of purging the inside of the processing chamber 201, and removing the $BCl_3$ gas from the processing chamber 201 is increased, which is the $BCl_3$ gas unreacted or after contributing to the reaction remained in the processing chamber 201.

Diborane ($B_2H_6$) gas, etc., may be used as the boron-containing gas, other than the $BCl_3$ gas.

The aforementioned steps 1 to 3 are set as 1 cycle, and by performing this cycle one or more number of times (prescribe number of times), the silicon boron carbonitride film (SiBCN film) having a prescribed composition and a prescribed film thickness can be formed on the wafer 200. Note that the aforementioned cycle is preferably repeated multiple number of times.

When the film formation processing of forming the SiBCN film having a prescribed composition and a prescribed film thickness is performed, the gas purge, inert gas substitution, return to the atmosphere, boat unloading, and wafer discharge are performed similarly to the first sequence.

(Fifth Sequence)

A fifth sequence of this embodiment will be described next.

Figure 7:
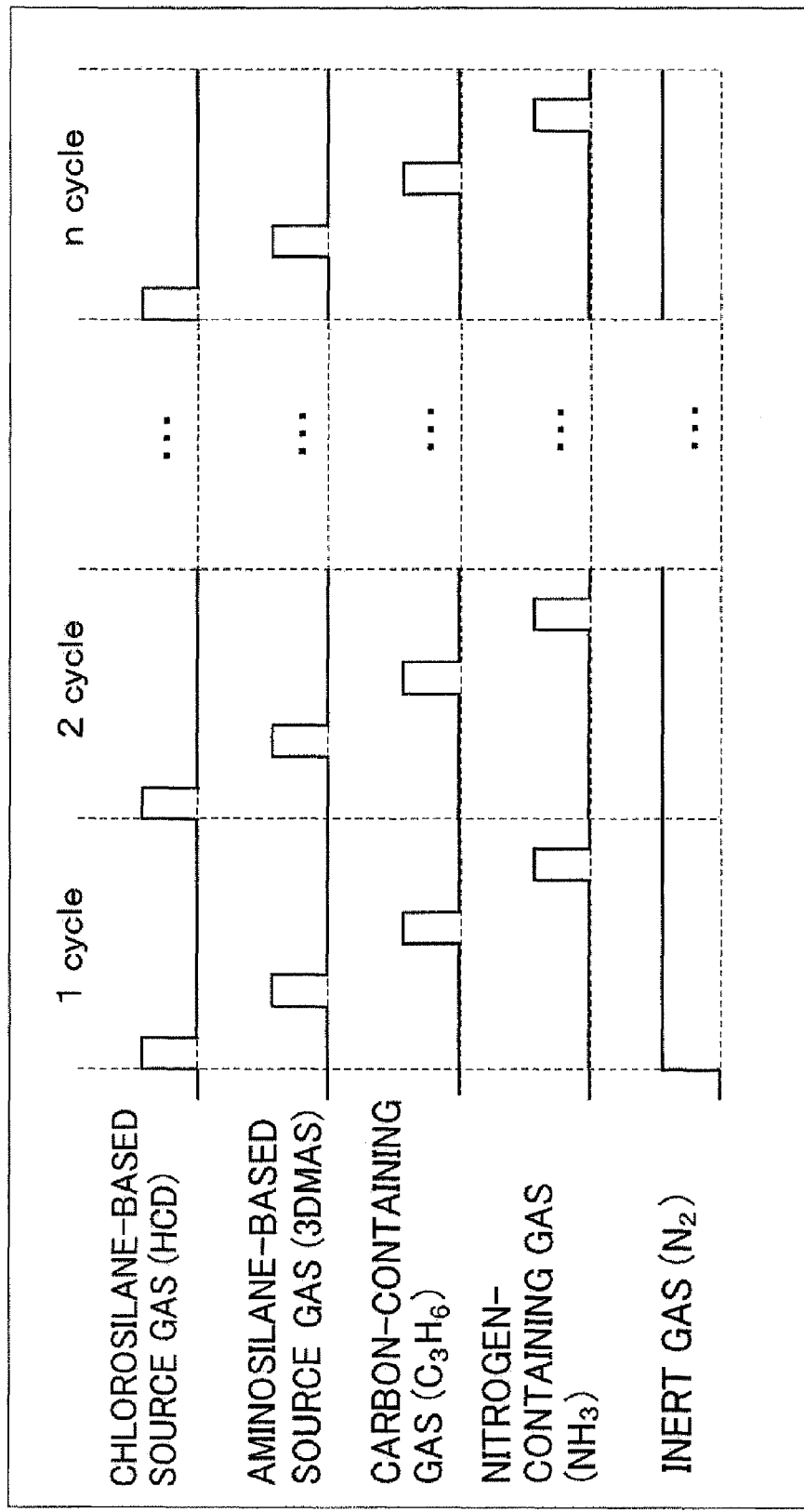
FIG. 7 is a view showing a timing of gas supply in a fifth sequence of this embodiment.

FIG. 7 is a view showing the timing of the gas supply in the fifth sequence of this embodiment.

In the fifth sequence of this embodiment, a silicon carbonitride film is formed by performing the following steps alternately prescribed number of times:

supplying the chlorosilane-based source to the wafer 200 in the processing chamber 201, and thereafter supplying the aminosilane-based source thereto, to form the first layer containing silicon, nitrogen, and carbon on the wafer 200; and supplying thermally activated carbon-containing gas to the wafer 200 in the processing chamber 201 as the reactive gas, and thereafter supplying thermally activated nitrogen-containing gas thereto as the reactive gas, to modify the first layer and form a silicon carbonitride layer as a second layer.

In forming the second layer, the thermally activated carbon-containing gas is supplied to the wafer 200 in the processing chamber 201, to make the carbon-containing gas adsorbed on the first layer, and thereafter the thermally activated nitrogen-containing gas is supplied to the wafer 200 in the processing chamber 201 to modify the layer with the carbon-containing gas chemically adsorbed on the first layer, and form the silicon carbonitride layer.

The fifth sequence of this embodiment will be more specifically described hereafter. Here, explanation will be given for an example of forming the silicon corbonitride film (SiCN film) being the insulating film on the substrate based on the sequence of FIG. 7, using the HCD gas as the chlorosilane-based source gas, and the 3DMAS gas as the aminosilane-based source gas, and $C_3H_6$ gas as the carbon-containing gas.

The wafer charge, boat loading, pressure adjustment, temperature adjustment, and wafer rotation are similarly performed as the first sequence. Thereafter, four steps as will be described later are sequentially executed.

[Step 1]

Step 1 is performed similarly to the step 1 of the first sequence. Namely, the processing conditions, the reaction to be caused, and the layer to be formed, etc., in step 1 are the same as those of the step 1 of the first sequence. Namely, in this step, the silicon-containing layer is formed on the wafer 200 by supplying the HCD gas into the processing chamber 201.

[Step 2]

Step 2 is similarly performed as the step 2 of the first sequence. Namely, the processing conditions, the reaction to be caused, and the layer to be formed, etc., in step 2 are the same as those of the step 2 of the first sequence. Namely, in this step, the 3DMAS gas is supplied into the processing chamber 2 to cause a reaction between the silicon-containing layer and the 3DMAS gas, to thereby form the first layer containing Si, N, and C.

[Step 3]

Step 3 is performed similarly to the step 3 of the second sequence. Namely, the processing conditions, the reaction to be caused, and the layer to be formed, etc., in step 3 are the same as those of the step 3 of the second sequence.

In step 3, the chemical adsorption layer of $C_3H_6$, namely the chemical adsorption layer made of a substance ($C_xH_y$) which is a decomposition of $C_3H_6$ is preferably formed on the first layer containing Si, N, and C formed on the wafer 200 in step 2. Here, the chemical adsorption layer of $C_xH_y$ needs to be a discontinuous chemical adsorption layer of $C_xH_y$ molecules. Note that when the chemical adsorption layer of $C_xH_y$ formed on the first layer is the discontinuous layer, for example when the discontinuous chemical adsorption layer of $C_xH_y$ is formed on the first layer, with an adsorption state on the first layer of $C_xH_y$ set in a saturation state, a surface of the first layer is covered with the chemical adsorption layer of $C_xH_y$ entirely. In this case, silicon does not exist on the surface of the layer with $C_xH_y$ chemically adsorbed on the first layer, thus making it difficult to perform nitriding of this layer in step 4 as will be described later. This is because although nitrogen is bonded to silicon, it is not bonded to carbon. In order to cause a desired nitriding reaction in step 4 as will be described later, the adsorption state on the first layer of CxHy needs to be set in the unsaturated state, which is a state in which silicon is exposed to the surface of this layer.

In order to set the adsorption state on the first layer of $C_xH_y$ in the unsaturated state, the processing conditions in step 3 may be the same as the processing conditions in the step 3 of the second sequence. However, by using the following processing conditions in step 3, the adsorption state on the first layer of $C_xH_y$ is easily set in the unsaturated state.

Wafer temperature: 500 to 600° C.
Pressure in the processing chamber: 133 to 2666 Pa
Partial pressure of the $C_3H_6$ gas: 67 to 2394 Pa
$C_3H_6$ gas supply flow rate: 1000 to 5000 sccm
$N_2$ gas supply flow rate: 300 to 1000 sccm
$C_3H_6$ gas supply time: 6 to 60 seconds When the $C_3H_6$ gas is thermally activated and is flowed into the processing chamber 201 to make $C_xH_y$ chemically adsorbed on the first layer, the ratio of the C-component in the entire body of this layer is increased by a chemical adsorption portion of the $C_xH_y$ on the first layer. Namely, the composition ratio can be varied in a direction of increasing the carbon concentration. Further, at this time, the ratio of the C-component in the layer with $C_xH_y$ chemically adsorbed on the first layer, namely the carbon concentration can be controlled (finely adjusted) by controlling the processing conditions such as the pressure in the processing chamber 201 and the gas supply time. Thus, the composition ratio of the SiCN layer formed in step 4 can be more strictly controlled.

[Step 4]

Step 4 is performed similarly to the step 3 of the first sequence. Namely, the processing conditions, the reaction to be caused, and the layer to be formed, etc., in step 4 are the same as those of the step 3 of the first sequence.

Note that in step 4, the $NH_3$ gas is thermally activated without being plasma-excited and is supplied into the processing chamber 201. At this time, the gas flowed into the processing chamber 201 is the thermally activated $NH_3$ gas, and none of the HCD gas and the 3DMAS gas and the $C_3H_6$ gas is flowed into the processing chamber 201. Accordingly, the $NH_3$ gas does not cause the vapor phase reaction, and the activated $NH_3$ gas is reacted with at least a part of the layer with $C_xH_y$ chemically adsorbed on the first layer, which is formed on the wafer 200 in step 3. Thus, this layer is nitrided and is modified to the second layer including the silicon carbonitride layer (SiCN layer).

Note that when the $NH_3$ gas is thermally activated and is flowed into the processing chamber 201, to modify the layer with $C_xH_y$ chemically adsorbed on the first layer to the SiCN layer, this layer is modified to the SiCN layer while increasing the ratio of the N-component in this layer. At this time, by the thermal nitriding action of the $NH_3$ gas, Si—N bond in this layer is increased and meanwhile Si—C bond and Si—Si bond are reduced, and the ratio of the C-component and the ratio of the Si-component in this layer are reduced. Namely, the layer with $C_xH_y$ chemically adsorbed on the first layer can be modified to the SiCN layer while varying the composition ratio in a direction of increasing the nitrogen concentration and in a direction of reducing the carbon concentration and the silicon concentration. Further, the processing conditions such as the pressure in the processing chamber 201 and the gas supply time are controlled to finely adjust the ratio of the N-component, namely the nitrogen concentration in the SiCN layer. Thus, the composition ratio of the SiCN layer can be more strictly controlled.

At this time, the nitriding reaction of the layer with CxHy chemically adsorbed on the first layer is preferably not to be saturated. Namely, a part of the layer is preferably nitrided. In this case, nitriding is performed under a condition that the nitriding reaction of this layer is unsaturated, so that the entire body of this layer is not nitrided. Note that in order to make the unsaturated state of the nitriding reaction of the layer with $C_xH_y$ chemically adsorbed on the first layer, the processing conditions in step 4 may be the same as the processing conditions in the step 3 of the first sequence.

The aforementioned steps 1 to 4 are set as 1 cycle, and by performing this cycle one or more number of times (prescribe number of times), the silicon carbonitride film (SiCN film) having a prescribed composition and a prescribed film thickness can be formed on the wafer 200. Note that the aforementioned cycle is preferably repeated multiple number of times.

When the film formation processing of forming the SiCN film having a prescribed composition and a prescribed film thickness is performed, the gas purge, inert gas substitution, return to the atmosphere, boat unloading, and wafer discharged are performed similarly to the first sequence.

(Sixth Sequence)

A sixth sequence of this embodiment will be described next.

Figure 8:
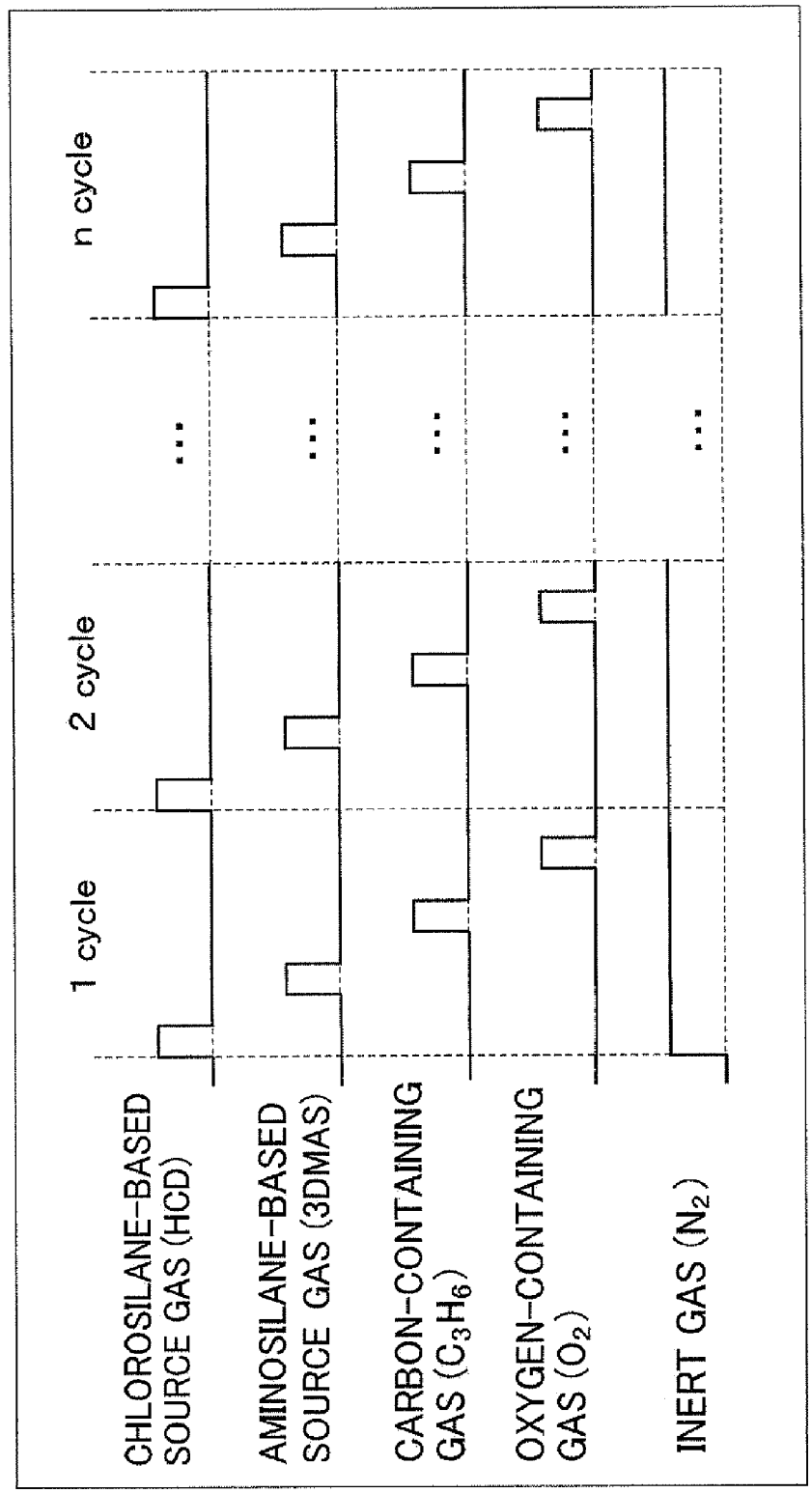
FIG. 8 is a view showing a timing of gas supply in a sixth sequence of this embodiment.

FIG. 8 is a view of the timing of the gas supply in the sixth sequence of this embodiment.

In the sixth sequence of this embodiment, a silicon oxycarbonitride film having a prescribed composition and a prescribed film thickness, is formed on the wafer 200 by alternately performing prescribed number of times, supplying the chlorosilne source to the wafer 200 in the processing chamber, and thereafter supplying the aminosilane-based source thereto, to form the first layer containing silicon, nitrogen, and carbon on the wafer 200; and supplying the thermally activated carbon-containing gas to the wafer 200 in the processing chamber 201 as the reactive gas, and thereafter supplying the thermally activated oxygen-containing gas thereto as the reactive gas, to modify the first layer and form the silicon oxycarbonitride layer as the second layer.

In forming the second layer, the thermally activated carbon-containing gas is supplied to the wafer 200 in the processing chamber 201, to chemically adsorb the carbon-containing gas on the first layer, and thereafter the thermally activated oxygen-containing gas is supplied to the wafer 200 in the processing chamber 201, to modify the layer with the carbon-containing gas chemically adsorbed on the first layer and form the silicon oxycarbonitride layer.

The sixth sequence of this embodiment will be specifically described hereafter. Here, explanation will be given for a case that the HCD gas is used as the chlorosilane-based source gas, and the 3DMAS gas is used as the aminosilane-based source gas, $C_3H_6$ gas is used as the carbon-containing gas, and the $O_2$ gas is used as the oxygen-containing gas, to thereby form the silicon oxycarbonitride film (SiOCN film) on the substrate as the insulating film, based on the sequence of FIG. 8.

The wafer charge, boat loading, pressure adjustment, temperature adjustment, and wafer rotation are similarly performed as the first sequence. Thereafter, four steps as will be described later are sequentially executed.

[Step 1]

Step 1 is performed similarly to the step 1 of the first sequence. Namely, the processing conditions, the reaction to be caused, and the layer to be formed, etc., in step 1 are the same as those of the step 1 of the first sequence. Namely, in this step, the silicon-containing layer is formed on the wafer 200 by supplying the HCD gas into the processing chamber 201.

[Step 2]

Step 2 is performed similarly to the step 2 of the first sequence. Namely, the processing conditions, the reaction to be caused, and the layer to be formed, etc., in step 2 are the same as those of the step 2 of the first sequence. Namely, in this step, the 3DMAS gas is supplied into the processing chamber 201, to cause the reaction between the silicon-containing layer and the 3DMAS gas, and form the first layer containing Si, N, and C.

[Step 3]

Step 3 is performed similarly to the step 3 of the fifth sequence. Namely, the processing conditions, the reaction to be caused, the layer to be formed, and a method for controlling the carbon concentration, etc., in step 3 are the same as those of the step 3 of the fifth sequence. Namely, in this step, the $C_3H_6$ gas is supplied into the processing chamber 201, to chemically adsorb the $C_xH_y$ on the first layer.

[Step 4]

Step 4 is performed similarly to the step 3 of the third sequence. Namely, the processing conditions, the reaction to be caused, and the layer to be formed, etc., are the same as those of the step 3 of the third sequence.

In step 4, the $O_2$ gas is thermally activated and supplied into the processing chamber 201 without being plasma-excited. At this time, the gas flowed into the processing chamber 201 is the thermally activated $O_2$ gas, and neither the HCD gas nor the 3DMAS gas is flowed into the processing chamber 201. Accordingly, the $O_2$ gas does not cause the vapor phase reaction, and the activated $O_2$ gas is reacted with at least a part of the layer with $C_xH_y$ chemically adsorbed on the first layer, which is the layer formed on the wafer 200 in step 3. Thus, this layer is oxidized and is modified to the second layer including the silicon oxycarbonitride layer (SiOCN layer).

Note that when the $O_2$ gas is thermally activated and flowed into the processing chamber 201, to thermally oxidize the layer with $C_xH_y$ chemically adsorbed on the first layer and modify this layer to the SiOCN layer, this layer is modified to the SiOCN layer while adding the O-component to this layer. At this time, by the thermal oxidizing action by the $O_2$ gas, Si—O bond is increased and meanwhile Si—N bond, Si—C bond, and Si—Si bond are reduced in this layer, and the ratio of the N-component, the ratio of the C-component and the ratio of the Si component in this layer are reduced. Namely, the layer with $C_xH_y$ chemically adsorbed on the first layer can be modified to the SiOCN layer while varying the composition ratio in a direction of increasing the oxygen concentration and in a direction of reducing the nitrogen concentration, the carbon concentration, and the silicon concentration. Further, the processing conditions such as the pressure in the processing chamber 201 and the gas supply time are controlled, to thereby finely adjust the ratio of the O-component, namely the oxygen concentration in the SiOCN layer. Thus, the composition ratio of the SiOCN layer can be more strictly controlled.

At this time, the oxidation reaction of the layer with $C_xH_y$ chemically adsorbed on the first layer, is preferably not saturated. Namely, a part of this layer is preferably oxidized. In this case, oxidation is performed under a condition that the oxidation reaction of this layer is unsaturated, so that the entire body of this layer is not oxidized. Note that in order to set the oxidation reaction of the layer with $C_xH_y$ chemically adsorbed on the first layer in the unsaturated state, the processing conditions in step 4 may be the same as the processing conditions in the step 3 of the third sequence.

The aforementioned steps 1 to 4 are set as 1 cycle, and by performing this cycle one or more number of times (prescribe number of times), the silicon carbonitride film (SiCN film) having a prescribed composition and a prescribed film thickness can be formed on the wafer 200. Note that the aforementioned cycle is preferably repeated multiple number of times.

When the film formation processing of forming the SiOCN film having a prescribed composition and a prescribed film thickness is performed, gas purge, inert gas substitution, return to the atmosphere, boat unloading, and wafer discharge, are performed similarly to the first sequence.

(Seventh Sequence)

A seventh sequence of this embodiment will be described next.

Figure 9:
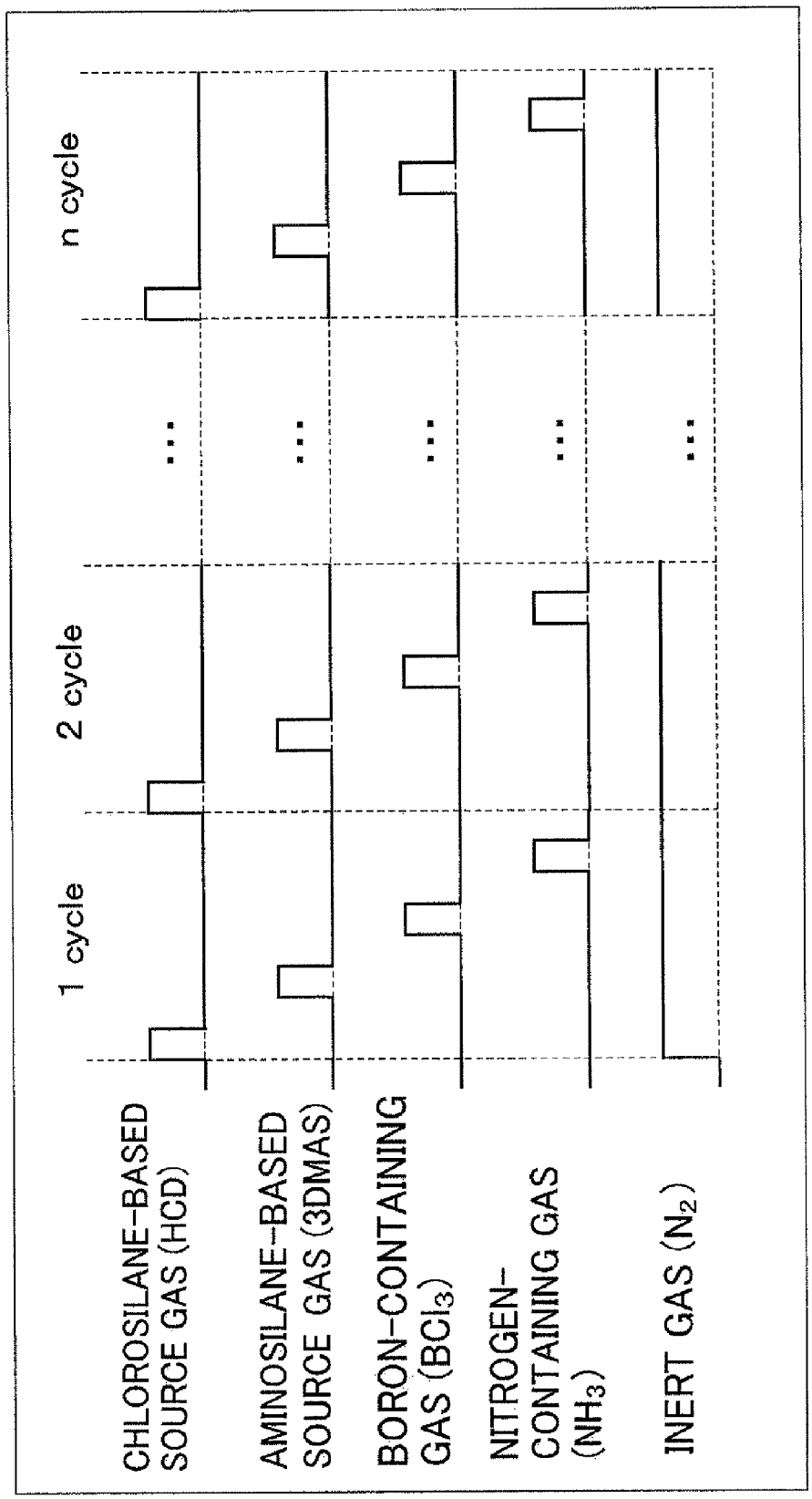
FIG. 9 is a view showing a timing of gas supply in a seventh sequence of this embodiment.

FIG. 9 is a view of the timing of the gas supply in the seventh sequence of this embodiment.

In the seventh sequence of this embodiment, a silicon boron carbonitride film having a prescribed composition and a prescribed film thickness, is formed on the wafer 200 by alternately performing the following steps prescribed number of times, supplying the chlorosilane-based source to the wafer 200 in the processing chamber 201, and thereafter supplying the aminosilane-based source thereto, to form the first layer containing silicon, nitrogen, and carbon on the wafer 200; and supplying the thermally activated boron-containing gas to the wafer 200 in the processing chamber 201 as the reactive gas, and thereafter supplying the thermally activated nitrogen-containing gas thereto as the reactive gas, to modify the first layer and form the silicon boron carbonitride layer as the second layer.

In forming the second layer, the thermally activated boron-containing gas is supplied to the wafer 200 in the processing chamber 201 to chemically adsorb the boron-containing gas on the first layer, and thereafter the thermally activated nitrogen-containing gas is supplied to the wafer 200 in the processing chamber to modify the layer with boron-containing gas chemically adsorbed on the first layer, and form the silicon boron carbonitride layer.

The seventh sequence of this embodiment will be more specifically described hereafter. Here, explanation is given for a case that the HCD gas is used as the chlorosilane-based source gas, the 3DMAS gas is used as the aminosilane-based source gas, the $BCl_3$ gas is used as boron-containing gas, and the $NH_3$ gas is used as the nitrogen-containing gas, to form the silicon boron carbonitride film (SiBCN film) on the substrate as the insulating film based on the sequence of FIG. 9.

The wafer charge, boat loading, pressure adjustment, temperature adjustment, and wafer rotation are similarly performed as the first sequence.

Thereafter, four steps as will be described later are sequentially executed.

[Step 1]

Step 1 is performed similarly to the step 1 of the first sequence. Namely, the processing conditions, the reaction to be caused, and the layer to be formed, etc., in step 1 are the same as those of the step 1 of the first sequence. Namely, in this step, the silicon-containing layer is formed on the wafer 200 by supplying the HCD gas into the processing chamber 201.

[Step 2]

Step 2 is performed similarly to the step 2 of the first sequence. Namely, the processing conditions, the reaction to be caused, and the layer to be formed, etc., in step 2 are the same as those of the step 2 of the first sequence. Namely, in this step, the silicon-containing layer and the 3DMAS gas are reacted by supplying the 3DMAS gas into the processing chamber 201, to form the first layer containing Si, N, and C.

[Step 3]

Step 3 is performed similarly to the step 3 of the fourth sequence. Namely, the processing conditions, the reaction to be caused, and the layer to be formed, etc., in step 3 are the same as those of the step 3 of the fourth sequence.

In step 3, the chemical adsorption layer of $BCl_3$, namely the chemical adsorption layer made of a substance ($B_xCl_y$) which is a decomposition of $BCl_3$ is preferably formed on the first layer containing Si, N, and C formed on the wafer 200 in step 2. Here, boron is bonded to silicon but is not bonded to carbon, and therefore the chemical adsorption layer of $B_xCl_y$ is a discontinuous chemical adsorption layer of $B_xCl_y$ molecules.

Note that when the $BCl_3$ gas is thermally activated and is flowed into the processing chamber 201, to chemically adsorb the $B_xCl_y$ on the first layer, the B-component is added by a chemical adsorption portion of the $B_xCl_y$ on the first layer. Namely, the composition ratio can be varied in a direction of increasing the boron concentration. Further, at this time, the processing conditions such as the pressure in the processing chamber 201 and the gas supply time are controlled to thereby control (finely adjust) the ratio of the B-component in the layer with $B_xCl_y$ chemically adsorbed on the first layer, namely control the boron concentration. Thus, the composition ratio of the SiBCN layer formed in step 4 can be more strictly controlled.

[Step 4]

Step 4 is performed similarly to the step 4 of the fifth sequence. Namely, the processing conditions, etc., in step 4 are the same as those of the step 4 of the fifth sequence. However, step 4 is slightly different from the step 4 of the fifth sequence, in the reaction to be caused and the layer to be formed.

In step 4, the $NH_3$ gas is thermally activated and is supplied into the processing chamber 201 without being plasma-excited. At this time, the gas flowed into the processing chamber 201 is the thermally activated $NH_3$ gas, and none of the HCD gas, 3DMAS gas, and the $BCl_3$ gas is flowed into the processing chamber 201. Accordingly, the $NH_3$ gas does not cause the vapor phase reaction, and the activated $NH_3$ gas is reacted with at least a part of the layer with $B_xCl_y$ chemically adsorbed on the first layer, which is the layer formed on the wafer 200 in step 3. Thus, this layer is nitrided and is modified to the second layer including the silicon boron carbonitride layer (SiBCN layer).

Note that when the $NH_3$ gas is thermally activated and is flowed into the processing chamber 201, to thermally nitride the layer with BxCly chemically adsorbed on the first layer, and modify it to the SiBCN layer, this layer is modified to the SiBCN layer while increasing the ratio of the N-component in this layer. At this time, by the thermal nitriding action of the $NH_3$ gas, Si—N bond in this layer is increased and meanwhile Si—B bond, Si—C bond, and Si—Si bond are reduced, and the ratio of the B-component, the ratio of the C-component, and the ratio of the Si-component in this layer are reduced. Namely, the layer with $B_xCl_y$ chemically adsorbed on the first layer can be modified to the SiBCN layer while varying the composition ratio in a direction of increasing the nitrogen concentration, and in a direction of reducing the boron concentration, the carbon concentration, and the silicon concentration. Further, at this time, the processing conditions such as the pressure in the processing chamber 201 and the gas supply time are controlled to finely adjust the ratio of the N-component, namely the nitrogen concentration in the SiBCN layer. Thus, the composition ratio of the SiBCN layer can be more strictly controlled.

Note that at this time, the nitriding reaction of the layer with $B_xCl_y$ chemically adsorbed on the first layer, is preferably not to be saturated. Namely, apart of this layer is preferably not to be nitrided. In this case, nitriding is performed under a condition the nitriding reaction of this layer is unsaturated so that the entire body of this layer is not nitrided. Note that in order to unsaturate the nitriding reaction of the layer with $B_xCl_y$ chemically adsorbed on the first layer, the processing conditions in step 4 may be the same as the processing conditions in the step 4 of the fifth sequence (step 3 of the first sequence).

The aforementioned steps 1 to 4 are set as 1 cycle, and by performing this cycle one or more number of times (prescribe number of times), the silicon boron carbonitride film (SiBCN film) having a prescribed composition and a prescribed film thickness can be formed on the wafer 200. Note that the aforementioned cycle is preferably repeated multiple number of times.

When the film formation processing of forming the SiBCN film having a prescribed composition and a prescribed film thickness is performed, the gas purge, inert gas substitution, return to the atmosphere, boat unloading, and wafer discharge, are performed similarly to the first sequence.

(Eighth Sequence)

An eighth sequence of this embodiment will be described next.

Figure 10:
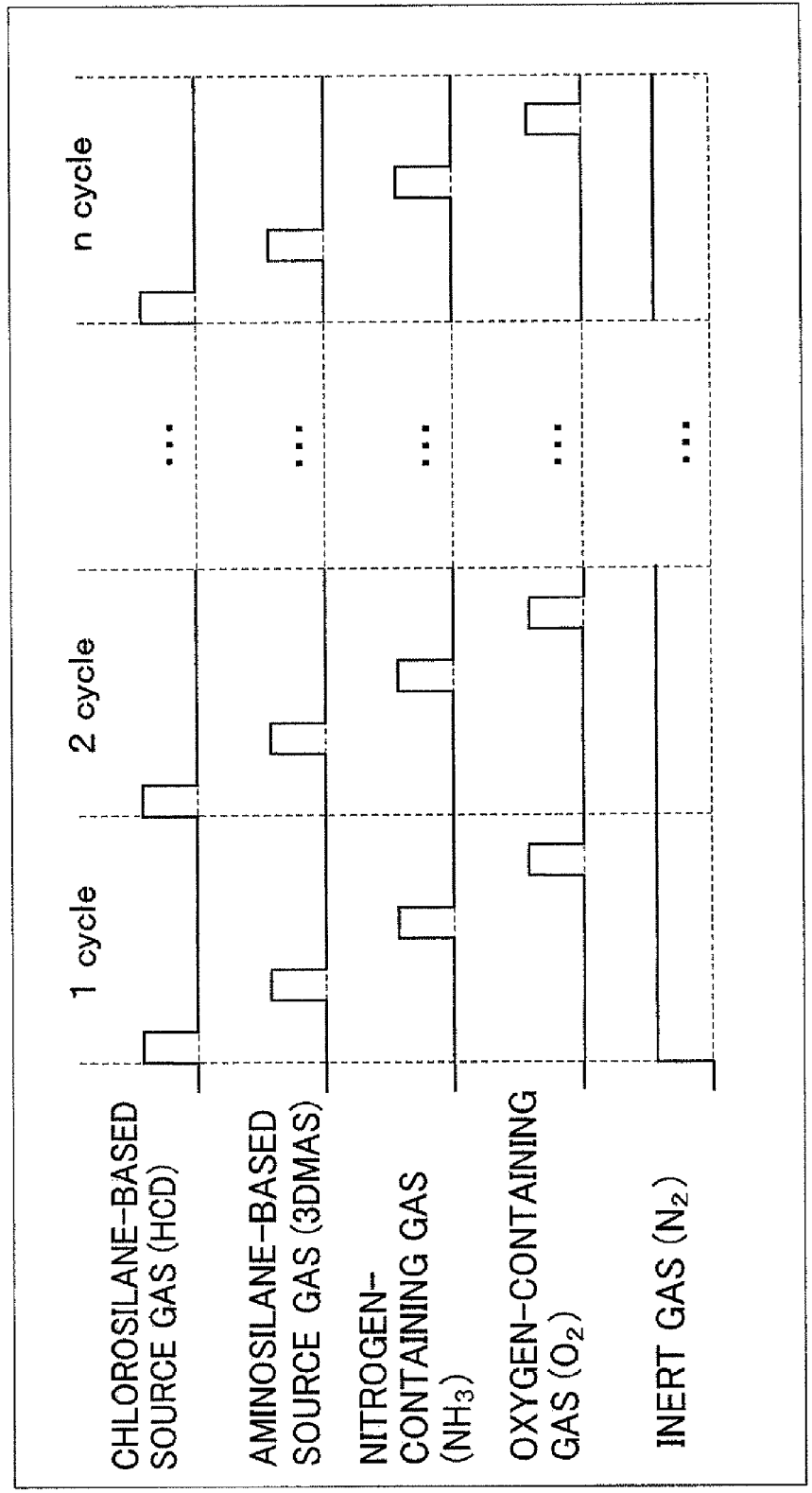
FIG. 10 is a view showing a timing of gas supply in an eighth sequence of this embodiment.

FIG. 10 is a view of the timing of the gas supply in the eighth sequence of this embodiment.

In the eighth sequence of this embodiment, the silicon oxycarbonitride film is formed on the wafer 200 by alternately performing the following steps prescribed number of times:

supplying the chlorosilane-based source to the wafer 200 in the processing chamber 201, and thereafter supplying the aminosilane-based source thereto, to form the first layer containing silicon, nitrogen, and carbon on the wafer 200; and supplying the thermally activated nitrogen-containing gas as the reactive gas, to the wafer 200 in the processing chamber 201, and thereafter supplying thereto the thermally activated oxygen-containing gas as reactive gases, to modify the first layer and form the silicon oxycarbonitride layer.

Note that in forming the second layer, the thermally activated nitrogen-containing gas is supplied to the wafer 200 in the processing chamber 201, to modify the first layer and form the silicon carbonitride layer, and thereafter the thermally activated oxygen-containing gas is supplied to the wafer 200 in the processing chamber 201, to modify the silicon carbonitride layer and form the silicon oxycarbonitride layer.

The eighth sequence of this embodiment will be more specifically described. Here, explanation is given for a case that the HCD gas is used as the chlorosilane-based source gas, the 3DMAS gas is used as the aminosilane-based source gas, the $NH_3$ gas is used as nitrogen-containing gas, and the $O_2$ gas is used as the oxygen-containing gas, to thereby form the silicon oxycarbonitride film (SiOCN film) on the substrate as the insulating film based on the sequence of FIG. 10.

The wafer charge, boat loading, pressure adjustment, temperature adjustment, and wafer rotation are similarly performed as the first sequence.

Thereafter, four steps as will be described later are sequentially executed.

[Step 1]

Step 1 is performed similarly to the step 1 of the first sequence. Namely, the processing conditions, the reaction to be caused, and the layer to be formed, etc., in step 1 are the same as those of the step 1 of the first sequence. Namely, in this step, the silicon-containing layer is formed on the wafer 200 by supplying the HCD gas into the processing chamber 201.

[Step 2]

Step 2 is performed similarly to the step 2 of the first sequence. Namely, the processing conditions, the reaction to be caused, and the layer to be formed, etc., in step 2 are the same as those of the step 2 of the first sequence. Namely, in this step, the silicon-containing layer and the 3DMAS gas are reacted by supplying the 3DMAS gas into the processing chamber 201, to form the first layer containing Si, N, and C.

[Step 3]

Step 3 is performed similarly to the step 3 of the first sequence. Namely, the processing conditions, the reaction to be caused, and the layer to be formed, etc., in step 3 are the same as those of the step 3 of the first sequence. Note that in this step, the $NH_3$ gas is thermally activated and is flowed into the processing chamber 201 without being plasma-excited, to modify the first layer to the SiCN layer.

[Step 4]

Step 4 is performed similarly to the step 4 of the sixth sequence. Namely, the processing conditions, the reaction to be caused, and the layer to be formed, etc., in step 4 are the same as those of the step 4 of the sixth sequence.

Note that in step 4, the $O_2$ gas is thermally activated without being plasma-excited and is supplied into the processing chamber 201. At this time, the gas flowed into the processing chamber 201 is the thermally activated $O_2$ gas, and none of the HCD gas, 3DMAS gas, and the $NH_3$ gas is flowed into the processing chamber 201. Accordingly, the $O_2$ gas does not cause the vapor phase reaction, and the activated $O_2$ gas is reacted with at least a part of the SiCN layer which is formed on the wafer 200 in step 3. Thus, the SiCN layer is oxidized and is modified to the second layer including the silicon oxycarbonitride layer (SiOCN layer).

Note that when the $O_2$ gas is thermally activated and is flowed into the processing chamber 201, to thermally oxidize the SiCN layer and modify it to the SiOCN layer, the SiCN layer is modified to the SiOCN layer while adding the O-component of the SiCN layer. Further, at this time, by the thermal oxidizing action of the $O_2$ gas, the Si—O bond in the SiCN layer is increased and meanwhile Si—N bond, Si—C bond, and Si—Si bond are reduced in the SiCN layer, and the ratio of the N-component, the ratio of the C-component, and the ratio of the Si-component in the SiCN layer are reduced. Namely, the SiCN layer and the SiOCN layer can be modified while varying the composition ratio in a direction of increasing the oxygen concentration, and in a direction of reducing the nitrogen concentration, the carbon concentration, and the silicon concentration. Further, at this time, the ratio of the O-component in the SiOCN layer, namely the oxygen concentration can be finely adjusted by controlling the processing conditions such as the pressure in the processing chamber 201 and the gas supply time. Thus the composition ratio of the SiOCN layer can be more strictly controlled.

In addition, at this time, the oxidizing reaction of the SiCN layer is preferably not to be saturated. Namely, a part of the SiCN layer is preferably not to be oxidized. In this case, oxidation is performed under a condition that the oxidizing reaction of the SiCN layer is unsaturated, so that the entire body of the SiCN layer is not oxidized. Note that in order to set the oxidizing reaction of the SiCN layer in the unsaturated state, the processing conditions in step 4 may be the same as the processing conditions in the step 4 of the sixth sequence (step 3 of the third sequence).

The above-described steps 1 to 4 are set as 1 cycle, and this cycle is performed one or more times (prescribed number of times), to thereby form the silicon oxycarbonitride film (SiOCN film) having a prescribed composition and a prescribed film thickness on the wafer 200. Note that the aforementioned cycle is preferably repeated multiple number of times.

When the film formation processing of forming the SiOCN film having a prescribed composition and a prescribed film thickness is performed, the gas purge, inert gas substitution, return to the atmosphere, boat unloading, and wafer discharge, are performed similarly to the first sequence.

(Ninth Sequence)

A ninth sequence of this embodiment will be described next.

Figure 11:
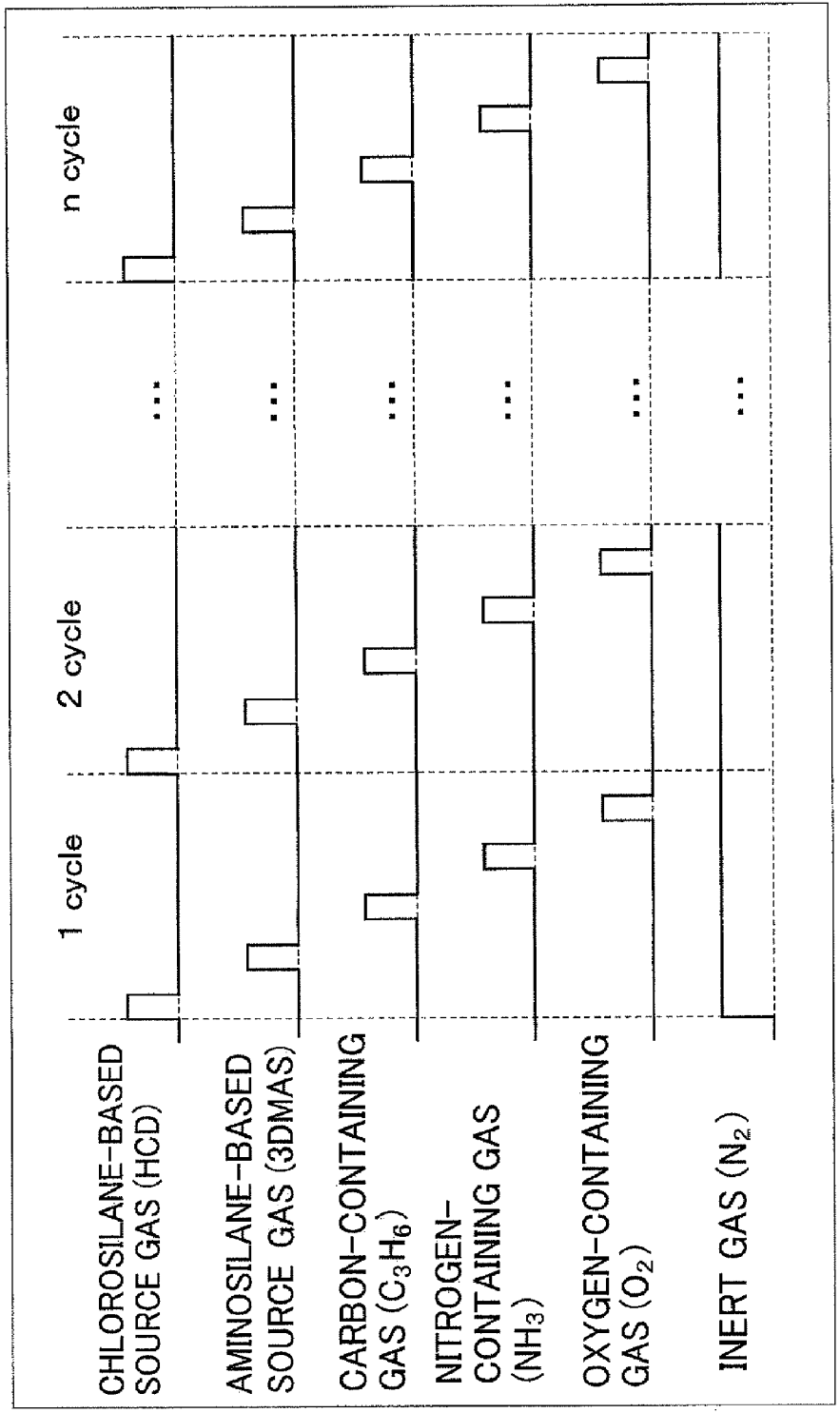
FIG. 11 is a view showing a timing of gas supply in a ninth sequence of this embodiment.

FIG. 11 is a view of the timing of the gas supply in the ninth sequence of this embodiment.

In the ninth sequence of this embodiment, a silicon oxycarbonitride film having a prescribed composition and a prescribed film thickness is formed on the wafer 200 by performing the following steps alternately prescribed number of times:

supplying the chlorosilane-based source to the wafer 200 in the processing chamber 201, and thereafter supplying the aminosilane-based source thereto, to form the first layer containing silicon, nitrogen, and carbon on the wafer 200; and supplying the thermally activated carbon-containing gas to the wafer 200 in the processing chamber 201, and thereafter supplying the thermally activated nitrogen-containing gas thereto as reactive gases, and thereafter supplying the thermally activated oxygen-containing gas as the reactive gas, to modify the first layer and form the silicon oxycarbonitride layer as the second layer.

Note that in forming the second layer, the thermally activated carbon-containing gas is supplied to the wafer 200 in the processing chamber 201, to make the carbon-containing gas chemically adsorbed on the first layer, and thereafter the thermally activated nitrogen-containing gas is supplied to the wafer 200 in the processing chamber 201, to modify the layer with the carbon-containing gas chemically adsorbed on the first layer, and form the silicon carbonitride layer, and thereafter the thermally activated oxygen-containing gas is supplied to the wafer 200 in the processing chamber 201, to modify the silicon carbonitride layer and form the silicon oxycarbonitride layer.

The ninth sequence of this embodiment will be more specifically described hereafter. Here, explanation is given for a case that the HCD gas is used as the chlorosilane-based source gas, the 3DMAS gas is used as the aminosilane-based source gas, and $O_2$ gas is used as oxygen-containing gas, to form the silicon oxycarbonitride film (SiOCN film) on the substrate as the insulating film.

Processing is performed similarly to the first sequence, regarding the wafer charge, boat loading, pressure adjustment, temperature adjustment, and wafer rotation. Thereafter, four steps as will be described later are sequentially executed.

[Step 1]

Step 1 is performed similarly to the step 1 of the first sequence. Namely, the processing conditions, the reaction to be caused, and the layer to be formed, etc., in step 1 are the same as those of the step 1 of the first sequence. Namely, in this step, the silicon-containing layer is formed on the wafer 200 by supplying the HCD gas into the processing chamber 201.

[Step 2]

Step 2 is similarly performed as the step 2 of the first sequence. Namely, the processing conditions, the reaction to be caused, and the layer to be formed, etc., in step 2 are the same as those of the step 2 of the first sequence. Namely, in this step, the 3DMAS gas is supplied into the processing chamber 2 to cause a reaction between the silicon-containing layer and the 3DMAS gas, to form the first layer containing Si, N, and C.

Step 3 is similarly performed as the step 3 of the fifth sequence. Namely, the processing conditions, the reaction to be caused, and the layer to be formed, etc., in step 3 are the same as those of the step 3 of the fifth sequence. Namely, in this step, $C_3H_6$ gas is supplied into the processing chamber 201, to make $C_xH_y$ chemically adsorbed on the first layer.

Step 4 is similarly performed as the step 4 of the fifth sequence. Namely, the processing conditions, the reaction to be caused, and the layer to be formed, etc., in step 4 are the same as those of the step 4 of the fifth sequence. Namely, in this step, the $NH_3$ gas is supplied into the processing chamber 201, so that the layer with $C_xH_y$ chemically adsorbed on the first layer, is modified to the SiCN layer. [Step 5]

Step 5 is similarly performed as the step 4 of the eighth sequence. Namely, the processing conditions, the reaction to be caused, and the layer to be formed, etc., in step 5 are the same as those of the step 4 of the eighth sequence. Namely, in this step, the $O_2$ gas is supplied into the processing chamber 201, to modify the SiCN layer and form the second layer including the SiOCN layer.

The aforementioned steps 1 to 5 are set as 1 cycle, and by performing this cycle one or more number of times (prescribe number of times), the silicon oxycarbonitride film (SiOCN film) having a prescribed composition and a prescribed film thickness can be formed on the wafer 200. Note that the aforementioned cycle is preferably repeated multiple number of times.

When the film formation processing of forming the SiOCN film having a prescribed composition and a prescribed film thickness is performed, gas purge, inert gas substitution, return to the atmosphere, boat unloading, and wafer discharge, are performed similarly to the first sequence.

(Tenth Sequence)

A tenth sequence of this embodiment will be described next.

Figure 12:
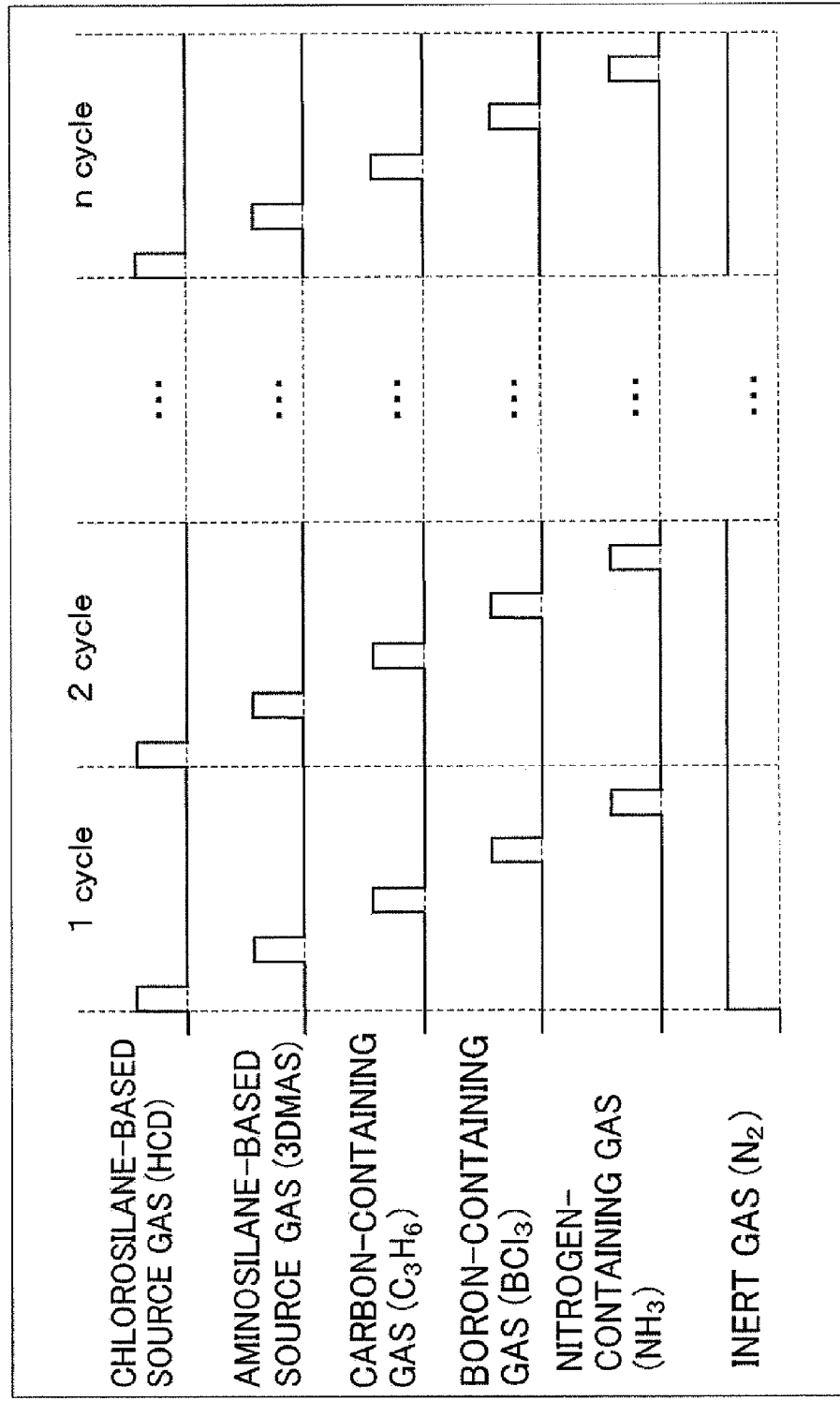
FIG. 12 is a view showing a timing of gas supply in a tenth sequence of this embodiment.

FIG. 12 is a view of the timing of the gas supply in the tenth sequence of this embodiment.

In the tenth sequence of this embodiment, the silicon boron carbonitride film having a prescribed composition and a prescribed film thickness, is formed on the wafer 200 by alternately performing the following steps prescribed number of times:

supplying the chlorosilane-based source to the wafer 200 in the processing chamber 201, and thereafter supplying the aminosilane-based source thereto, to form the first layer containing silicon, nitrogen, and carbon on the wafer 200; and supplying the thermally activated carbon-containing gas to the wafer 200 in the processing chamber 201 as the reactive gas, and thereafter supplying the boron-containing gas thereto as the reactive gas, and thereafter supplying the thermally activated nitrogen-containing gas thereto as the reactive gas, to modify the first layer and form the silicon boron carbonitride layer.

Note that in forming the second layer, the thermally activated carbon-containing gas is supplied to the wafer 200 in the processing chamber 201, to make the carbon-containing gas chemically adsorbed on the first layer, and thereafter the thermally activated boron-containing gas is supplied to the wafer 200 in the processing chamber 201, to make the boron-containing gas further chemically adsorbed on the layer with the carbon-containing gas chemically adsorbed on the first layer, and thereafter the thermally activated nitrogen-containing gas is supplied to the wafer 200 in the processing chamber 201, to modify the layer with the carbon-containing gas and the boron-containing gas chemically adsorbed on the first layer, and form the silicon boron carbonitride layer.

The tenth sequence of this embodiment will be more specifically described hereafter. Here, explanation is given for a case that the HCD gas is used as the chlorosilane-based source gas, the 3DMAS gas is used as the aminosilane-based source gas, the $C_3H_6$ gas is used as carbon-containing gas, the $BCl_3$ gas is used as the boron-containing gas, and the $NH_3$ gas is used as the nitrogen-containing gas, to form the silicon boron carbonitride film (SiBCN film) on the substrate as the insulating film.

The wafer charge, boat loading, pressure adjustment, temperature adjustment, and wafer rotation are similarly performed as the first sequence. Thereafter, four steps as will be described later are sequentially executed.

Step 1 is performed similarly to the step 1 of the first sequence. Namely, the processing conditions, the reaction to be caused, and the layer to be formed, etc., in step 1 are the same as those of the step 1 of the first sequence. Namely, in this step, the silicon-containing layer is formed on the wafer 200 by supplying the HCD gas into the processing chamber 201.

[Step 2]

Step 2 is performed similarly to the step 2 of the first sequence. Namely, the processing conditions, the reaction to be caused, and the layer to be formed, etc., in step 2 are the same as those of the step 2 of the first sequence. Namely, in this step, the 3DMAS gas is supplied into the processing chamber 201, to cause a reaction between the silicon-containing layer and the 3DMAS gas, and form the first layer containing Si, N, and C.

Step 3 is performed similarly to the step 3 of the fifth sequence. Namely, the processing conditions, the reaction to be caused, and the layer to be formed, etc., in step 3 are the same as those of the step 3 of the fifth sequence. Namely, in this step, the $C_3H_6$ gas is supplied into the processing chamber 201, to make the $C_xH_y$ chemically adsorbed on the first layer.

[Step 4]

Step 4 is performed similarly to the step 3 of the seventh sequence. Namely, the processing conditions, the reaction to be caused, and the layer to be formed, etc., in step 4 are the same as those of the step 3 of the seventh sequence. Namely, in this step, the $BCl_3$ gas is supplied into the processing chamber 201, to make the $B_xCl_y$ chemically adsorbed on the layer with $C_xH_y$ chemically adsorbed on the first layer.

[Step 5]

Step 5 is performed similarly to the step 4 of the seventh sequence. Namely, the processing conditions, the reaction to be caused, and the layer to be formed, etc., in step 4 are the same as those of the step 4 of the seventh sequence. Namely, in this step, the $NH_3$ gas is supplied into the processing chamber 201, to modify the layer with $C_xH_y$ and $B_xCl_y$ chemically adsorbed on the first layer, and form the second layer including the SiBCN layer.

The aforementioned steps 1 to 5 are set as 1 cycle, and by performing this cycle one or more number of times (prescribe number of times), the silicon boron carbonitride film (SiBCN film) having a prescribed composition and a prescribed film thickness can be formed on the wafer 200. Note that the aforementioned cycle is preferably repeated multiple number of times.

When the film formation processing of forming the SiBCN film having a prescribed composition and a prescribed film thickness is performed, the gas purge, inert gas substitution, return to the atmosphere, boat unloading, and wafer discharge, are performed similarly to the first sequence.

According to this embodiment, when the insulating film is formed using the chlorosilane-based source and the aminosilane-based source, the silicon insulating film having a desired composition with high silicon density can be formed in a low temperature region. Further, an ideal stoichiometric silicon insulating film can be formed. Note that according to the inventors of the present invention, it is difficult to deposit silicon on the wafer at a film formation rate of satisfying a production efficiency in a temperature zone of 550° C. or less. Moreover, when the aminosilane-based source is used alone, deposition of the silicon on the wafer cannot be confirmed in the temperature zone of 550° C. or less. However, according to the technique of this embodiment, an excellent silicon insulating film can be formed at the film formation rate of satisfying the production efficiency, even in the low temperature zone of 550° C. or less.

Note that when the film formation temperature is lowered, usually, kinetic energy of a molecule is also lowered, thus hardly causing the reaction and desorption of chlorine included in the chlorosilane-based source and amine included in the aminosilane-based source, and ligands of them are remained on the surface of the wafer. Then, such residual ligands inhibit the adsorption of the silicon on the surface of the wafer as a steric hindrance, thus lowering the silicon density and causing deterioration of the film. However, even under a condition that hardly allowing such a reaction/desorption to occur, the residual ligands can be desorbed by properly causing the reaction between two silane sources, namely between the chlorosilane-based source and the aminosilane-based source. Then, the steric hindrance is resolved by the desorption of the residual ligands, and the silicon can be adsorbed on a site which is opened by the resolution of the steric hindrance, and the silicon density can be increased. Thus, it can be considered that the film with high silicon density can be formed even in the low temperature zone of 550° C. or less.

Further, according to this embodiment, the chlorosilane-based source is supplied, and thereafter the aminosilane-based source is supplied, to form the first layer containing Si, N, and C, namely the silicon insulating layer on the wafer, and thereafter the thermally activated or plasma activated nitrogen-containing gas, carbon-containing gas, oxygen-containing gas, or boron-containing gas is supplied to the substrate. Therefore, the nitrogen concentration, carbon concentration, oxygen concentration, or boron concentration of the silicon insulating layer can be adjusted. Thus, the silicon insulating film having a desired characteristic can be formed by controlling the composition ratio.

Further, by using the silicon insulating film formed by the technique of this embodiment as a side wall spacer, a device formation technique with low leak current and having excellent processability can be provided.

Further, by using the silicon insulating film formed by the technique of this embodiment as an etch stopper, the device formation technique with excellent processability can be provided.

According to this embodiment, an ideal stoichiometric silicon insulating film can be formed without using plasma even in the low temperature zone. Further, since the silicon insulating film can be formed without using plasma, this embodiment can be applied to a process in which there is a risk of plasma damage, such as a SADP film of DPT.

Note that in the above-described embodiment, explanation is given for a case that when the first layer containing Si, N, and C is formed in each sequence, the chlorosilane-based source is supplied to the wafer 200 in the processing chamber 201, and thereafter the aminosilane-based source is supplied to the substrate. However, the sources may be reversely flowed. Namely, the aminosilane-based source is supplied and thereafter the chlorosilane-based source may be supplied. Specifically, one of the chlorosilane-based source and the aminosilane-based source is supplied, and thereafter the other source may be supplied. Thus, by changing an order of flowing the sources, the film quality and the composition ratio of the thin film formed in each sequence can be changed.

Further, by changing not only the order of flowing the chlorosilane-based source and the aminosilane-based source, but also the order in the flow of all gases including the chlorosilane-based source and the aminosilane-based source, the film quality and the composition ratio of the thin film formed in each sequence can be changed.

Further, in the aforementioned embodiment, explanation is given for a case that when the first layer containing Si, N, and C is formed in each sequence, the chlorosilane-based source and the aminosilane-based source are used. However, the silane source having a halogen-based ligand other than the chlorosilane-based source may also be used. For example, a fluorosilane source can also be used instead of the chlorosilane-based source. Here, the fluorosilane source is the silane source having a fluoro group, which is a source containing at least silicon (Si) and fluorine (F). Silicon fluoride gas such as silicon tetrafluoride ($SiF_4$) gas and disilicon hexafluoride ($Si_2F_6$) gas can be used as the fluorosilane source. In this case, when the first layer containing Si, N, and C is formed in each sequence, the fluorosilane source is supplied to the wafer 200 in the processing chamber 201, and thereafter the aminosilane-based source is supplied, or the aminosilane-based source is supplied and thereafter the fluorosilane source is supplied.

Further, in the above-described embodiment, explanation is given for a case that plasma is used in step 3 of the first sequence and in step 3 of the third sequence. However, plasma may also be used in each step of other sequence. For example, in each step of each sequence, it is also acceptable that the nitrogen-containing gas, the carbon-containing gas, the oxygen-containing gas, and the boron-containing gas are plasma-activated, to modify each layer by plasma-nitriding (nitrogen dope), plasma carbonization (carbon dope), plasma oxidation (oxygen dope), and plasma boronizing (boron dope). However, use of plasma is not suitable for the process in which there is a risk of plasma damage, and is preferably applied to other process in which there is no risk of plasma damage.

Further, in the step of supplying the oxygen-containing gas, the hydrogen-containing gas may be supplied together with the oxygen-containing gas. When the oxygen-containing gas and the hydrogen-containing gas are supplied into the processing chamber 201 which is under atmosphere of a pressure of less than the air atmosphere (reduced pressure), the oxygen-containing gas and the hydrogen-containing gas are reacted in the processing chamber 201, to generate oxidizing species (atomic oxygen, etc.) containing oxygen, and each layer can be oxidized by this oxidizing species. In this case, each layer can be oxidized by a higher oxidizing power than that of a case that the oxygen-containing gas alone is used for oxidation. The oxidation treatment is performed under a reduced atmosphere by non-plasma. Hydrogen ($H_2$) can be used for example, as the hydrogen-containing gas.

Further, in the above-described embodiment, explanation is given for a case that when the first layer containing Si, N, and C is formed in each sequence, the chlorosilane-based source is supplied to the wafer 200 in the processing chamber 201, and thereafter the aminosilane-based source is supplied. However, as shown in FIG. 13 and FIG. 14, it is also acceptable that the chlorosilane-based source and the aminosilane-based source are simultaneously supplied to the wafer 200 in the processing chamber 201, to cause the CVD reaction.

Figure 13:
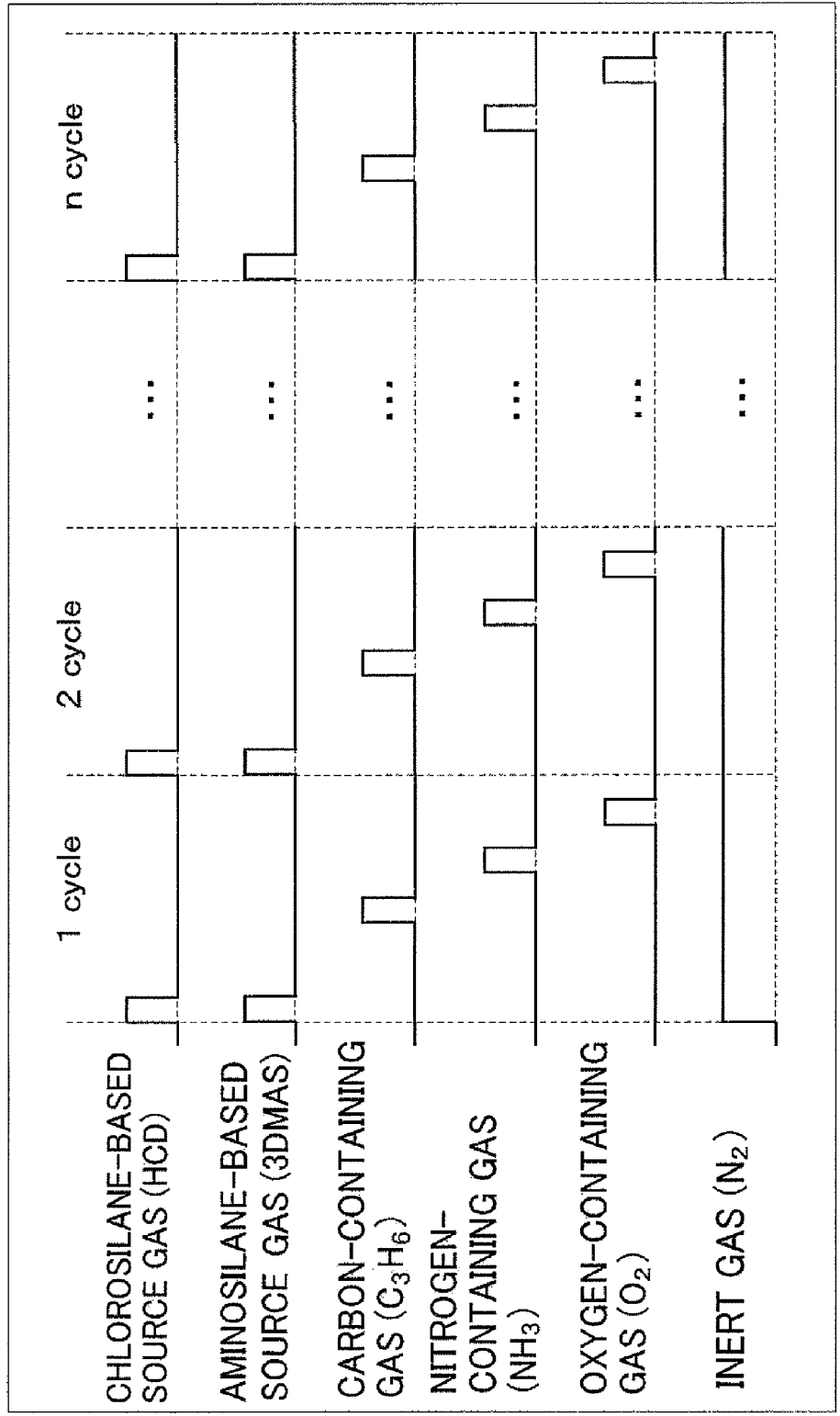
FIG. 13 is a view showing a timing of gas supply in other embodiment.
Figure 14:
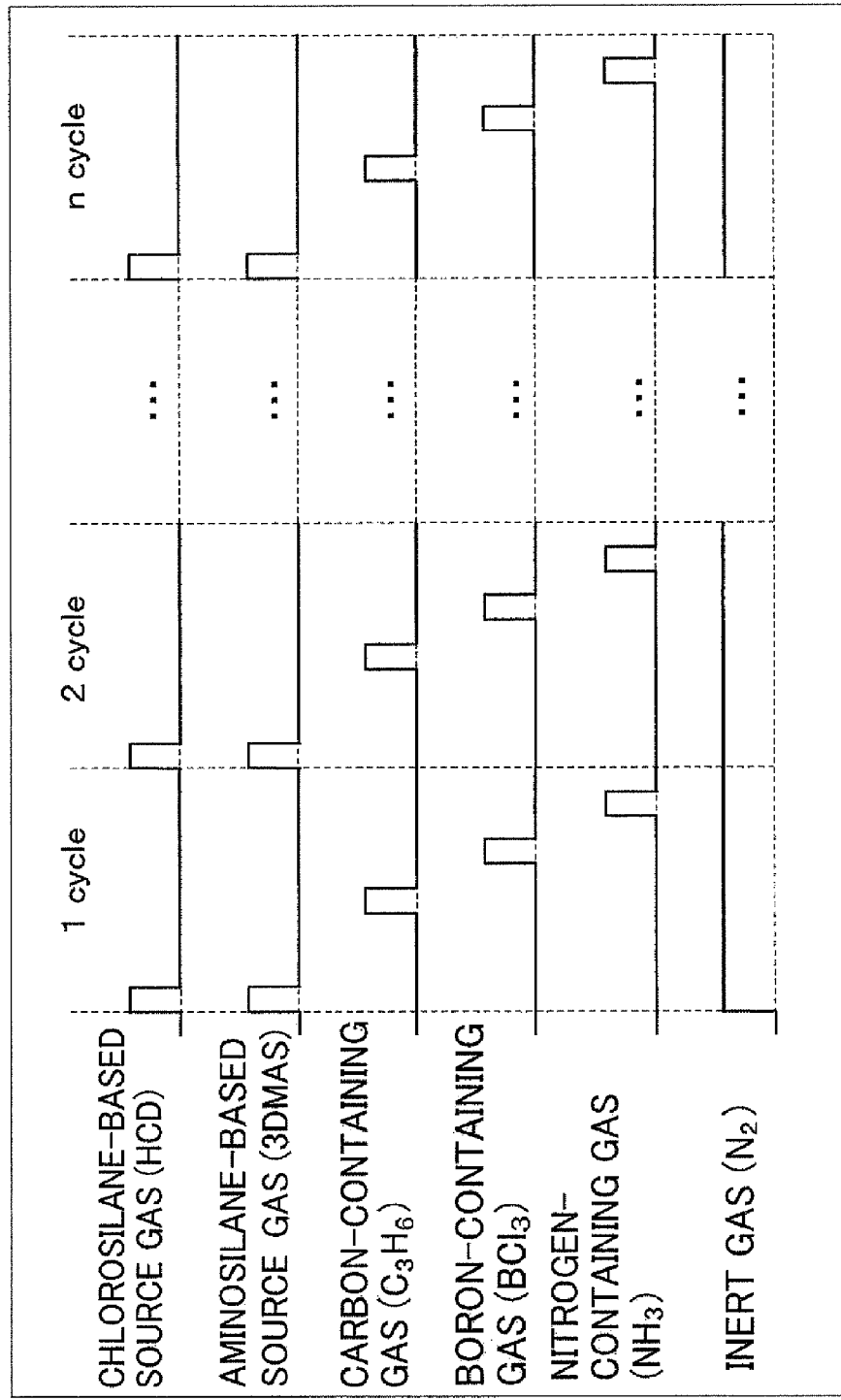
FIG. 14 is a view showing a timing of gas supply in other embodiment.

FIG. 13 and FIG. 14 are views of the timing of the gas supply according to other embodiment of the present invention, in which the chlorosilane-based source and the aminosilane-based source are simultaneously supplied. Note that the processing conditions in this case may be similar processing conditions as those of each sequence of the aforementioned embodiment.

The sequence of FIG. 13 shows an example of forming the silicon oxycarbonitride film (SiOCN film) having a prescribed composition and a prescribed film thickness by alternately performing the following steps prescribed number of times:

the step of simultaneously supplying the chlorosilane-based source (HCD) and the aminosilane-based source (3DMAS) to the wafer 200 in the processing chamber 201, to form the first layer containing silicon, nitrogen, and carbon on the wafer 200; and the step of supplying the thermally activated carbon-containing gas ($C_3H_6$) to the wafer 200 in the processing chamber 201 as the reactive gas, and thereafter supplying the thermally activated nitrogen-containing gas ($NH_3$) as the reactive gas, and thereafter the thermally activated oxygen-containing gas ($O_2$) as the reactive gas, to modify the first layer and form the silicon oxycarbonitride layer (SiOCN layer) as the second layer.

Note that in forming the second layer, the thermally activated carbon-containing gas is supplied to the wafer 200 in the processing chamber 201, to make the carbon-containing gas chemically adsorbed on the first layer, and thereafter the thermally activated nitrogen-containing gas is supplied to the wafer 200 in the processing chamber 201, to modify the layer with the carbon-containing gas chemically adsorbed on the first layer, and thereafter the thermally activated oxygen-containing gas is supplied to the wafer 200 in the processing chamber 201, to modify the silicon carbonitride layer and form the silicon oxycarbonitride layer.

The sequence of FIG. 14 shows an example of forming the silicon boron carbonitride film (SiBCN) film having a prescribed composition and a prescribed film thickness by performing the following steps prescribed number of times:

the step of simultaneously supplying the chlorosilane-based source (HCD) and the aminosilane-based source (3DMAS) to the wafer 200 in the processing chamber 201, to form the first layer containing silicon, nitrogen, and carbon on the wafer 200; and the step of supplying the thermally activated carbon-containing gas ($C_3H_6$) to the wafer 200 in the processing chamber 201 as the reactive gas, and thereafter supplying the thermally activated boron-containing gas ($BCl_3$) as the reactive gas, and thereafter supplying the thermally activated nitrogen-containing gas (NH$_3$) as the reactive gas, to modify the first layer and form the silicon boron carbonitride layer (SiBCN layer) as the second layer.

In forming the second layer, the thermally activated carbon-containing gas is supplied to the wafer 200 in the processing chamber 201 to make the carbon-containing gas chemically adsorbed on the first layer, and thereafter the thermally activated boron-containing gas is supplied to the wafer 200 in the processing chamber 201, to make the boron-containing gas further chemically adsorbed on the layer with the carbon-containing gas chemically adsorbed on the first layer, and thereafter the thermally activated nitrogen-containing gas is supplied to the wafer 200 in the processing chamber 201, to modify the layer with the carbon-containing gas and the boron-containing gas chemically adsorbed on the first layer, to form the silicon boron carbonitride layer.

Thus, the chlorosilane-based source and the aminosilane-based source are not sequentially supplied to the wafer 200 in the processing chamber 201, but simultaneously supplied thereto. Even in such a case, a similar operation and effect as that of the aforementioned embodiment can be obtained. However, as is shown in the aforementioned embodiment, in a case of a sequential supply of each source, namely in a case of alternately supplying the chlorosilane-based source and the aminosilane-based source, with purging in the processing chamber 201 interposed between them, the chlorosilane-based source and the aminosilane-based source can be properly reacted under a condition of a predominant surface reaction, and controllability of controlling the film thickness can be increased.

Incidentally, in a case of a conventional CVD method, a plurality of kinds of gases including a plurality of elements that constitute the thin film are simultaneously supplied. In this case, in order to control the composition ratio of the thin film to be formed, control of a flow rate ratio of the gas supply for supplying gas can be taken into consideration for example. In this case, even if controlling supply conditions such as a substrate temperature, a pressure in the processing chamber, and gas supply time during gas supply, the composition ratio of the formed thin film cannot be controlled.

Further, in a case of an ALD method, a plurality of kinds of gases containing a plurality of elements that constitute the formed thin film, are alternately supplied. In this case, in order to control the composition ratio of the formed thin film, for example control of the gas supply flow rate and the gas supply time during supply of each gas can be considered. Note that in the case of the ALD method, the source gas is supplied for the purpose of the adsorption and saturation of the source gas on the surface of the substrate, and therefore pressure control in the processing chamber is not required. Namely, the adsorption and saturation of the source gas is generated under a prescribed pressure or less that allows the adsorption of the source gas to occur at a reaction temperature. Then, the adsorption and saturation of the source gas can be realized at any pressure value, provided that the pressure in the processing chamber is set to a prescribed pressure or less. Therefore, usually when the film formation is performed by the ALD method, the pressure in the processing chamber is determined depending on an exhaustion capability of the substrate processing apparatus, with respect to the gas supply amount. When the pressure in the processing chamber is varied, chemical adsorption of the source gas on the surface of the substrate is probably inhibited, or the reaction in this case is probably almost a CVD reaction, thus making it impossible to properly perform the film formation by the ALD method. Further, in order to form the thin film having a prescribed film thickness by the ALD method, the ALD reaction (adsorption and saturation, surface reaction) is repeatedly performed, and therefore deposition is insufficient unless each ALD reaction is sufficiently performed until each ALD reaction is saturated. In this case, probably a sufficient deposition rate cannot be obtained. Therefore, in the case of the ALD method, the composition ratio of the thin film is probably not controlled by controlling the pressure in the processing chamber.

Meanwhile, in this embodiment, in any one of the sequence, the composition ratio of the thin film is controlled (finely adjusted) by controlling the pressure in the processing chamber and the gas supply time in each step. More preferably, the composition ratio of the thin film is controlled by controlling the pressure in the processing chamber, or controlling the pressure and the gas supply time.

When the composition ratio of the thin film is controlled by controlling the pressure in the processing chamber in each step, an influence of a difference in machines in different substrate processing apparatuses can be reduced. Namely, the composition ratio of the thin film can be similarly controlled by similar control even in different substrate processing apparatuses. In this case, by controlling the gas supply time in each step, the composition ratio of the thin film can be finely adjusted, and the controllability of controlling the gas supply time can be increased. In addition, by controlling the pressure in the processing chamber, the composition ratio can be controlled while increasing the film formation rate. Namely, by controlling the pressure in the processing chamber, the composition ratio of the thin film can be controlled while increasing the growth rate of the silicon-containing layer formed in step 1 of each sequence for example. Thus, according to this embodiment, the composition ratio of the thin film can be similarly controlled by similar control, and also the controllability of controlling the composition ratio of the thin film can be increased, and further the film formation rate, namely productivity can be improved.

Meanwhile, for example in the film formation by the ALD method, when the composition ratio of the thin film is controlled by controlling the gas supply flow rate and the gas supply time in each step, the influence of the difference in machines in different substrate processing apparatuses is large. Namely, the composition ratio of the tin film cannot be similarly controlled even if similar control is performed in the different substrate processing apparatuses. For example, even if the gas supply flow rate and the gas supply time are set to the same flow rate value and time in different substrate processing apparatuses, the pressure in the processing chamber is not the same pressure value due to the difference in machines. Therefore, in this case, the pressure in the processing chamber is varied in each substrate processing apparatus, and a desired control of the composition ratio cannot be similarly performed in the different substrate processing apparatuses. Further, the pressure in the processing chamber is varied in each substrate processing apparatus, and therefore chemical adsorption of the source gas on the surface of the substrate is probably inhibited, or the reaction in this case is probably almost a CVD reaction, thus making it impossible to properly perform the film formation by the ALD method.

EXAMPLES

Example 1

Based on the first sequence in the above-described embodiment, the SiCN film was formed on the wafer, and the film formation rate and a refractive index of the film (R.I.) were measured. Note that in this embodiment, the HCD gas was used as the chlorosilane-based source gas, and the 3DMAS gas was used as the aminosilane-based source gas, and the NH₃ gas was used as the nitrogen-containing gas, and the SiCN film was formed by non-plasma based on the sequence of FIG. 3(a). The processing conditions in each step at this time were set as follows.

(Step 1)
Temperature in the processing chamber: 550° C.
Pressure in the processing chamber: 266 Pa (2 Torr)
HCD gas supply flow rate: 200 sccm
HCD gas irradiation time: 12 seconds (Step 2)
Temperature in the processing chamber: 550° C.
Pressure in the processing chamber: 266 Pa (2 Torr)
3DMAS gas supply flow rate: 200 sccm
NH₃ gas irradiation time: 12 seconds (Step 3)
Temperature in the processing chamber: 550° C.
Pressure in the processing chamber: 831 Pa (6.5 Torr)
NH₃ gas supply flow rate: 5000 sccm
NH₃ gas irradiation time: 12 seconds As a result, the film formation rate of the SiCN film formed in this example was 1.8 Å/cycle, and the refractive index of the film (R.I.) was 2.10. Namely, it was found that an excellent silicon insulating film could be formed at a film formation rate satisfying the production efficiency in the low temperature zone of 550° C.

Example 2

The SiCN film was formed on the wafer based on the first sequence in the above-described embodiment, and the film formation rate and uniformity of the film thickness in-plane of the wafer, and the refractive index (R.I.) were measured. Further, XPS spectrum of the SiCN film was measured, and C—Si ratio of the C-component with respect to Si-component) and N/Si ratio (ratio of the N-component with respect to the Si-component) were measured. Moreover, step 1 and step 2 of the first sequence were alternately repeated, to form a substance containing Si, C, and N (called simply SiCN). Then, the XPS spectrum was measured, and the C/Si ratio and the N/Si ratio were calculated. Note that in this example, the HCD gas was used as the chlorosilane-based source gas, and the 3DMAS gas was used as the aminosilane-based source gas, and the NH₃ gas was used as the nitrogen-containing gas. Then, based on the sequence of FIG. 3(a), the SiCN film was formed by non-plasma. Further, in a comparative example, the HCD gas was used as the chlorosilane-based source gas, and the 3DMAS gas was used as the aminosilane-based source gas, to form SiCN based on the sequence in which step 1 and step 2 of the sequence of FIG. 3(a) are alternately repeated. The processing conditions in each step at this time were set as follows.

(Step 1)
Temperature in the processing chamber: 550° C.
Pressure in the processing chamber: 399 Pa (3 Torr)
HCD gas supply flow rate: 100 sccm
HCD gas irradiation time: 12 seconds (Step 2)
Temperature in the processing chamber: 550° C.
Pressure in the processing chamber: 10 Pa (1333 Torr)
3DMAS gas supply flow rate: 100 sccm
NH₃ gas irradiation time: 6 seconds (Step 3)
Temperature in the processing chamber: 550° C.
Pressure in the processing chamber: 865 Pa (6.5 Torr)
NH₃ gas supply flow rate: 4500 sccm
NH₃ gas irradiation time: 24 seconds As a result, the film formation rate of the SiCN film formed in this example was 4.15 Å/cycle, the uniformity in the film thickness in-plane of the wafer was 0.3%, and the refractive index (R.I.) was 2.40. Namely, it was found that an excellent silicon insulating film could be formed at a film formation rate satisfying the production efficiency in the low temperature zone of 550° C.

Figure 15:
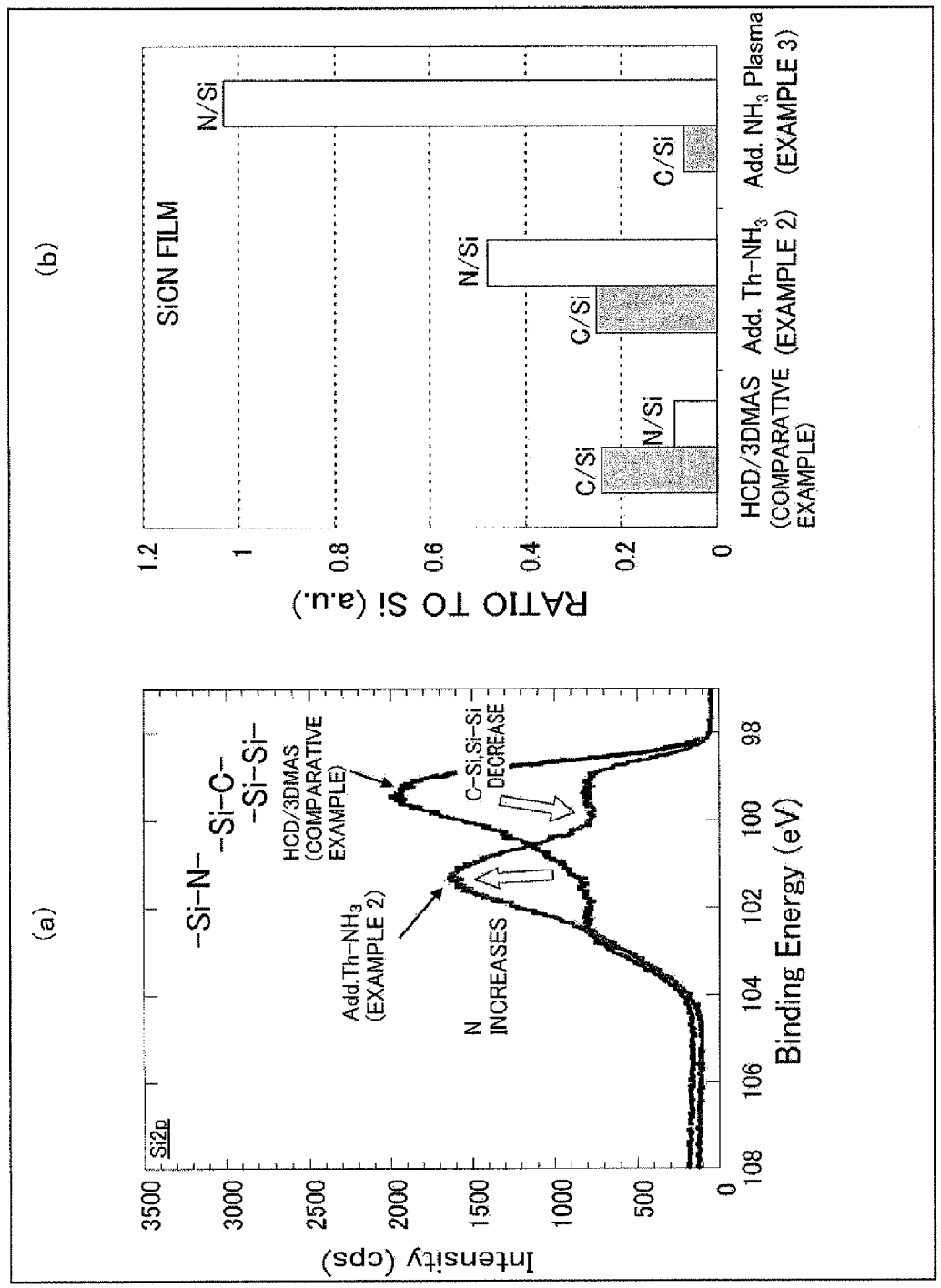
FIG. 15 (a) is a graph chart showing a measurement result of XPS spectrum according to example 2 of the present invention, and (b) is a graph chart showing a measurement result of C/Si ratio and N/Si ratio according to example 2 of the present invention.

Further as shown in FIG. 15, in the SiCN film formed in this example, it was found that the ratio of the N-component was increased, and the ratio of the C-component and the ratio of the Si-component were reduced, and the N-concentration was higher than the C-concentration.

FIG. 15(a) is a graph chart showing a measurement result of the XPS spectrum according to this example, wherein binding energy (eV) is taken on the horizontal axis, and intensity (count/sec) of a photoelectron is taken on the vertical axis respectively. Further, FIG. 15 (b) is a graph chart showing the measurement result of the C—Si ratio and the N/Si ratio according to this example, wherein the ratio of the C-component and the N-component with respect to the Si component (arbitrary unit (a.u.)) is taken on the vertical axis. In each figure, "Add. Th—NH₃" shows the measurement result of the SiCN film formed in this example, and "HCD/3DMAS" shows the measurement result of the SiCN formed in the comparative example. In addition, FIG. 15(b) shows the measurement result of example 3 ("Add. NH₃ Plasma") as will be described later, for comparison.

As shown in FIG. 15(a), it is found that the SiCN formed in the comparative example is set in C-rich and Si-rich state in which Si—C bond and Si—Si bond are increased. Meanwhile, in the SiCN film formed in this example, it is found that Si—N bond is increased, and meanwhile Si—C bond and Si—Si bond are reduced in N-rich state, compared with the SiCN formed in the comparative example. Further, as shown in FIG. 15(b), in the SiCN formed in the comparative example, it is found that C/Si ratio is larger than N/Si ratio, and the C-concentration is higher than the N-concentration. Meanwhile, it is found that in the SiCN film formed in this example, N/Si ratio is larger than C/Si ratio, and the N-concentration is higher than the C-concentration. Namely, it is found that in the SiCN film formed in this example, by a thermal nitriding action of the NH₃ in step 3, the ratio of the N-component is increased, and the ratio of the C-component and the ratio of the Si-component are reduced, and further the N-concentration is higher than the C-concentration.

Example 3

Based on the first sequence of the above-described embodiment, the SiN film is formed on the wafer, and the film formation rate, the uniformity of the film thickness in-plane of the wafer, and the refractive index (R.I.) were measured. Further, in the comparative example, step 1 and step 2 of the first sequence were alternately repeated to form the SiCN, and the XPS spectrum was measured, and also the C/Si ratio and the N/Si ratio were calculated. In this example, the HCD gas was used as the chlorosilane-based source gas, and the 3DMAS gas was used as the aminosilane-based source gas, and the NH₃ gas was used as the nitrogen-containing gas, to form the SiN film using plasma based on the sequence of FIG. 3(b). Meanwhile, in the comparative example, the HCD gas was used as the chlorosilane-based source gas, and the 3DMAS gas was used as the aminosilane-based source gas, to form the SiCN based on the sequence in which step 1 and step 2 of the sequence of FIG. 3 (a) were alternately repeated. The processing conditions in each step at this time were set as follows.

(Step 1)
Temperature in the processing chamber: 550° C.
Pressure in the processing chamber: 399 Pa (3 Torr)
HCD gas supply flow rate: 200 sccm
HCD gas irradiation time: 12 seconds
(Step 2)
Temperature in the processing chamber: 550° C.
Pressure in the processing chamber: 10 Pa (1333 Torr)
3DMAS gas supply flow rate: 200 sccm
$NH_3$ gas irradiation time: 6 seconds
(Step 3)
Temperature in the processing chamber: 550° C.
Pressure in the processing chamber: 30 Pa (3999 Torr)
$NH_3$ gas supply flow rate: 4500 sccm
$NH_3$ gas irradiation time: 24 seconds
RF power: 300 W As a result, the film formation rate of the SiN film formed in this example was 4.0 Å/cycle, and the uniformity of the film thickness in-plane of the wafer was 1.7%, and the refractive index of the film (R.I.) was 1.93. Namely, it was found that an excellent silicon insulating film could be formed at a film formation rate satisfying the production efficiency in the low temperature zone of 550° C.

Figure 16:
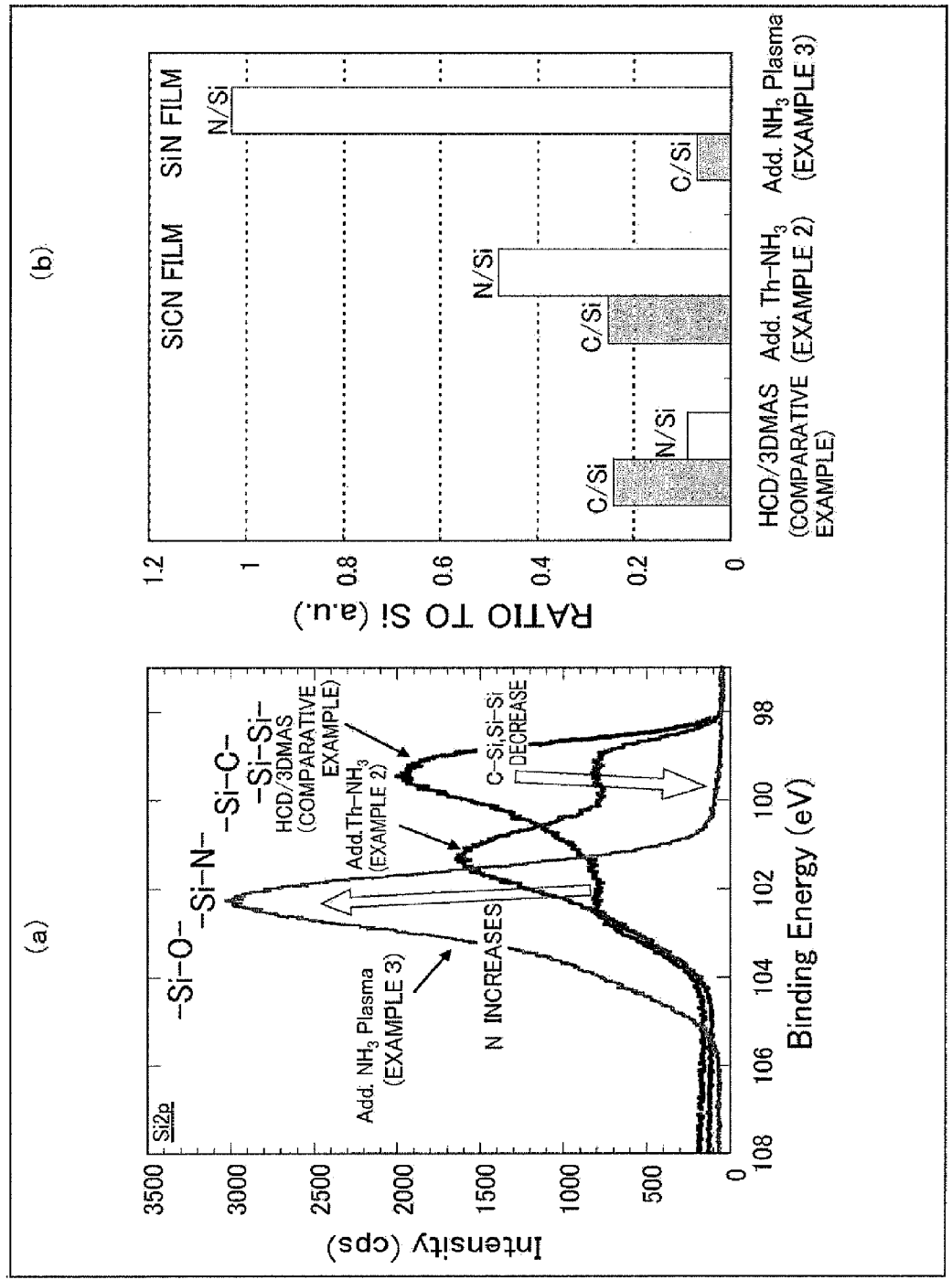
FIG. 16(a) is a graph chart showing a measurement result of XPS spectrum according to example 3 of the present invention, and (b) is a graph chart showing a measurement result of C/Si ratio and N/Si ratio according to example 3 of the present invention.

Further, as shown in FIG. 16, in the SiN film formed in this example, it was found that the ratio of the N-component was remarkably increased, and the ratio of the Si-component was reduced, and further the ratio of the C-component was reduced to an impurity level.

FIG. 16(a) is a graph chart showing the measurement result of the XPS spectrum according to this example, wherein the binding energy (eV) is taken on the horizontal axis, and the intensity of the photoelectron (count/sec) is taken on the vertical axis respectively. Further, FIG. 16(b) is a graph chart showing the measurement result of the C/Si ratio and the N/Si ratio according to this example, wherein the ratio of the C-component and the N-component with respect to the Si-component (arbitrary unit (a.u.)) is taken on the vertical axis. In each figure, "Add. $NH_3$ Plasma" shows the measurement result of the SiN film formed in this example, and "HCD/3DMAS" shows the measurement result of the SiCN formed in the comparative example. In addition, FIG. 16(a) shows the measurement result of the aforementioned example 2 ("Add. Th—$NH_3$"), for comparison.

As shown in FIG. 16(a), it is found that the SiCN formed in the comparative example is set in C-rich and Si-rich state in which Si—C bond and Si—Si bond are increased. Meanwhile, in the SiN film formed in this example, it is found that Si—N bond is increased, and meanwhile Si—C bond and Si—Si bond are remarkably reduced and particularly Si—C bond is reduced to the impurity level, compared with the SiCN formed in the comparative example. Further, as shown in FIG. 16(b), in the SiCN formed in the comparative example, it is found that C/Si ratio is larger than N/Si ratio, and the C-concentration is higher than the N-concentration. Meanwhile, it is found that in the SiN film formed in this example, N/Si ratio is remarkably larger than C/Si ratio, and the N-concentration is remarkably higher than the C-concentration. Namely, it is found that in the SiN film formed in this example, by a plasma nitriding action of the $NH_3$ in step 3, the ratio of the N-component is remarkably increased, and the ratio of the Si component is reduced and further the ratio of the C-component is remarkably reduced to the impurity level.

Example 4

Based on the third sequence of the above-described embodiment, the SiOC film was formed on the wafer, and the film formation rate, the uniformity of the film thickness in-plane of the wafer, and the refractive index (R.I.) were measured. In this example, the HCD gas was used as the chlorosilane-based source gas, and the 3DMAS gas was used as the aminosilane-based source gas, and the $N_2O$ gas was used as the oxygen-containing gas, to form a SiOC film by non-plasma. The processing conditions in each step at this time were set as follows.

(Step 1)
Temperature in the processing chamber: 550° C.
Pressure in the processing chamber: 399 Pa (3 Torr)
HCD gas supply flow rate: 200 sccm
HCD gas irradiation time: 12 seconds
(Step 2)
Temperature in the processing chamber: 550° C.
Pressure in the processing chamber: 10 Pa (1333 Torr)
3DMAS gas supply flow rate: 200 sccm
$NH_3$ gas irradiation time: 6 seconds
(Step 3)
Temperature in the processing chamber: 550° C.
Pressure in the processing chamber: 10 Pa (1333 Torr)
$N_2O$ gas supply flow rate: 1000 sccm
$N_2O$ gas irradiation time: 30 seconds As a result, the film formation rate of the SiOC film formed in this example was 0.61 Å/cycle, the uniformity in the film thickness in-plane of the wafer was 1.7%, and the refractive index (R.I.) was 1.62. Namely, it was found that an excellent silicon insulating film could be formed at a film formation rate satisfying the production efficiency in the low temperature zone of 550° C.

Based on the third sequence of the above-described embodiment, the supply time of the oxygen-containing gas in step 3 was changed, to form the SiOCN film or the SiOC was on the wafer, and the O-concentration, C-concentration, and N-concentration of each film formed at this time were measured by XRF. In this example, the HCD gas was used as the chlorosilane-based source gas, and the 3DMAS gas was used as the aminosilane-based source gas, and the $N_2O$ gas was used as the oxygen-containing gas, to form the SiOCN film or the SiOC film by non-plasma based on the sequence of FIG. 5(a). The processing conditions in each step at this time were the same as the processing conditions in the aforementioned example 4. However, the $N_2O$ gas irradiation time in step 3 was varied in a range of 1 to 120 seconds.

Figure 17:
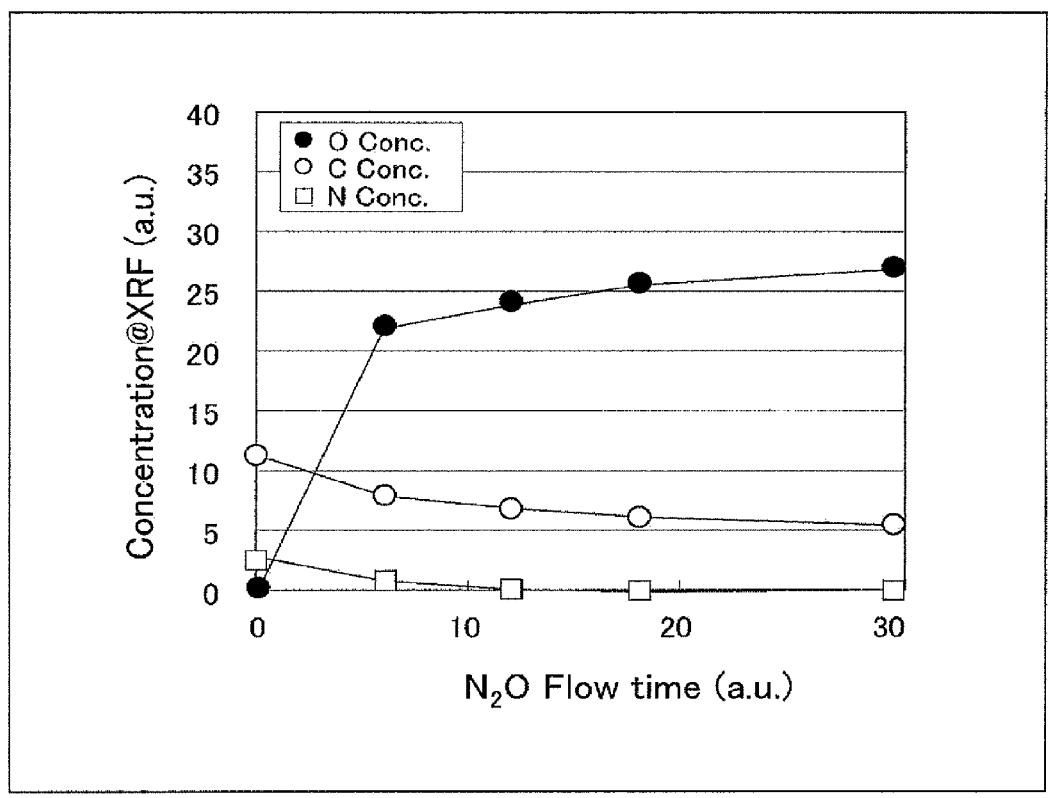
FIG. 17 is a graph chart showing a measurement result of XRF according to example 5 of the present invention.

FIG. 17 is a graph chart showing the measurement result of the XRF according to this example, wherein the supply time of the $N_2O$ gas (arbitrary unit (a.u.)) was taken on the horizontal axis, and the O-concentration, C-concentration, and N-concentration (arbitrary unit (a.u.)) are respectively taken on the vertical axis. Symbol ● in the figure indicates the O-concentration in the film, symbol ○ indicates the C-concentration in the film, and symbol □ in the figure indicates the N-concentration in the film respectively. Further, $N_2O$ flow time=zero indicates a case that the $N_2O$ gas is not supplied, namely indicates a case that SiCN is formed based on the sequence of FIG. 5(a) in which step 1 and step 2 are alternately repeated.

As shown in FIG. 17, in the case of not supplying the $N_2O$ gas (comparative example), it is found that the C-concentration is high, and C-rich SiCN is formed. It is also found that the C-concentration is higher than the N-concentration. Meanwhile, in a case of supplying the $N_2O$ gas (example), it is found that oxidation occurs by supplying the $N_2O$ gas, so that SiCN is changed to the SiOCN film. It is also found that as the supply time of the $N_2O$ gas is prolonged, the oxidation is progressed to increase the O-concentration, and the C-concentration and the N-concentration are reduced. It is found that when the supply time of the $N_2O$ gas is prolonged to some degree and oxidation is progressed to some degree, the N-component is set in the impurity level, and when the supply time of the $N_2O$ gas is further prolonged, the oxidation is further progressed to achieve substantial disappearance of the N-component, and the SiOC film is formed.

Namely, in this example, it is found that the SiOCN film is formed while increasing the ratio of the O-component, and reducing the ratio of the C-component, and further reducing the ratio of the N-component, by the thermal oxidizing action of the $N_2O$ gas in step 3. It is also found that by the thermal oxidizing action of the $N_2O$ gas in step 3, the SiOC film is formed while increasing the ratio of the O-component and reducing the ratio of the C-component, and further reducing the ratio of the N-component to the impurity level (or the N-component disappears substantially).

Preferred aspects of the present invention will be supplementarily described hereafter.

According to an aspect of the present invention, there is provided a method for manufacturing a semiconductor device, including:

forming an insulating film having a prescribed composition and a prescribed film thickness on a substrate by alternately performing following steps prescribed number of times:

supplying one of the sources of a chlorosilane-based source and an aminosilane-based source to a substrate in a processing chamber, and thereafter supplying the other source, to form a first layer containing silicon, nitrogen, and carbon on the substrate; and supplying a reactive gas different from each of the sources, to the substrate in the processing chamber, to modify the first layer and form a second layer.

Preferably, in forming the second layer, thermally or plasma activated nitrogen-containing gas is supplied to the substrate as the reactive gas, to form a silicon carbonitride layer or a silicon nitride layer as the second layer, and in forming the insulating film, a silicon carbonitride film or a silicon nitride film is formed as the insulating film.

Further preferably, in forming the second layer, thermally activated nitrogen-containing gas is supplied to the substrate as the reactive gas, to form a silicon carbonitride layer as the second layer, and in forming the insulating film, a silicon carbonitride film is formed as the insulating film.

Further preferably, in forming the second layer, plasma activated nitrogen-containing gas is supplied to the substrate as the reactive gas, to form a silicon nitride layer as the second layer, and in forming the insulating film, a silicon nitride film is formed as the insulating film.

Further preferably, in forming the second layer, thermally activated carbon-containing gas is supplied to the substrate as the reactive gas, to form a silicon carbonitride layer as the second layer, and in forming the insulating film, a silicon carbonitride film is formed as the insulating film.

Further preferably, in forming the second layer, thermally or plasma-activated oxygen-containing gas is supplied to the substrate as the reactive gas, to form a silicon oxycarbonitride layer, a silicon oxycarbide layer or a silicon oxide layer as the second layer, and in forming the insulating film, a silicon oxycarbonitride film, a silicon oxycarbide film, or a silicon oxide film is formed as the insulating film.

Further preferably, in forming the second layer, thermally activated oxygen-containing gas is supplied to the substrate as the reactive gas, to form a silicon oxycarbonitride layer or a silicon oxycarbide layer as the second layer, and in forming the insulating film, a silicon oxycarbonitride film or a silicon oxycarbide film is formed as the insulating film.

Further preferably, in forming the second layer, thermally activated oxygen-containing gas is supplied to the substrate as the reactive gas, to form a silicon oxide layer or a silicon oxycarbide layer as the second layer, and in forming the insulating film, a silicon oxide film or a silicon oxycarbide film is formed as the insulating film.

Further preferably, in forming the second layer, thermally activated boron-containing gas is supplied to the substrate as the reactive gas, to form a silicon boron carbonitride layer as the second layer, and in forming the insulating film, a silicon boron carbonitride film is formed as the insulating film.

Further preferably, in forming the second layer, thermally activated carbon-containing gas is supplied to the substrate as the reactive gas, and thereafter thermally activated nitrogen-containing gas is supplied to the substrate as the reactive gas, to form a silicon carbonitride layer as the second layer, and in forming the insulating film, a silicon carbonitride film is formed as the insulating film.

Further preferably, in forming the second layer, thermally activated carbon-containing gas is supplied to the substrate as the reactive gas, and thereafter thermally activated oxygen-containing gas is supplied to the substrate as the reactive gas, to form a silicon oxycarbonitride layer as the second layer, and in forming the insulating film, a silicon oxycarbonitride film is formed as the insulating film.

Further preferably, in forming the second layer, thermally activated boron-containing gas is supplied to the substrate as the reactive gas, and thereafter thermally activated nitrogen-containing gas is supplied to the substrate as the reactive gas, to form a silicon boron carbonitride layer as the second layer, and in forming the insulating film, a silicon boron carbonitride film is formed as the insulating film.

Further preferably, in forming the second layer, thermally activated nitrogen-containing gas is supplied to the substrate as the reactive gas, and thereafter thermally activated oxygen-containing gas is supplied to the substrate as the reactive gas, to form a silicon oxycarbonitride layer as the second layer, and in forming the insulating film, a silicon oxycarbonitride film is formed as the insulating film.

Further preferably, in forming the second layer, thermally activated carbon-containing gas is supplied to the substrate as the reactive gas, and thereafter thermally activated nitrogen-containing gas is supplied to the substrate as the reactive gas, and thereafter thermally activated oxygen-containing gas is supplied to the substrate as the reactive gas, to form a silicon oxycarbonitride layer as the second layer, and in forming the insulating film, a silicon oxycarbonitride film is formed as the insulating film.

Further preferably, in forming the second layer, thermally activated carbon-containing gas is supplied to the substrate as the reactive gas, and thereafter thermally activated boron-containing gas is supplied to the substrate as the reactive gas, and thereafter thermally activated nitrogen-containing gas is supplied to the substrate as the reactive gas, to form a silicon boron carbonitride layer as the second layer, and in forming the insulating film, a silicon boron carbonitride film is formed as the insulating film.

According to other aspect of the present invention, there is provided a method for manufacturing a semiconductor device including:

forming an insulating film having a prescribed composition and a prescribed film thickness on a substrate by alternately performing following steps prescribed number of times:

supplying a chlorosilane-based source and an aminosilane-based source to the substrate in a processing chamber, to form a first layer containing silicon, nitrogen, and carbon on the substrate; and supplying a different reactive gas from each of the sources, to the substrate in the processing chamber, to modify the first layer and form a second layer.

According to further other aspect of the present invention, there is provided a method for processing a substrate including:

forming an insulating film having a prescribed composition and a prescribed film thickness on a substrate by alternately performing following steps prescribed number of times:

supplying one of the sources of a chlorosilane-based source and an aminosilane-based source to the substrate in a processing chamber, and thereafter supplying the other source, to form a first layer containing silicon, nitrogen, and carbon on the substrate; and supplying a reactive gas different from each of the sources, to the substrate in the processing chamber, to modify the first layer and form a second layer.

According to further other aspect of the present invention, there is provided a substrate processing apparatus, including:

a processing chamber in which a substrate is housed;

a first source supply system configured to supply a chlorosilane-based source to a substrate in the processing chamber;

a second source supply system configured to supply an aminosilane-based source to the substrate in the processing chamber;

a reactive gas supply system configured to supply reactive gas different from each of the sources, to the substrate in the processing chamber; and a controller configured to control the first source supply system, the second source supply system, and the reactive gas supply system, so that an insulating film having a prescribed composition and a prescribed film thickness is formed on the substrate by alternately performing the following processes prescribed number of times:

the process of supplying one of the sources of the chlorosilane-based source and the aminosilane-based source to the substrate in the processing chamber. and thereafter supplying the other source, to form a first layer containing silicon, nitrogen, and carbon on the substrate, and a process of supplying the reactive gas to the substrate in the processing chamber, to modify the first layer and form a second layer.

DESCRIPTION OF SIGNS AND NUMERALS

121 Controller
200 Wafer
201 Processing chamber
202 Processing furnace
203 Reaction tube
207 Heater
231 Exhaust tube
232a First gas supply tube
232b Second gas supply tube
232c Third gas supply tube
232d Fourth gas supply tube
232i Fifth gas supply tube
232j Sixth gas supply tube

The invention claimed is:

1. A method of manufacturing a semiconductor device, comprising forming a film on a substrate by performing a cycle one or more times, the cycle comprising:
   (a) forming a first layer containing silicon, nitrogen, and carbon by performing:
     (a-1) supplying a first silane-based source having a halogen-based ligand to the substrate; and
     (a-2) supplying a second silane-based source having amino groups to the substrate, and
   (b) forming a second layer by modifying the first layer by performing supplying a reactive gas different from each of the sources, to the substrate.

2. The method according to claim 1, wherein in the (a), one of the (a-1) or the (a-2) is performed, and thereafter the other one different from the one of the (a-1) or the (a-2) is performed, or the (a-1) and the (a-2) are simultaneously performed.

3. The method according to claim 1, wherein in the (a), the (a-1) and the (a-2) are performed in this order.

4. The method according to claim 1, wherein in the (a), the (a-2) and the (a-1) are performed in this order.

5. The method according to claim 1, wherein in the (a), the (a-1) and the (a-2) are non-simultaneously performed.

6. The method according to claim 1, wherein in the (a), the (a-2) and the (a-1) are simultaneously performed.

7. The method according to claim 1, wherein in the (b), at least one selected from the group consisting of a nitrogen-containing gas, a carbon-containing gas, an oxygen-containing gas and a boron-containing gas, is supplied as the reactive gas.

8. The method according to claim 1, wherein in the (b), at least one selected from the group consisting of a carbon-containing gas, an oxygen-containing gas and a boron-containing gas, is supplied as the reactive gas.

9. The method according to claim 1, wherein in the (b), at least one selected from the group consisting of a carbon-containing gas, an oxygen-containing gas and a boron-containing gas, and a nitrogen-containing gas, are supplied as the reactive gas.

10. The method according to claim 1, wherein in the (b), at least one selected from the group consisting of an oxygen-containing gas and a boron-containing gas, is supplied as the reactive gas.

11. The method according to claim 1, wherein in the (b), the first layer is modified under a condition in which a modifying reaction of the first layer is unsaturated.

12. The method according to claim 1, wherein the first silane-based source having the halogen-based ligand, includes at least one selected from the group consisting of a silane-based source having chloro groups and a silane-based source having fluoro groups.

13. A method of processing a substrate, comprising forming a film on a substrate by performing a cycle one or more times, the cycle comprising:
   (a) forming a first layer containing silicon, nitrogen, and carbon by performing supplying a first silane-based source having a halogen-based ligand to a substrate, and supplying a second silane-based source having amino groups to the substrate; and
   (b) forming a second layer by modifying the first layer by performing supplying a reactive gas different from each of the sources, to the substrate.

14. A substrate processing apparatus, comprising:
a processing chamber configured to house a substrate;
a first source supply system configured to supply a first silane-based source having a halogen-based ligand to the substrate in the processing chamber;
a second source supply system configured to supply a second silane-based source having amino groups to the substrate in the processing chamber;
a reactive gas supply system configured to supply a reactive gas different from each of the sources, to the substrate in the processing chamber; and
a controller configured to control the first source supply system, the second source supply system, and the reactive gas supply system, so that a process of forming a film on the substrate is performed by performing a cycle one or more times, the cycle comprising:
(a) a process of forming a first layer containing silicon, nitrogen, and carbon by performing a process of supplying the first silane-based source to the substrate and a process of supplying the second silane-based source to the substrate, and
(b) a process of forming a second layer by modifying the first layer by performing a process of supplying a reactive gas different from each of the sources, to the substrate.

* * * * *